US007169535B2

(12) United States Patent
Matsumura et al.

(10) Patent No.: US 7,169,535 B2
(45) **Date of Patent: *Jan. 30, 2007**

(54) PHOTOSENSITIVE COMPOSITION AND PHOTOSENSITIVE LITHOGRAPHIC PRINTING PLATE

(75) Inventors: Toshiyuki Matsumura, Fujino-machi (JP); Kazuhiko Hirabayashi, Kanagawa (JP)

(73) Assignee: Konica Minolta Holdings, Inc., Tokyo (JP)

( * ) Notice: Subject to any disclaimer, the term of this patent is extended or adjusted under 35 U.S.C. 154(b) by 105 days.

This patent is subject to a terminal disclaimer.

(21) Appl. No.: 10/687,689

(22) Filed: Oct. 17, 2003

(65) Prior Publication Data

US 2004/0091816 A1 May 13, 2004

(30) Foreign Application Priority Data

Oct. 23, 2002 (JP) ............................ 2002-308289
Nov. 21, 2002 (JP) ............................ 2002-337845

(51) Int. Cl.
*G03F 7/032* (2006.01)

(52) U.S. Cl. .................................... 430/281.1; 430/302

(58) Field of Classification Search ............ 430/281.1, 430/302

See application file for complete search history.

(56) References Cited

U.S. PATENT DOCUMENTS 4,119,776 A * 10/1978 Farber ........................ 548/463
4,278,753 A 7/1981 Lewis et al.
5,096,799 A 3/1992 Fujikura et al.
5,885,746 A * 3/1999 Iwai et al. ............... 430/280.1
6,114,091 A 9/2000 Geissler et al.
2004/0157153 A1* 8/2004 Takamuki ................ 430/270.1
2004/0157154 A1* 8/2004 Kuroki et al. ........... 430/270.1
2004/0191691 A1* 9/2004 Ohta et al. ............... 430/281.1
2004/0219459 A1* 11/2004 Hirabayash ................. 430/300
2005/0048403 A1* 3/2005 Kuroki ....................... 430/300
2005/0053866 A1* 3/2005 Matsumura ................. 430/300
2005/0233248 A1* 10/2005 Matsumura .............. 430/281.1

FOREIGN PATENT DOCUMENTS

EP 0 029 358 5/1981
EP 03 02 3299 2/2004
JP 10153860 * 6/1998

OTHER PUBLICATIONS

Derwent No. 1998-382463, abstract of JP 10153860, Jun. 1998.*
partial English translation of JP 10153860, Jun. 1998.*
CAplus registry file structure of Malachite Green Lactone, RN 5339-80-0.*

* cited by examiner

*Primary Examiner*—Barbara L. Gilliam
(74) *Attorney, Agent, or Firm*—Lucas & Mercanti, LLP

(57) ABSTRACT

A photosensitive composition exhibiting enhanced sensitivity is disclosed, comprising an ethylenically unsaturated monomer, a photopolymerization initiator composition and a polymer binder, wherein the photopolymerization initiator composition contains a polyhalogen compound. There is also disclosed a photosensitive lithographic printing plate comprising the foregoing photosensitive composition on a support having a hydrophilic surface.

21 Claims, No Drawings

PHOTOSENSITIVE COMPOSITION AND PHOTOSENSITIVE LITHOGRAPHIC PRINTING PLATE

FIELD OF THE INVENTION

The present invention relates to a photosensitive composition and a photosensitive lithographic printing plate by use thereof, and in particular to a photosensitive composition and a photosensitive lithographic printing plate by use thereof, which exhibits enhanced sensitivity and superior print life.

BACKGROUND OF THE INVENTION

In general, lithographic printing materials are imagewise exposed to harden exposed areas and after allowing unexposed areas to be eluted, the materials are further subjected to washing and finisher gum treatments to obtain a lithographic printing plate. Recently, there have been studied methods of preparing a lithographic printing plate, in which laser digital exposure is conducted to achieve high resolving power and enhanced sharpness, followed by being developed to obtain a lithographic printing plate. For instance, there is known a system, in which, using exposure light sources modulated by image signals transmitted through communication networks or signals outputted from electronic plate making systems or image processing systems, photographic materials are directly subjected to scanning exposure to prepare a lithographic printing plate.

However, conventional lithographic printing materials involved problems that it was difficult to achieve spectral sensitization or speed enhancement in combination with the oscillating wavelength of laser light used for digital exposure.

Recently, lithographic materials used for planographic printing plates, having a photo-polymerizable light-sensitive layer containing a photopolymerization initiator, which can achieve enhanced speed suitable for laser light have been noted for use in digital exposure using laser light. Enhancement of speed to shorten the recording time is desired for CTP (Computer To Plate) printing material in which digital data are recorded using a laser light source. Further, printing plates with improved press life have been desired in various printing fields including newspaper printing and commercial printing such as an advertising medium.

There have been studied means for employing photopolymerization to achieve enhancement of speed. For instance, there was proposed the use of trichloromethyl group containing s-triazine compounds as a photopolymerization initiator described in JP-A Nos. 48-36281, 54-74887, 64-35548 (hereinafter, the term, JP-A refers to Japanese Patent Application Publication); the use of iron arene complex compounds described in JP-A No. 59-219307 and peroxides as a photopolymerization initiator, as described in JP-A No. 59-219307; the use of monoalkyltriarylborate compounds as a photopolymerization initiator, as described in JP-A Nos. 62-150242, 62-143044, 64-355448; the use of titanocene compounds as a photopolymerization initiator, as described in JP-A Nos. 63-41483, 2-291.

There was further proposed a technique of introducing a tertiary amino group into a monomer (ethylenically unsaturated monomer capable of addition polymerization, in combination with the use of trihalogenomethyl-s-triazine compounds, as described in JP-A No. 1-105238; and a technique of introducing a tertiary amino group into a monomer (ethylenically unsaturated monomer capable of addition polymerization, in combination with the use of trihalogenomethyl-s-triazine compounds and metallocene compounds such as titanocene, as described in JP-A No. 2-127404. In these techniques, however, sufficient plate life was not achieved though improvement in speed was attained.

SUMMARY OF THE INVENTION

It is an object of the present invention to provide a photosensitive composition and a photosensitive lithographic printing plate, which exhibit enhanced sensitivity and superior print life.

One aspect of the present invention concerns a photosensitive composition comprising an ethylenically unsaturated monomer, a photopolymerization initiator composition and a polymer binder, wherein the photopolymerization initiator composition contains a compound represented by the following formula (1):

formula (1)

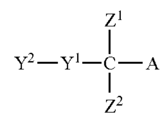

wherein $Z^1$ and $Z^2$ are each a halogen atom; A is a hydrogen atom, an alkyl group, an aryl group or an electron-withdrawing group; $Y^1$ is —CO— or —$SO_2$—; $Y^2$ is a monovalent substituent.

Another aspect of the invention concerns a photosensitive lithographic printing plate by use of the photosensitive composition described above.

DETAILED DESCRIPTION OF THE INVENTION

The photosensitive composition according to this invention is mainly comprised of ethylenically unsaturated monomer (or addition-polymerizable, ethylenic double-bond containing monomer), photopolymerization initiator composition and a binder.

First, ethylenically unsaturated monomers relating to this invention will be described. The ethylenically unsaturated monomers usable in this invention include generally known radical-polymerizable monomers, poly-functional monomers containing plural addition-polymerizable ethylenically unsaturated bonds (or double bonds), as used in UV-hardenable resin, and poly-functional oligomers. Such monomer compounds are not specifically limited and preferred examples thereof include mono-functional acrylic acid esters such as 2-ethylhexyl acrylate, 2-hydroxypropyl acrylate, glycerol acrylate, tetrahydrofurfuryl acrylate, phenoxyethyl acrylate, nonylphenoxyethyl acrylate, tetrahydrofurfuryloxyethtl acrylate, tetrahydrofurfuryloxyhexanolide acrylate, an acrylate of ε-caprolactone adduct with 1,3-dioxane alcohol, and 1,3-dioxolan acrylate, and methacrylic acid, itaconic acid, crotonic acid and maleic acid esters, in which the foregoing acrylates are replaced by methacrylate, itaconate, crotonate or maleate; bi-functional acrylic aid esters such as ethylene glycol diacrylate, triethylene glycol diacrylate, hydroquinone diacrylate, resorcin diacrylate, hexanediol diacrylate, neopentyl glycol diacrylate, tripropylene glycol diacrylate, hydroxypivaric acid neopentyl glycol diacrylate, neopentyl glycol adipate diacrylate, hydroxypivaric acid neopentyl glycol ϵ-caprolactone adduct diacrylate, 2-(2-hydroxy-1,1-dimethylethyl)-5-hydroxymethyl-5-ethyl-1,3-dioxane diacrylate, tricyclodecanedimethylol diacrylate, tricycloecanedimethylol diacrylate ϵ-caplactone adduct1, and 6-hexanediol diglycidyl ether diacrylate, and methacrylic acid, itaconic acid, crotonic acid and maleic acid esters, in which the foregoing acrylates are replaced by methacrylate, itaconate, crotonate or maleate; polyfunctional acrylic acid esters such as trimethylolpropane triacrylate, ditrimethylolpropane tetraacrylate, trimethylolethane triacrylate, pentaerythritol triacrylate, pentaerythritol teraacrylate, dipentaerythritol tetraacrylate, dipentaerythritol pentaacrylate, dipentaerythritol hexaacrylate, dipentaerythritol hexaacrylate ϵ-caprolactone adduct, pyrogallol triacrylate, propionic acid.dipentaerythritol triarylate, propionic acid.dipentaerythritol tetraacrylate, and hydroxypivalylaldehyse modified dimethylolpropane triacetate, and methacrylic acid, itaconic acid, crotonic acid and maleic acid esters, in which the foregoing acrylates are replaced by methacrylate, itaconate, crotonate or maleate.

Pre-polymers are also usable similarly to the foregoing. The pre-polymers include, for example, compounds described later. Pre-polymers are also usable, in which acrylic acid or methacrylic acid is introduced into an oligomer having a proper molecular weight, thereby rendering it photopolymerizable. These pre-polymers can be used alone or in combination. The foregoing monomers and/or oligomers may be used in combination.

Example of the pre-polymers include polyester acrylates in which acrylic acid is introduced into polyesters obtained by the combination of polybasic acids such as adipic acid, trimellitic acid, maleic acid, phthalic acid, terephthalic acid, hymic acid, malonic acid, succininc acid, glutaric acid, itaconic acid, pyromellitic acid, fumaric acid, pimelic acid, sebacic acid, docecanoic acid, and tetrahydrophthalic acid, and polyhydric alcohols such as ethylene glycol, propylene glycol, diethylene glycol, propylene oxide, 1,4-butanediol, triethylene glycol, tetraethylene glycol, polyethylene glycol, glycerin, trimethylolpropane, pentaerythritol, sorbitol, 1,6-hexanediol and 1,2,6-hexanetriol; epoxyacrylates, in which (meta)acrylic acid is introduced into epoxy resin, such as bisphenol A.epichlorohydrin.(meta)acrylic acid and phenol novolac.epichlorohydrin.(meta)acrylic acid; urethane acrylates, in which (meta)acrylic acid is introduced into urethane resin, such as ethylene glycol.adipic acid.tolylenediisocyanate.2-hydroxyethylacrylate, polyethylene glycol.tolylenediisocyanate.2-hydroxyethylacrylate, hydroxyethylphthalyl methacrylate.xylenediisocyanate, 1,2-polybutadiene glycol-.tolylenediisocyanate.2-hydroxyethylacrylate and trimethylolpropane.propylene glycol.tolylenediisocyanate.2-hydroxyethylacrylate; silicone resin acrylates, such as polysiloxane acrylate, polysiloxane.diisocyanate.2-ydroxyethyl acrylate; alkyd modified acrylates, in which (metha) acrylic acid is introduced into oil-modified alkyd resin; and spirane resin acrylates.

In this invention, there are preferably used addition-polymerizable ethylenically unsaturated monomers containing a tertiary amino group within the molecule. The structure of such compounds is not specifically limited and those in which a hydroxy-containing tertiary amine compound is modified with glycidyl methacrylate, methacrylic acid chloride or acrylic acid chloride are preferably used. Specific examples thereof include polymerizable compounds described in JO-A Nos. 1-165613, 1-203413 and 1-197213.

In this invention, there is preferably used a reaction product of a polyhydric alcohol containing a tertiary amino group within the molecule, a diisocyanate compound and an ethylenically unsaturated compound containing a hydroxy group.

Examples of the polyhydric alcohol containing a tertiary amino group within the molecule (hereinafter, also denoted as tertiary amino-containing polyhydric alcohol) include triethanolamine, N-methyldiethanolamine, N-ethyldiethanolamine, N-n-butyldiethanolamine, N-tert-butyldiethanolamine, N,N-di(hydroxyethyl)aniline, N,N,N',N'-tetra-2-hydroxypropylethylenediamine, p-tolyldiethanolamine, N,N,N',N'-tetra-2-hydroxyethylethlenediamine, N,N-bis(2-hydroxypropyl)aniline, allydiethanolamine, 3-(dimethylamino)-1,2-propanediol, 3-diethylamino-1,1-propane diol, N,N-di(iso-propyl)amino-2,3-propane diol, and 3-(N-methyl-N-benzylamino)-1,2-propanediol, but are not limited to the foregoing.

Examples of the diisocyanate compound include butane-1,4-diisocyanate, hexane-1,6-diisocyanate, 2-methylpentane-1,5-diisocyanate, octane-1,8-diisocyanate, 1,3-diisocyanatomethylcyclohexane, 2,2,4-trimethylhexane-1,6-diisocyanate, isophoronedisisocyanate, 1,2-phenylenediaminediisocyanate, 1,3-phenylenediaminediisocyanate, 1,4-phenylenediaminediisocyanate, tolylene2,4-diisocyanate, tolylene-2,5-diisocyanate, tolylene-2,6-diisocyanate, 1,3-di (isocyanatomethyl)benzene, and 1,3-bis(1-isocyanato-1-methylethyl)benzene, but are not limited to the foregoing.

Examples of the ethylenically unsaturated compound containing a hydroxy group include compounds MH-1 through MH-13, as shown below, but are not limited to these.

MH-1

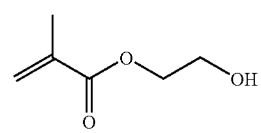

MH-2

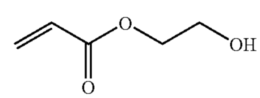

MH-3

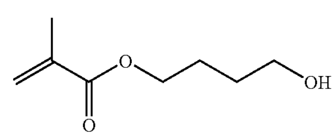

MH-4

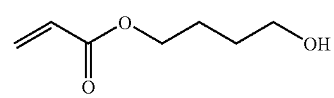

MH-5

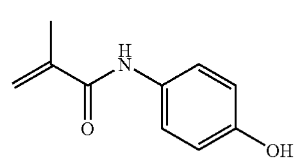

MH-6

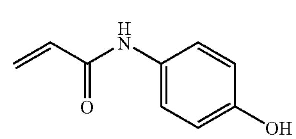

-continued

MH-7

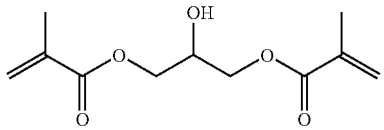

MH-8

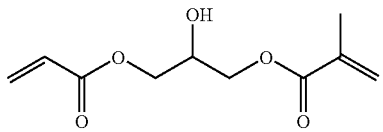

MH-9

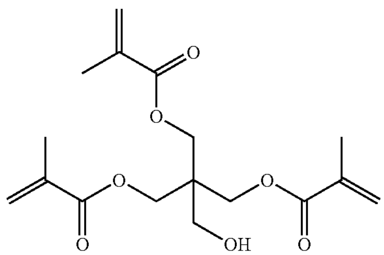

MH-10

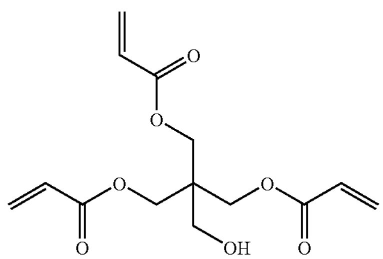

MH-11

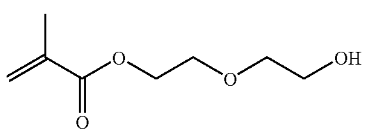

MH-12

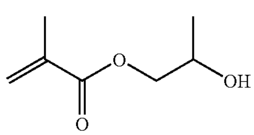

MH-13

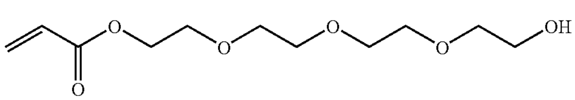

Of the foregoing compounds, 2-hydroxyethyl methacrylate, 2-hydroxyethyl acrylate, 4-hydroxybutyl acrylate, 2-hydroxypropylene-1,3-dimethacrylate, and 2-hydroxypropylene-1-methacrylate-3-acrylate are preferred.

The reaction to obtain the reaction product of a tertiary amino group-containing polyhydric alcohol, a diisocyanate compound and a hydroxy-containing ethylenically unsaturated compound can be conducted in a manner similar to the method for synthesizing a urethane acrylate through the reaction of ordinary diol compounds, diisocyanate compounds and hydroxy-containing ethylenically unsaturated compounds.

Specific examples of the reaction product of a tertiary amino group-containing polyhydric alcohol, a diisocyanate compound and a hydroxy-containing ethylenically unsaturated compound are shown below, but this invention is not limited to these:

M-1: reaction product of reaction product of triethanolamine (1 mol), hexane-1,6-diisocyanate (3 mol) and 2-hydroxyethyl methacrylate (3 mol);

M-2: reaction product of reaction product of triethanolamine (1 mol), isophoronediisocyanate (3 mol) and 2-hydroxyethyl methacrylate (3 mol);

M-3: reaction product of N-n-butyldiethanolamine (1 mol), 1,3-bis(1-isocyanato-1-methylethyl)benzene (2 mol) and 2-hydroxypropylene-1-methacrylate-3-acrylate (2 mol);

M-4: reaction product of N-n-butyldiethanolamine (1 mol), 1,3-di(isocyanatomethy)benzene (2 mol) and 2-hydroxypropylene-1-methacrylate-3-acrylate (2 mol);

M-5: N-methyldiethanolamine (1 mol), tolylene-2,4-diisocyanate (2 mol9 and 2-hydroxypropylene-1,3-dimethacrylate (2 mol).

Further, there are also usable acrylates and alkylacrylates described in JP-A Nos. 1-105238 and 2-127404.

The photosensitive composition relating to this invention can also contain monomers such as phosphazene monomer, triethylene glycol, isocyanuric acid EO (ethylene oxide) modified diacrylate, isocyanuric acid EO (ethylene oxide) modified triacrylate, dimethyloltricyclodecane diacrylate, trimethylolpropane acrylic acid benzoic acid ester, alkylene glycol type acrylic acid modification and urethane modified acrylate, and addition-polymerizable oligomer or pre-polymer having a constitutional repeating unit formed of the foregoing monomers.

In this invention, ethylenic monomers usable in combination include a phosphoric acid ester compound containing at least a (metha)acryloyl group. Such a compound, in which at least a part of hydroxy groups of phosphoric acid is esterified, is not specifically limited as long as an acryloyl group is contained.

In addition to the compounds described above, there are usable compounds described in JP-A Nos. 58-212994, 61-664962-46688, 62-48589, 62-173295, 62-187092, 63-67189, 1-244891; compounds described in "Chemical Goods of 11290" page 286–294 (Kagaku-kogyo Nipposha); and compounds described in "UV/Ev Hardening Handbook (Raw Material)" page 11–65 (Kobunshi Kankokai). Of the foregoing compounds, compounds containing at least two acryl or methacryl groups within the group are preferred, and those having a molecular weight of not more than 10,000 (preferably not more than 5,000) are more preferable.

In one preferred embodiment of this invention, compounds represented by the following formula (4) or (5) are used as the ethylenically unsaturated monomer:

formula (4)

$$R^4_{(m-n)}Q^1[(CH_2\overset{R^1}{\underset{R^2}{C}}O)_a—CONH(X^1—NHCOO)_b—X^2(OOC\overset{R^3}{C}{=}CH_2)_c]_n$$

wherein $Q^1$ is

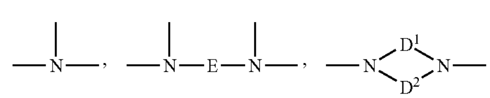

or —S—; $R^4$ is an alkyl group, a hydroxyalkyl group or an aryl group; $R^1$ and $R^2$ are each a hydrogen atom, an alkyl group or an alkoxy group; $R^3$ is a hydrogen atom, methyl or ethyl; $X^1$ is a divalent linkage group having 2 to 12 carbon atoms; $X^2$ is a divalent, trivalent or tetravalent group, or

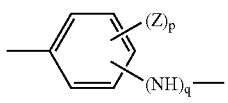

in which Z is a hydrogen atom, an alkyl group, an alkenyl group, aryl group, a halogen atom, an alkoxy group or a heterocyclic group; p is an integer of 1 to 4; q is an integer of 1 to 3; $D^1$ and $D^2$ are each a divalent linkage group having 1 to 5 carbon atoms; E is a divalent linkage group having 2 to 12 carbon atoms, an aliphatic group containing a 5- to 7-membered heterocyclic group containing one or two atoms selected from the group consisting of a nitrogen atom, oxygen atom and sulfur atom, an arylene group having 6 to 12 carbon atoms or a 5- or 6-membered aromatic heterocyclic group; a is an integer of 0 to 4; b is 0 or 1; c is an integer of 1 to 3; m is an integer of 2 to 4, depending on the valence number of $Q^1$; n is an integer of 1 to m, provided that groups having the same definition may be the same of different;

formula (5)

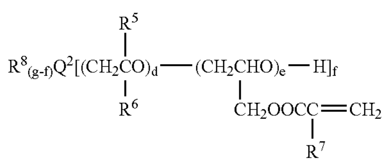

wherein $Q^2$ is

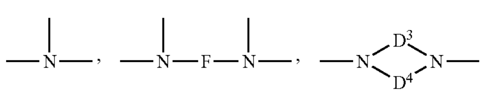

$R^8$ is an alkyl group, a hydroxyalkyl group or an aryl group; $R^5$ and $R^6$ are each a hydrogen atom, an alkyl group or an alkoxyalkyl group; $R^7$ is a hydrogen atom, methyl or ethyl group; $D^3$ and $D^4$ are each a saturated hydrocarbon group having 1 to 5 carbon atoms; F is a saturated hydrocarbon group having 2 to 12 carbon atoms, a 5 to 7-membered alicyclic group containing one or two of nitrogen atom, oxygen atom and sulfur atom, as a ring-forming member, an arylene group having 6 to 12 carbon atoms, or a 5- or 6-membered aromatic heterocyclic group; d and e are each an integer of 1 to 4; g is an integer of 2 to 4, depending on the valence number of $Q^2$; f is an integer of 1 to g, provided that groups having the same definition may be the same or different.

In the formula (4), examples of the alkyl group represented by $R^4$ include methyl, ethyl, propyl, butyl, pentyl, iso-pentyl, 2-ethylhexyl, octyl, decyl, n-undecyl, n-dodecyl, n-tetradecyl, n-pentadecyl, n-hexadecyl, n-heptadecyl, n-octadecyl, and n-docosadecyl. Examples of the hydroxyalkyl group represented by $R^4$ include hydroxymethyl, hydroxyethyl, hydroxypropyl, and hydroxypentyl. Examples of the aryl group represented by $R^4$ phenyl and naphthyl. The alkyl group represented by $R^1$ and $R^2$ is the same as defined in the foregoing $R^4$. Examples of the alkoxyalkyl group represented by $R^1$ and $R^2$ include methoxymethyl, ethoxymethyl and propoxyethyl.

The divalent linkage group having 2 to 12 carbon atoms, represented by $X_1$ include, for example, a saturated hydrocarbon group and arylene group. Examples of the saturated hydrocarbon group having 2 to 12 carbon atoms include ethylene, trimethylene, tetramethylene, propylene, ethylethlene, pentamethylene, hexamethylene, heptamethylene, octamethylene, nonamethylene, decamethylene, undecamethylene, dodecamethylene, cyclohexylene (e.g., 1,6-cyclohexanediyl) and cyclopentylene (e.g., 1,5-cyclopentadiyl). Examples of the arylene represented by $X^1$ include phenylene and naphthylene.

Examples of the divalent group represented by $X^2$ include divalent groups having 2 to 12 carbon atoms, represented by $X^1$ described above, such as a saturated hydrocarbon group and an arylene group and further include a group in which five or less methylene groups are replaced by oxygen atoms.

The trivalent group represented by $X^2$ is one in which the foregoing divalent group represented by $X^2$ (saturated hydrocarbon group or arylene group) is further attached with one more linking group. Examples thereof include ethanetriyl, propanetriyl, butanetriyl, pentanetriyl, hexanetriyl, heptanetriyl, octanetriyl, nonanetriyl, decanetriyl, undecantriyl, dodecanetriyl, cyclohexanrtriyl, cyclopentanetriyl, benzenetriyl and naphthalenetriyl.

The tetravalent group represented by $X^2$ is one in which the foregoing trivalent group represented by $X^2$ is further attached with one more linking group. Examples thereof include propanediylidene, butanediylidene, pentanediylidene, hexanediylidene, heptanediylidene, octanediylidene, nonanediylidene, decanediylidene, undecanediylidene, dodecanediylidene, cyclohexanediylidenee, cyclopentanediylidene, benzenetetra-yl, and naphthalene-tetra-yl.

In $X^2$ of the formula (4), Z represents a hydrogen atom, alkyl group, alkenyl group, aryl group, halogen atom, alkoxyl group and heterocyclic group. Examples of the alkyl group represented by Z include methyl, ethyl, propyl, butyl, pentyl, iso-pentyl, 2-ethylhexyl, octyl and decyl. Examples of the alkenyl group include 2-propenyl, 3-butenyl, 1-methyl-3-propenyl, 3-pentenyl, 1-methyl 3-butenyl and 4-hexenyl. Examples of the aryl group represented by Z include phenyl, m-chlorophenyl, p-tolyl, and naphthyl. Examples of the halogen atom represented by Z include fluorine, chlorine, bromine and iodine. The alkoxyl group represented by Z include methoxy, propoxy, propoxy and butoxy.

In the formula (4), examples of a divalent group having 1 to 5 carbon atoms, represented by $D^1$ and $D^2$ include methylene, trimethylene, tetramethylene, propylene, ethylethylene, pentamethylene, and cyclopentylene.

In the formula (4), a divalent group having 2 to 12 carbon atoms, represented by E is the same as the divalent group having 2 to 12 carbon atoms, defined in $X^1$.

In an aliphatic group containing a 5- to 7-membered heterocyclic group containing one or two atoms selected from the group consisting of a nitrogen atom, oxygen atom and sulfur atom, represented by E, examples of the heterocycle include pyridine ring, furan ring, pyrrole ring, pyrazole ring, imidazole ring, oxazole ring, thiazole ring, pyrroline ring, imidazoline ring, imidazolidine ring, pyrazolidine ring, pyrazoline ring, piperidine ring, piperazine ring, morpholine, and quinuclidine. The aliphatic group is a group having 2 to 12 carbon atoms and the foregoing heterocyclic ring, and the divalent group is the same as a divalent group having 2 to 12 carbon atoms, defined in $X^1$.

Examples of the arylene group having 6 to 12 carbon atoms, represented by E include phenylene and naphthylene.

Examples of an aromatic heterocycle constituting the 5- or 6-membered aromatic heterocyclic group, represented by E include a furan ring, pyrrole ring, pyrazole ring, imidazole ring, oxazole ring, thiazole ring, 1,2,3-oxadiazole ring, 1,2,3-triazole ring, 1,2,4-triazole ring, 1,3,4-thiadiazole ring, pyridine ring, pyridazine ring, pyrimidine ring, pyrazine ring, s-triazine ring, benzofuran ring, indole ring, benzothiophene ring, benzimidazole ring, benzthiazole, purine ring, quinoline, and isoquinoline.

The respective substituents represented in the formula (4) may further be substituted.

In the formula (4), $Q^1$ is preferably >N—, and $X^1$ preferably has an aromatic ring, more preferably having such a structure as shown in specific examples 4-12 through 4-15 (described below), derived from tolylenediisocyanates, and still more preferably having a structure such as expel 4-16 through 4-20, derived from tetramethylxylenediisocyanate.

The compounds represented by formula (4) can be synthesized in accordance with methods commonly known in the art, for example, described in Japanese Patent No. 2509288.

Specific examples of the compound represented by formula (4) are shown below but are by no means limited to these.

$$R^4_{(m-n)}Q^1[(CH_2\overset{R^1}{\underset{R^2}{C}}O)_a—CONH(X^1—NHCOO)_b—X^2(OOC\overset{R^3}{C}{=}CH_2)_c]_n$$

| Compound No. | $R^4$ | $Q^1$ | m | a | $R^1$ | $R^2$ | b | $X^1$ | $X^2$ | c | $R^3$ | n |
|---|---|---|---|---|---|---|---|---|---|---|---|---|
| 4-1 | — | >N— | 3 | 1 | H | H | 0 | — | $C_2H_4$ | 1 | $CH_3$ | 3 |
| 4-2 | — | >N— | 3 | 1 | $CH_3$ | H | 0 | — | $C_2H_4$ | 1 | $CH_3$ | 3 |
| 4-3 | $C_2H_4OH$ | >N— | 3 | 1 | H | H | 0 | — | $C_2H_4$ | 1 | $CH_3$ | 2 |
| 4-4 | — | >N— | 3 | 1 | H | H | 1 | *1 | $C_2H_4$ | 1 | $CH_3$ | 3 |
| 4-5 | — | >$NCH_2CH_2N$< | 4 | 1 | H | H | 0 | — | $C_2H_4$ | 1 | $CH_3$ | 4 |
| 4-6 | — | >$NCH_2CH_2N$< | 4 | 1 | $CH_3$ | H | 0 | — | $C_2H_4$ | 1 | $CH_3$ | 4 |
| 4-7 | — | >N— | 3 | 1 | H | H | 0 | — | $C_3H_6$ | 1 | $CH_3$ | 3 |
| 4-8 | — | >$NCH_2CH_2N$< | 4 | 1 | H | H | 0 | — | $C_3H_6$ | 1 | $CH_3$ | 4 |
| 4-9 | — | >N— | 3 | 1 | H | H | 0 | — | $C_2H_4$ | 1 | H | 3 |
| 4-10 | — | >$NCH_2CH_2N$< | 4 | 1 | H | H | 0 | — | $C_2H_4$ | 1 | H | 4 |
| 4-11 | — | —S— | 2 | 1 | H | H | 0 | — | $C_2H_4$ | 1 | $CH_3$ | 2 |

-continued
$$R^4_{(m-n)}Q^1[(CH_2\overset{R^1}{\underset{R^2}{C}}O)_a-CONH(X^1-NHCOO)_b-X^2(OOC\overset{R^3}{C}=CH_2)_c]_n$$
| Compound No. | $R^4$ | $Q^1$ | m | a | $R^1$ | $R^2$ | b | $X^1$ | $X^2$ | c | $R^3$ | n |
|---|---|---|---|---|---|---|---|---|---|---|---|---|
4-12
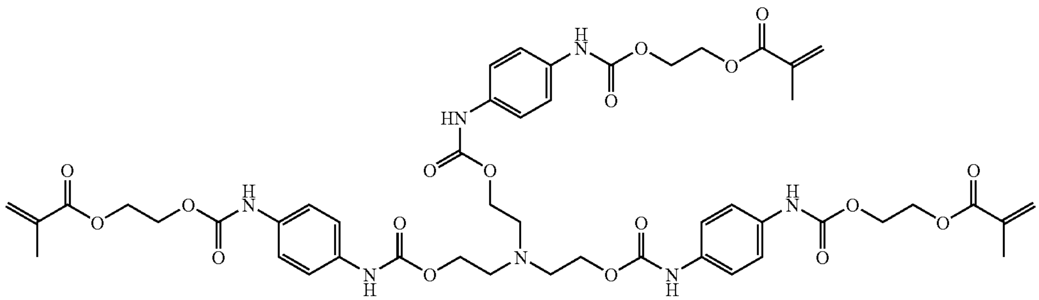
4-13
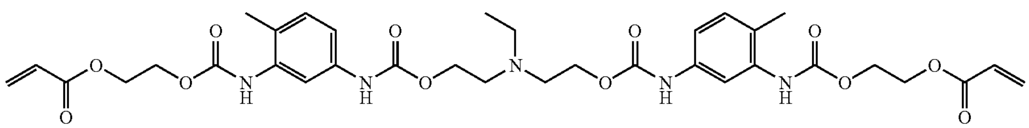
4-14
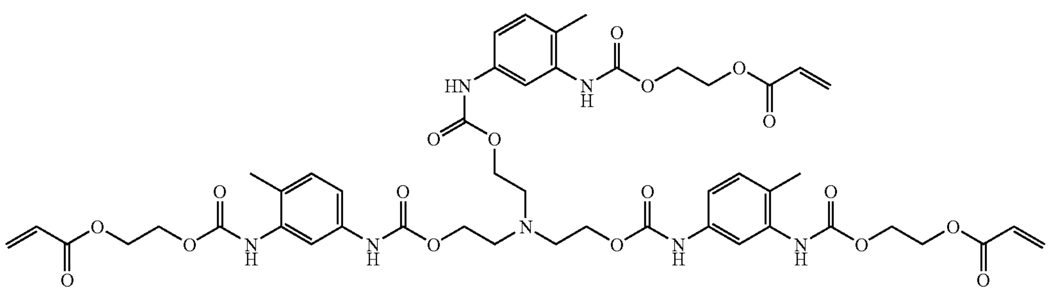
4-15
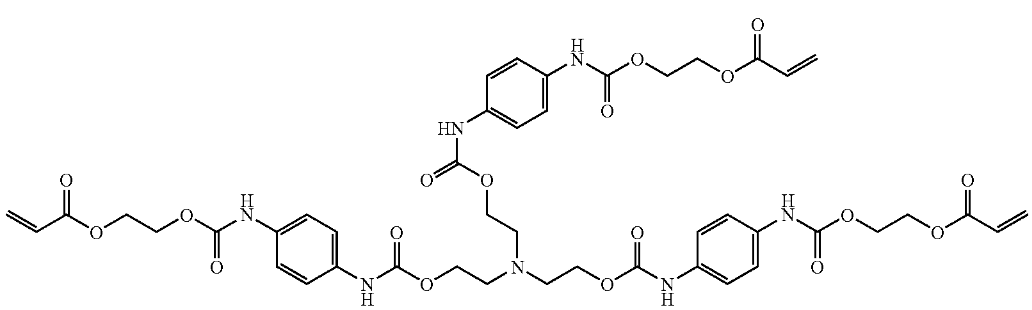
4-16
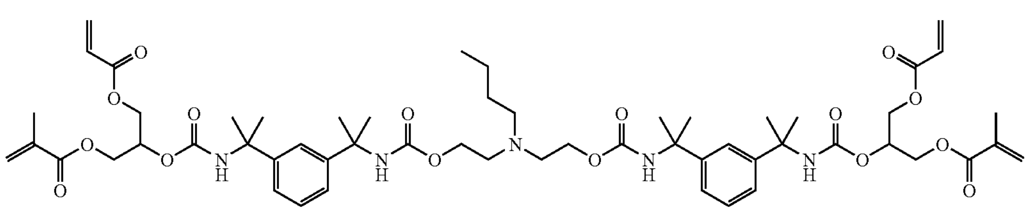
4-17
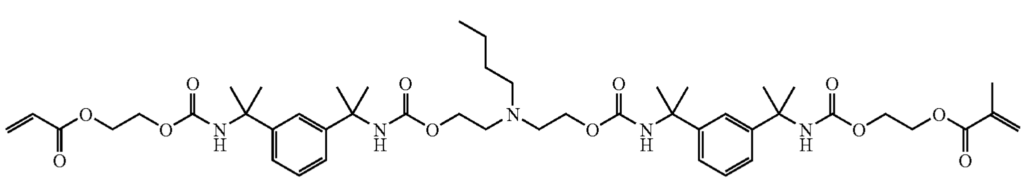

-continued

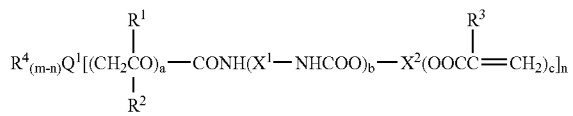

| Compound No. | $R^4$ | $Q^1$ | m | a | $R^1$ | $R^2$ | b | $X^1$ | $X^2$ | c | $R^3$ | n |
|---|---|---|---|---|---|---|---|---|---|---|---|---|
| 4-18 | 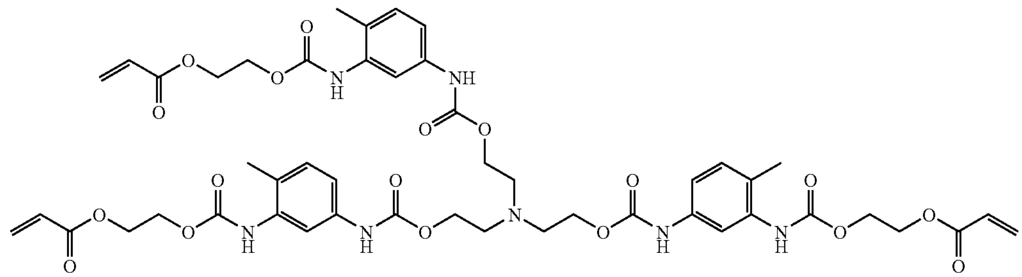 | | | | | | | | | | | |
| 4-19 | 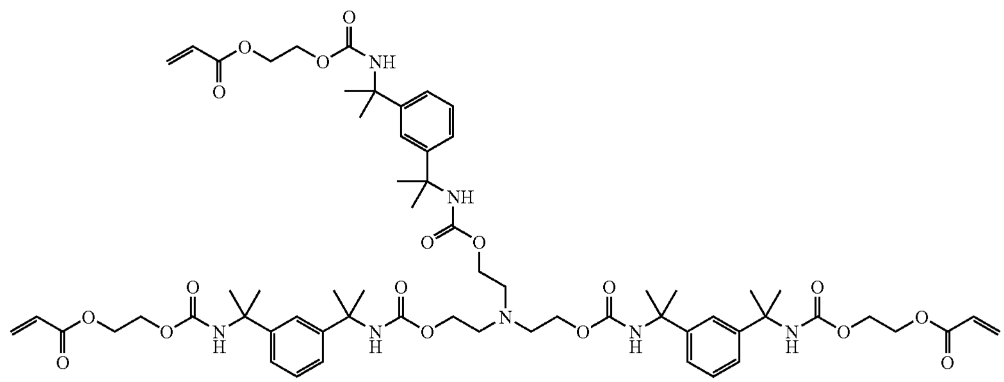 | | | | | | | | | | | |
| 4-20 | 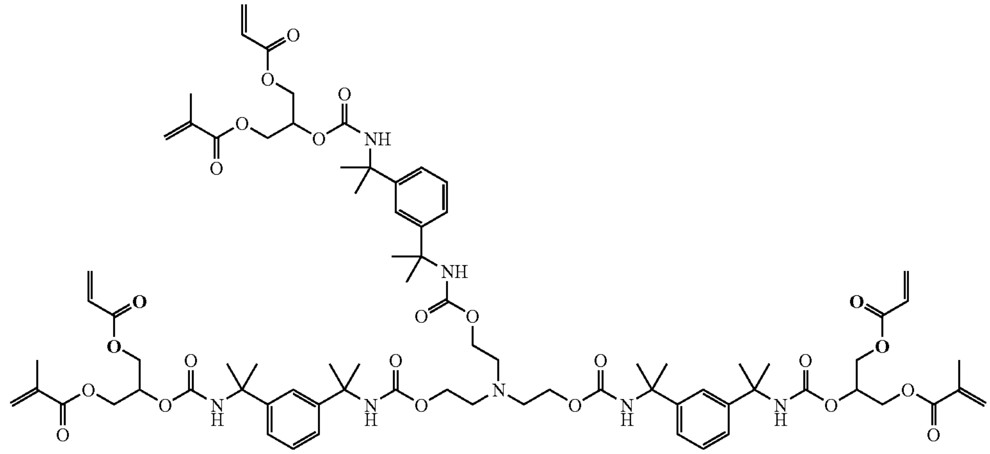 | | | | | | | | | | | |

*1: 2,2,4-trimethylhexamethylene

In the formula (5), $R^8$ may be the same or different when the value of (g-f) is 2 or more. Compounds having the same f as g are preferred. When $R^8$ is an alkyl group or a hydroxyalkyl group, the number of carbon atoms is preferably 2 to 8, and more preferably 2 to 4. The aryl group represented by $R^8$ is preferably monocyclic or bi-cyclic one, and more preferably monocyclic one, which may be substituted by an alkyl group having carbon atoms up to 5, alkylalkoxy group or a halogen atom. An alkyl group or alkoxyalkyl group represented by $R^5$ and $R^6$ has preferably 1 to 5 carbon atoms. $R^7$ is preferably methyl.

$D^3$ and $D^4$, which may be the same or different, is preferably a 6-membered saturated heterocycle containing two nitrogen atoms. A saturated hydrocarbon group represented by F has preferably 2 to 6 carbon atoms, an arylene group represented by F is preferably phenylene, alicyclic group represented by F is preferably cyclohexylene, and an aromatic heterocyclic group is preferably a 5- or 6-membered one containing nitrogen or sulfur atoms.

Of the compounds represented by the foregoing formula (5), when $Q^2$ is >N— and n and m are the same value, such compounds can be obtained by causing glycidyl acrylate or alkyl acrylate to react with a hydroxyalkylamine. Other compounds can be similarly obtained.

Specific examples of the compound represented by formula (5) are shown below.

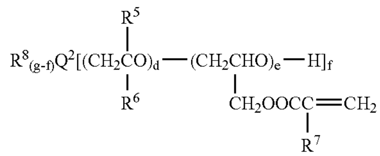

| Compound No. | $R^8$ | $Q^2$ | g | d | $R^5$ | $R^6$ | e | $R^7$ | f |
|---|---|---|---|---|---|---|---|---|---|
| 5-1 | — | $-N<$ | 3 | 1 | H | H | 1 | $CH_3$ | 3 |
| 5-2 | — | $-N<$ | 3 | 1 | $CH_3$ | H | 1 | $CH_3$ | 3 |
| 5-3 | $>NCH_2CH_2N<$ | $-N<$ | 3 | 1 | H | H | 1 | $CH_3$ | 2 |
| 5-4 | — | $-N<$ | 3 | 1 | $CH_3$ | H | 1 | H | 3 |
| 5-5 | — | $>NCH_2CH_2N<$ | 4 | 1 | H | H | 1 | $CH_3$ | 4 |
| 5-6 | — | $>NCH_2CH_2N<$ | 4 | 1 | $CH_3$ | H | 1 | $CH_3$ | 4 |
| 5-7 | $>NCH_2CH_2N<$ | $-N<$ | 3 | 1 | H | H | 1 | H | 2 |
| 5-8 | — | $>NCH_2CH_2N<$ | 4 | 1 | $CH_3$ | H | 1 | H | 4 |
| 5-9 | — | $-N<$ | 3 | 1 | H | H | 1 | H | 3 |
| 5-10 | — | $>NCH_2CH_2N<$ | 4 | 1 | H | H | 1 | H | 4 |
| 5-11 | — | —S— | 2 | 1 | H | H | 1 | $CH_3$ | 2 |
| 5-12 | — | *2 | 4 | 1 | H | H | 1 | $CH_3$ | 4 |

*2

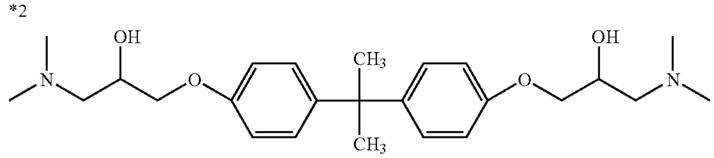

The photosensitive composition contains the foregoing ethylenically unsaturated monomer, preferably in an amount of 1 to 80% by weight, and more preferably 3 to 70% by weight.

One feature of the photosensitive composition is that the photopolymerization initiator composition contains a compound represented by the following formula (1):

formula (1)

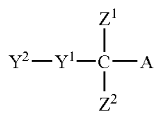

wherein $Z^1$ and $Z^2$ are each a halogen atom; A is a hydrogen atom, an alkyl group, an aryl group or an electron-withdrawing group; $Y^1$ is —CO— or —$SO_2$—; $Y^2$ is a monovalent substituent.

In the formula (1), halogen atoms represented by $Z^1$ and $Z^2$ include a fluorine, chlorine, bromine and iodine atoms, and both $Z^1$ and $Z^2$ are preferably bromine atoms; and A represents a hydrogen atom, an alkyl group (including a cycloalkyl group), an aryl group or an electron-withdrawing group. The electron-withdrawing group refers to a group having a positive value of Hammett substituent constant (σp), preferably a group having a σp value of not less than 0.01, and more preferably not less than 0.1. The σ value (Hammett substituent constant) is described in, for example, Journal of Medicinal Chemistry, 1973, Vol. 16, No. 11, 1207–1216. Specific examples of such an electron-withdrawing group include a cyano group, alkoxycarbonyl group, aryloxycarbonyl group, carbamoyl group, sulfamoyl group, alkylsulfonyl group, arylsulfonyl group, halogen atom, acyl group and heterocyclic group.

The compound represented by the foregoing formula (1) is preferably a compound represented by the following formula (1-a):

$$R^1—CBr_2—(C{=}O)—R^2 \quad \text{formula (1-a)}$$

wherein $R^1$ is a hydrogen atom, a bromine atom, an alkyl group, an aryl group, an acyl group, an alkylsulfonyl group, an arylsulfonyl group or a cyano group; $R^2$ is a monovalent substituent group, provided that $R^1$ and $R^2$ may combine with each other to form a ring.

In the foregoing formula (1-a), $R^1$ is preferably a hydrogen atom or bromine atom, and more preferably a bromine atom; and preferred examples of the monovalent substituent group represented by $R^2$ include a hydrogen atom, hydroxy group, alkyl group, cycloalkyl group, aryl group, alkenyl group, amino group, alicyclic amino group (e.g., cycloalkylamino group, adamantylamino group), arylamino group, alkylamino group (provided that in the case of a dialkylamino group, alkyl groups may be combined with each other to form a ring), alkenyl amino group, alkylsulfamoyl group, arylsulfamoyl group, alkylsulfonyl group, arylsulfonyl group, alkoxy group, alicyclic-oxy group (e.g., cycloalkyloxy group, adamantyloxy group) aryloxy group, amido group, and cyano group. These substituent groups may further be substituted. $R^2$ may combine with $R^1$ to form a ring.

The compound represented by the foregoing formula (1-a) is preferably a compound represented by the following formula (1-b):

$$CBr_3—(C{=}O)—X—R^3 \quad \text{formula (1-b)}$$

wherein $R^3$ is a monovalent substituent group; X is —O— or —$NR^4$—, in which $R^4$ is a hydrogen atom or an alkyl group, provided that $R^3$ and $R^4$ may combine with each other to form a ring.

In the foregoing formula (1-b), preferred examples of the substituent group represented by $R^3$ include a hydrogen atom, alkyl group, alicyclic hydrocarbon group (e.g., cycloalkyl group, adamantly group), aryl group and alkenyl group, which may further be substituted; X represents —O— or —$NR^4$—, in which $R^4$ is a hydrogen atom or alkyl group (preferably hydrogen atom), provided that $R^4$ may combine with $R^3$ to form a ring.

Specific examples of compounds represented by the foregoing formula (1-a) or (1-b) are shown below but are by no means limited to these.

BR1

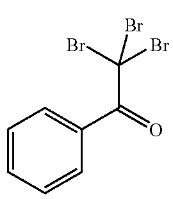

BR2

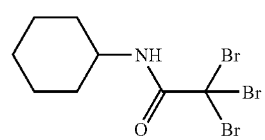

BR3

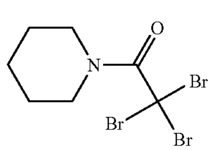

BR4

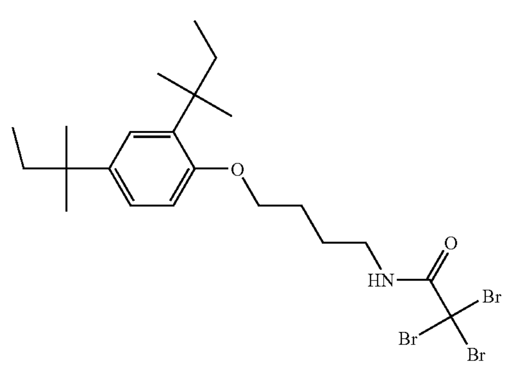

-continued
BR5
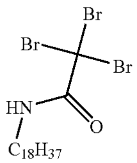
BR6
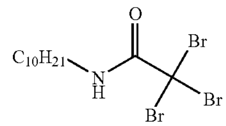
BR7
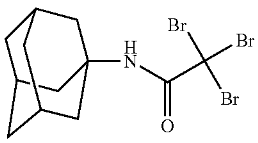
BR8
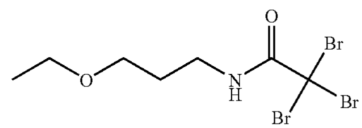
BR9
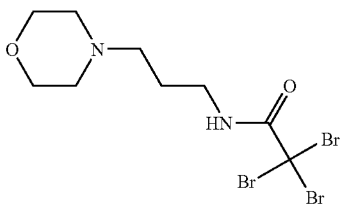
BR10
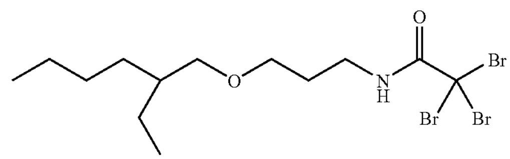
BR11
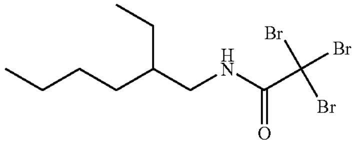
BR12
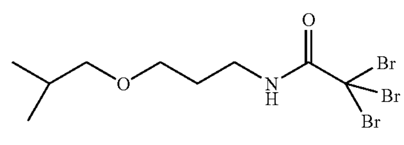
BR13
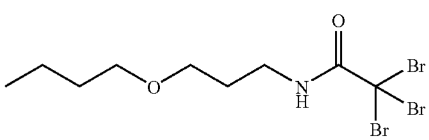
BR14
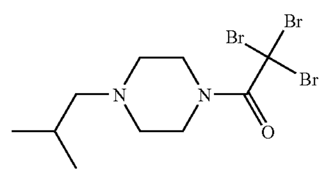
BR15
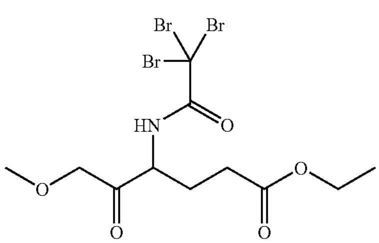
BR16
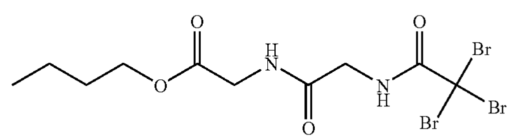
BR17
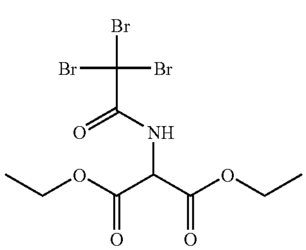
BR18
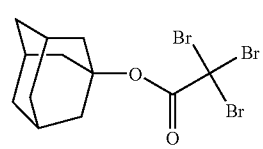
BR19
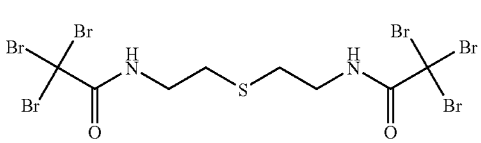
BR20
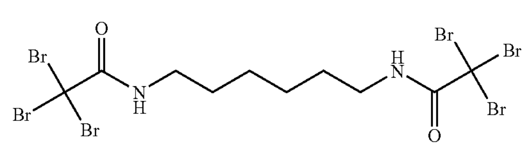

-continued
BR21
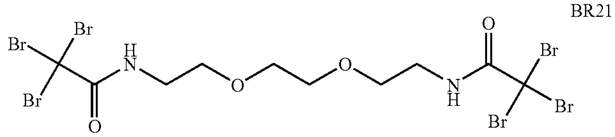
BR22
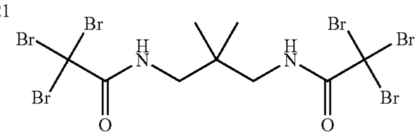
BR23
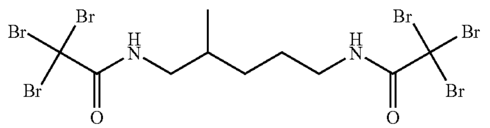
BR24
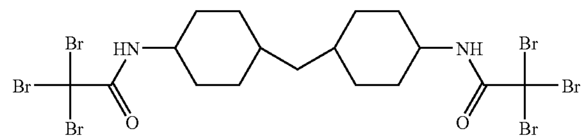
BR25
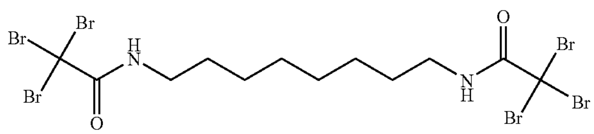
BR26
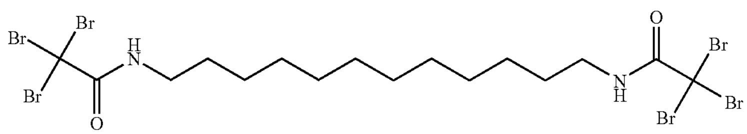
BR27
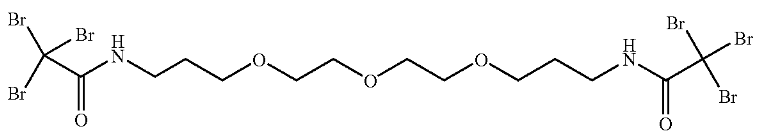
BR28
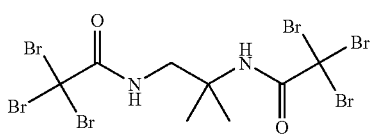
BR29
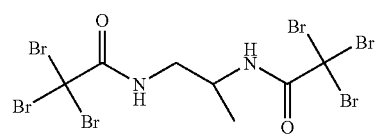
BR30
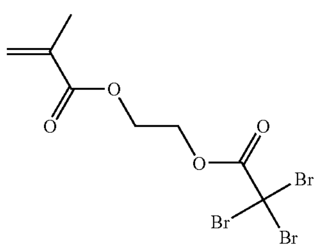
BR31
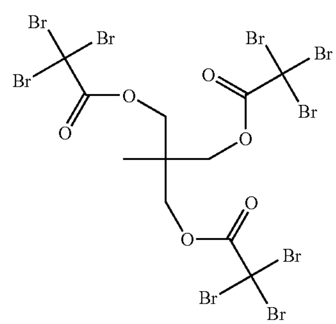
BR32
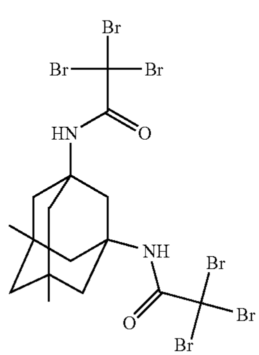
BR33
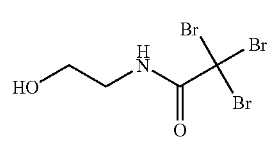

-continued
BR34
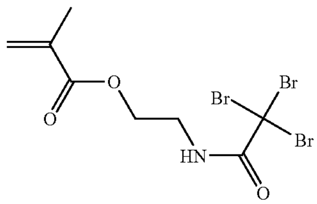
BR35
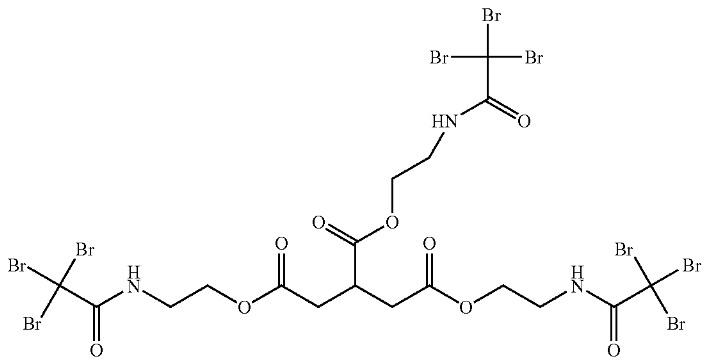
BR36
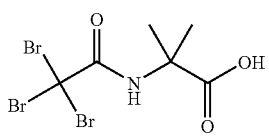
BR37
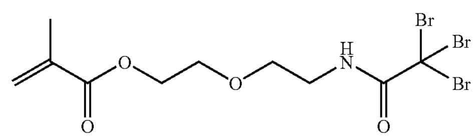
BR38
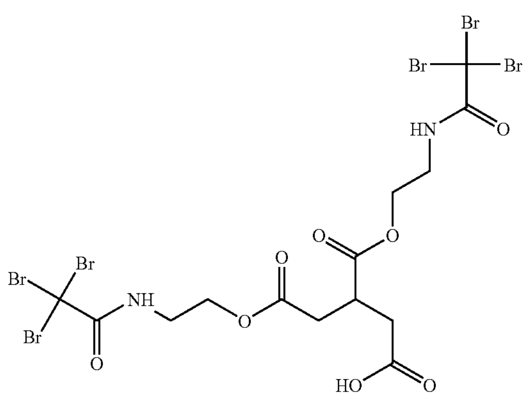
BR39
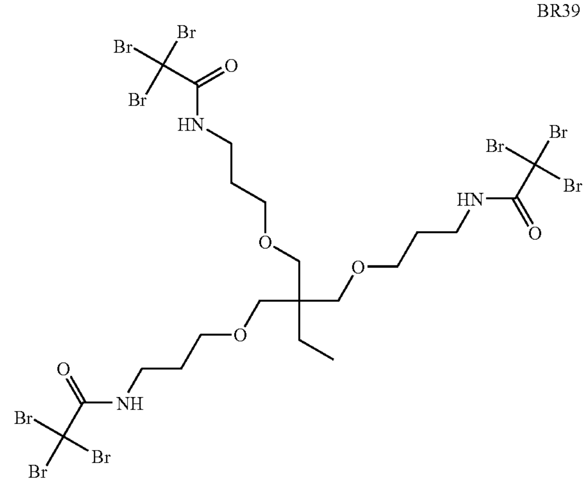
BR40
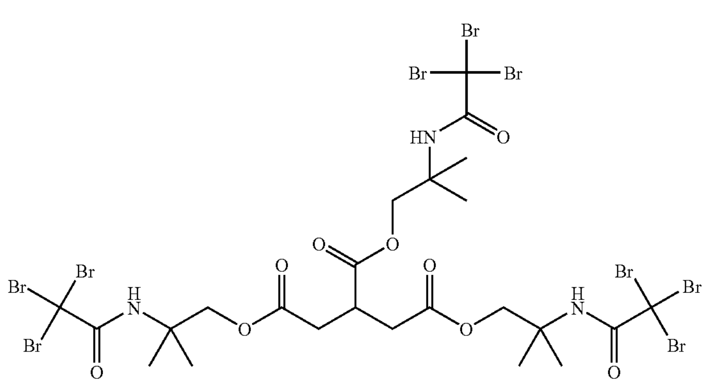

-continued
BR41
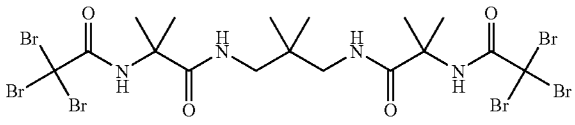
BR42
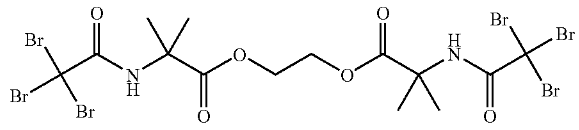
BR43
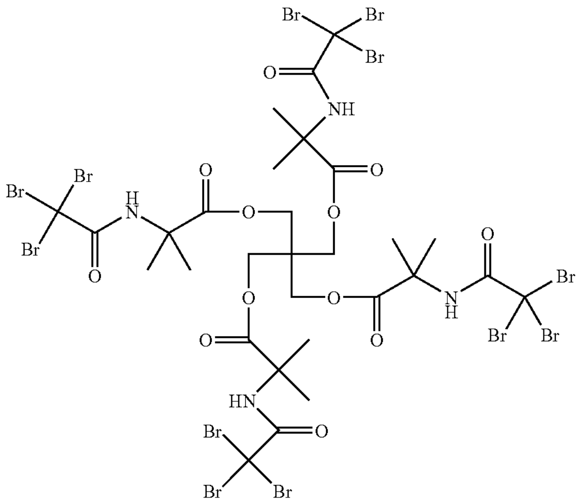
BR44
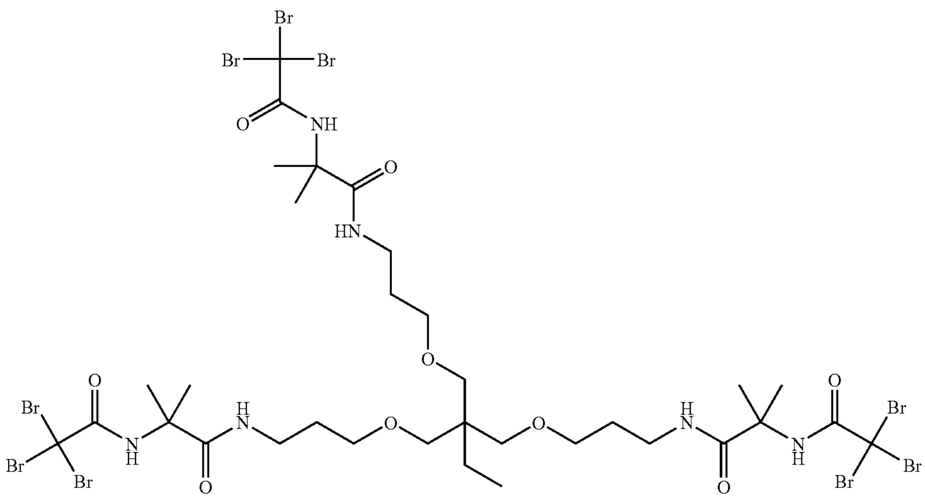
BR45
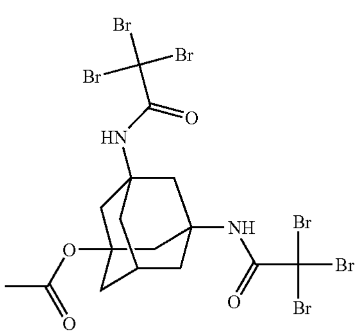
BR46
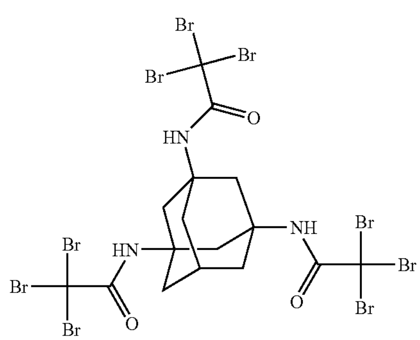
BR47
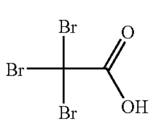
BR48
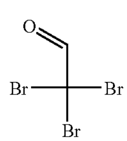

-continued
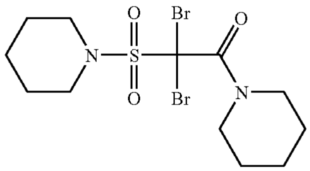
BR49
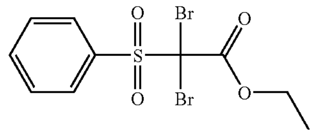
BR50
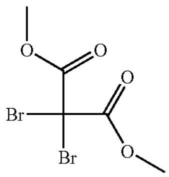
BR51
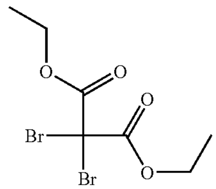
BR52
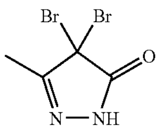
BR53
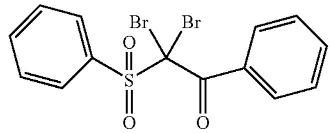
BR54
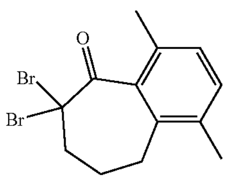
BR55
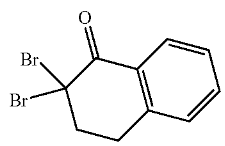
BR56
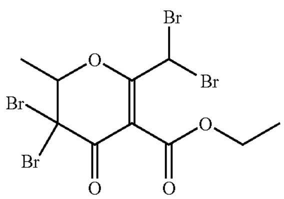
BR57
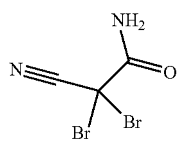
BR58
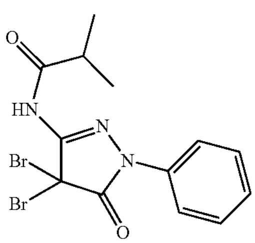
BR59
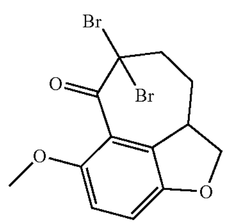
BR60
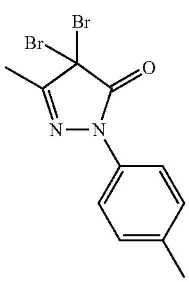
BR61
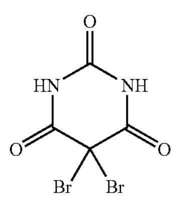
BR62
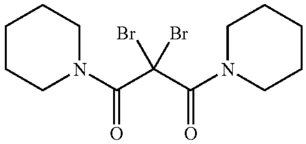
BR63
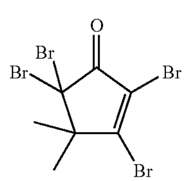
BR64

-continued

BR65

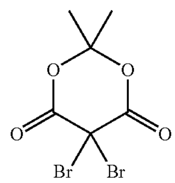

BR66

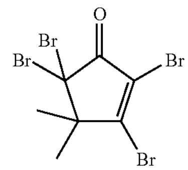

Of compounds represented by the foregoing formulas (1-a) and (1-b), those represented by the formula (1-b) are preferred. Specific examples of the compound represented by formula (1-b) include the foregoing compounds BR2 through BR47.

Further, of the compound represented by the foregoing formula (1), a compound represented by the following formula (2-1) or (2-2) is also preferred:

formula (2-1)

$$W\text{-}(L)_n\text{-}Q_1\text{-}Y^1\text{-}\underset{Z^2}{\overset{Z^1}{C}}\text{-}X$$

wherein $Z^1$ and $Z^2$ independently are a halogen atom; X is a hydrogen atom or an electron-withdrawing group; $Y^1$ is —CO— or —$SO_2$—; $Q_1$ is an arylene group or a divalent heterocyclic group; L is a linkage group; W is a carboxyl group or its salt, sulfo group or its salt, a phosphoric acid group or its salt, hydroxyl group, quaternary ammonium group or a polyethyleneoxy group; n is 0 or 1;

formula (2-2)

$$Q_2\text{-}(Y)_n\text{-}\underset{Z}{\overset{X_1}{C}}\text{-}X_2$$

wherein $X_1$ and $X_2$ are each a halogen atom; Z is a hydrogen atom or an electron-withdrawing group; Y is —C(═O)—, —SO— or —$SO_2$—; $Q_2$ is an alkyl group, an aryl group or a heterocyclic group; n is 0 or 1.

In the foregoing formula (2-1), $Z^1$ and $Z^2$ are each a halogen atom (e.g., fluorine, chlorine, bromine, iodine), and both $Z^1$ and $Z^2$ are preferably bromine atoms; and X is a hydrogen atom or an electron-withdrawing group. The electron-withdrawing group is the same as defined in the foregoing formula (1). In the formula (2-1), X is preferably a hydrogen atom or halogen atom, and more preferably a bromine atom; $Y^1$ is —CO— or —$SO_2$—, and preferably —$SO_2$—.

In the formula (2-1), $Q_1$ is an arylene group or a divalent heterocyclic group. The arylene group is preferably a monocyclic or condensed arylene group having 6 to 30 carbon atoms, and more preferably 6 to 20 carbon atoms, including, for example, phenylene and naphthylene, and $Q_1$ is preferably a phenylene group. The arylene group represented by $Q_1$ may be substituted. Any substituent having no adverse effect on photographic performance is acceptable. Examples of the substituent include a halogen atom (e.g., fluorine atom, chlorine atom, bromine atom, iodine atom), alkyl group (including an aralkyl group, cycloalkyl group and active methylene group), alkenyl group, alkynyl group, aryl group, heterocyclic group (including a N-substituted nitrogen-containing heterocyclic group), a quaternary nitrogen-containing heterocyclic group (e.g., pyridinio group), acyl group, alkoxycarbonyl group, aryloxycarbonyl group, carbamoyl group, carboxyl group and its salt, imino group, N-substituted imino group, thiocarbonyl group, carbazoyl group, cyano group, thiocarbamoyl group, alkoxy group (including a group having an ethyleneoxy group or propyleneoxy group as a repeating unit), aryloxy group, heterocyclic group, acyloxy group (such as alkoxy and aryloxy), carbamoyloxy group, sulfonyloxy group, acylamino group, sulfonamido group, ureido group, thioureido group, imido group, (alkoxy- or aryloxy-)carbonylamino group, sulfamoylamino group, semicarbazido group, thiosemicarbazido group, hydrazino group, quaternary ammonio group, (alkyl- or aryl-)sulfonylureido group, nitro group, (alkyl-, aryl- or heterocyclic-)thio group, acylthio group, (alkyl- or aryl-) sulfonyl group, (alkyl or aryl-)sulfinyl group, sulfonyl group or its salt, sulfamoyl group, phosphoryl group, phosphoric acid amide group or group having a phosphoric acid ester structure, and silyl group. The foregoing substituent groups may be further substituted by the substituent described above. The substituent for the aryl group represented by $Q_1$ is preferably an alkyl group, alkoxy group, aryloxy group, halogen atom, cyano group, carboxy group and its salt, sulfo group and its salt, or a phosphoric acid group. The heterocyclic group represented by $Q_1$ is a 5- to 7-membered unsaturated heterocyclic group having at least one of N, O and S atoms, which may be a monocycle or a condensed ring. Examples of the heterocyclic group represented by $Q_1$ include a pyridyl group, pyrazyl group, pyrimidyl group, benzthiazole group, benzimidazole group, thiadiazole group, quinolyl group, and isoquinolyl group. The foregoing groups may be substituted and examples of substituents are the same as defined in the arylene group represented by $Q_1$. In the formula (2-1), $Q_1$ is preferably an arylene group, and more preferably a phenylene group.

In the formula (2-1), L is a linkage group. Examples of such a linkage group include an alkylene group (preferably having 1 to 30 carbon atom, more preferably 1 to 20 carbon atoms, and still more preferably 1 to 10 carbon atoms), arylene group (preferably having 6 to 30 carbon atom, more preferably 66 to 20 carbon atoms, and still more preferably 6 to 10 carbon atoms), alkenylene group (preferably having 2 to 30 carbon atom, more preferably 2 to 20 carbon atoms, and still more preferably 2 to 10 carbon atoms), alkynylene group (preferably having 2 to 30 carbon atom, more preferably 2 to 20 carbon atoms, and still more preferably 2 to 10 carbon atoms), heterocyclic group (preferably having 1 to 30 carbon atom, more preferably 1 to 20 carbon atoms, and still more preferably 1 to 10 carbon atoms), —O—, —NR—, —CO—, —COO—, —OCOO—, —NRCO—, —NRCONR—, —OCONR—, —S—, —SO—, —$SO_2$—, —$SO_2NR$—, P-containing group, and a group formed by the combination of the foregoing groups (in which R is a hydrogen atom or an alkyl or aryl group, which may be substituted). The linkage group represented by L may be substituted and examples of the substituent are the same as cited in the arylene group represented by $Q^1$. L is preferably an alkylene group, —O—, —NRCO—, —$SO_2NR$—, or a group formed by the combination of the foregoing groups.

In the formula (2-1), W is a carboxy group or its salt (e.g., Na, K or ammonium salt), sulfo group or its salt (e.g., Na, K or ammonium salt), phosphoric acid group or its salt (e.g., Na, K or ammonium salt), hydroxyl group, quaternary ammonium group (e.g., tetrabutylammonium, trimethylbenzylammonium), or polyethylene oxide group. W is preferably a carboxyl group or its salt, sulfo group or its salt, or hydroxyl group.

Specific examples of the compound represented by formula (2-1) are shown below but are by no means limited to these.

(1-1)

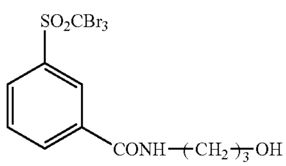

(1-2)

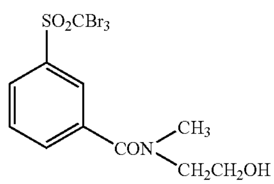

(1-3)

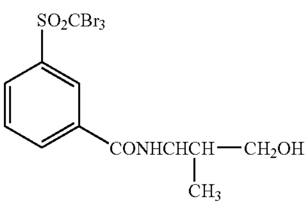

(1-4)

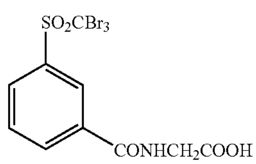

(1-5)

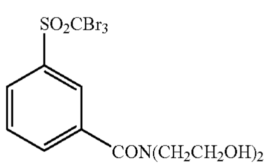

(1-6)

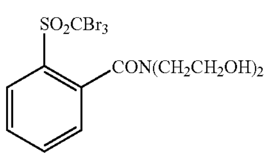

-continued (1-7)

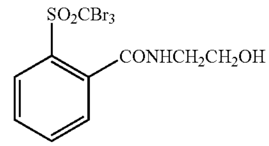

(1-8)

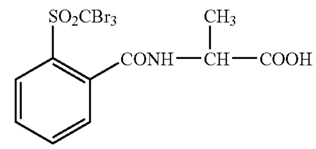

(1-9)

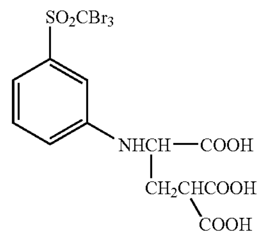

(1-10)

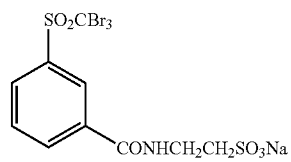

(1-11)

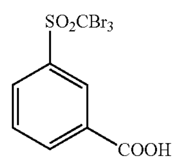

(1-12)

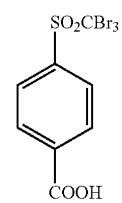

(1-13)

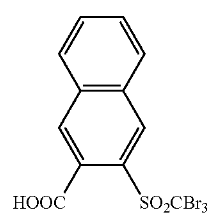

(1-14)

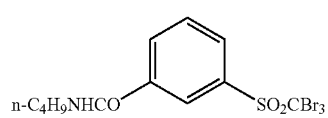

Compounds other than above-described compounds, which fall within the scope of the formula (2-1) are also described in JP-A No. 2000-284408. The compounds represented by the formula (2-1) can be synthesized in the conventional organic synthesis reaction, with reference to the foregoing patent document. The compound represented by the formula (2-1) is contained in the photopolymerizable photosensitive layer, preferably at 0.1 to 30%, more preferably 1 to 15%, and still more preferably 1.5 to 10% by weight, based on non-volatile components.

In the foregoing formula (2-2), $Q_2$ represents an alkyl group, aryl group or heterocyclic group.

The aryl group represented by $Q_2$ may be monocyclic or condensed, and preferably a monocyclic or condensed aryl group having 6 to 30 carbon atoms (such as phenyl or naphthyl), more preferably phenyl or naphthyl group, and still more preferably phenyl group. The heterocyclic group represented by $Q_2$ is a 3- to 10-membered saturated or unsaturated heterocyclic group containing at least one of N, O and S atoms, which may be monocyclic one or condensed one. The heterocyclic group is preferably a 5- or 6-membered unsaturated heterocyclic group which may be condensed, more preferably a nitrogen containing 5- or 6-membered aromatic heterocyclic group which may be condensed, and still more preferably a 5- or 6-membered nitrogen-containing aromatic heterocyclic group which may be condensed, and a 5- or 6-membered aromatic heterocyclic group containing one to four nitrogen atoms, which may be condensed, is specifically preferred. Heterocycles forming the foregoing heterocyclic groups include, for example, pyrrolidine, piperidine, piperazine, morpholine, thiophene, furan, pyrrole, imidazole, pyrazole, pyridine, pyrimidine, pyrazine, pyridazine, pyrazine, pyridazine, triazole, triazine, indole, indazole, purine, thiadiazole, oxadiazole, quinoline, phthalazine, naphthyridine, quinoxaline, quinazoline, cinnoline, pteridine, acridine, phenthroline, phenazine, tetrazole, thiazole, oxazole, benzimidazole, benzoxazole, benzthiazole, benzoselenazole, indolenine, and tetrazaindene. Of the foregoing heterocycles, imidazole, pyrazole, pyridine, pyrimidine, pyrazine, pyridazine, triazole, triazine, indole, indazole, purine, thiadiazole, oxadiazole, quinoline, phthalazine, naphthyridine, quinoxaline, quinazoline, cinnoline, pteridine, acridine, phenthroline, phenazine, tetrazole, thiazole, oxazole, benzimidazole, benzoxazole, benzthiazole, benzoselenazole, indolenine, and tetrazaindene are preferred; imidazole, pyridine, pyrimidine, pyrazine, pyridazine, triazole, triazine, thiadiazole, quinoline, phthalazine, naphthyridine, quinoxaline, quinazoline, cinnoline, tetrazole, thiazole, benzimidazole, and benzthiazole are more preferred; pyridine, thiadiazole, quinoline and benzthiazole are specifically preferred.

The aryl group or heterocyclic group, represented by $Q_2$ may further be substituted by. Such substituent groups include, for example, an alkyl group (preferably having 1 to 20 carbon atom, more preferably 1 to 12 carbon atoms, and still more preferably 1 to 8 carbon atoms, e.g., methyl, ethyl, n-propyl, iso-propyl, n-butyl, iso-butyl, tert-butyl, n-octyl, n-decyl, n-hexadecyl, cyclopropyl, cyclopentyl, cyclohexyl), alkenyl group preferably having 2 to 20 carbon atom, more preferably 2 to 12 carbon atoms, and still more preferably 2 to 8 carbon atoms, e.g., vinyl, allyl, 2-butenyl, 3-pentenyl), alkynyl group (preferably having 2 to 20 carbon atom, more preferably 2 to 12 carbon atoms, and still more preferably 2 to 8 carbon atoms, e.g., propargyl, 3-pentynyl), amino group (preferably having 0 to 20 carbon atom, more preferably 0 to 10 carbon atoms, and still more preferably 0 to 6 carbon atoms, e.g., amino, methylamino, dimethylamino, diethylamino, dibenzylamino), alkoxy group preferably having 1 to 20 carbon atom, more preferably 1 to 12 carbon atoms, and still more preferably 1 to 8 carbon atoms, e.g., methoxy, ethoxy, butoxy), aryloxy group preferably having 6 to 20 carbon atom, more preferably 6 to 16 carbon atoms, and still more preferably 6 to 12 carbon atoms, e.g., phenyloxy, 2-naphthyloxy), acyl group (preferably having 1 to 20 carbon atom, more preferably 1 to 16 carbon atoms, and still more preferably 1 to 12 carbon atoms, e.g., acetyl, benzoyl, formyl, pivaloyl), alkoxycarbonyl group (preferably having 2 to 20 carbon atom, more preferably 2 to 16 carbon atoms, and still more preferably 2 to 12 carbon atoms, e.g., methoxycarbonyl, ethoxycarbonyl), aryloxycarbonyl group (preferably having 7 to 20 carbon atom, more preferably 7 to 16 carbon atoms, and still more preferably 7 to 10 carbon atoms, e.g., phenyloxycarbonyl), acyloxy group(preferably having 2 to 20 carbon atom, more preferably 2 to 16 carbon atoms, and still more preferably 2 to 10 carbon atoms, e.g., acetoxy, benzoyloxy), acylamino group (preferably having 2 to 20 carbon atom, more preferably 2 to 16 carbon atoms, and still more preferably 2 to 10 carbon atoms, e.g., acetylamino, benzoylamino), alkoxycarbonylamino group (preferably having 2 to 20 carbon atom, more preferably 2 to 16 carbon atoms, and still more preferably 2 to 12 carbon atoms, e.g., methoxycarbonylamino), aryloxycarbonyl group (preferably having 7 to 20 carbon atom, more preferably 7 to 16 carbon atoms, and still more preferably 7 to 12 carbon atoms, e.g., phenyloxycarbonylamino), sulfonylamino group (preferably having 1 to 20 carbon atom, more preferably 1 to 16 carbon atoms, and still more preferably 1 to 12 carbon atoms, e.g., methanesulfonylamino, benzenesulfonylamino), sulfamoyl group (preferably having 0 to 20 carbon atom, more preferably 0 to 16 carbon atoms, and still more preferably 0 to 12 carbon atoms, e.g., sulfamoyl, methylsulfamoyl, dimethylsulfamoyl, phenylsulfamoyl), carbamoyl group (preferably having 1 to 20 carbon atom, more preferably 1 to 16 carbon atoms, and still more preferably 1 to 12 carbon atoms, e.g., carbamoyl, methylcarbamoyl, dimethylcarbamoyl, phenylcarbamoyl), alkylthio group (preferably having 1 to 20 carbon atom, more preferably 1 to 16 carbon atoms, and still more preferably 1 to 12 carbon atoms, e.g., methylthio, ethylthio), arylthio group (preferably having 6 to 20 carbon atom, more preferably 6 to 16 carbon atoms, and still more preferably 6 to 12 carbon atoms, e.g., phenylthio), sulfonyl group (preferably having 1 to 20 carbon atom, more preferably 1 to 16 carbon atoms, and still more preferably 1 to 12 carbon atoms, e.g., mesyl, tosyl, phenylsufonyl), sulfinyl group (preferably having 1 to 20 carbon atom, more preferably 1 to 16 carbon atoms, and still more preferably 1 to 12 carbon atoms, e.g., methanesulfonyl, benzenesulfonyl), ureido group (preferably having 1 to 20 carbon atom, more preferably 1 to 16 carbon atoms, and still more preferably 1 to 12 carbon atoms, e.g., ureido, methylureido, phenylureido), phosphoric acid amide group (preferably having 1 to 20 carbon atom, more preferably 1 to 16 carbon atoms, and still more preferably 1 to 12 carbon atoms, e.g., diethylphosphoric acid amide, phenylphosphoric amide), hydroxy group, mercapto group, halogen atom (e.g., fluorine, chlorine, bromine, iodine), cyano group, sulfo group, carboxyl group, nitro group, hydroxamic acid group, sulfino group, hydrazine group, heterocyclic group (e.g., imidazolyl, pyridyl, furyl, piperidine, morpholine). The foregoing substituents may further be substituted. Two or more substituents may be the same or different. Preferred examples of such a substituent include an alkyl group, alkenyl group, aryl group, alkoxy group, aryloxy group, acyloxy group, acyl group, alkoxycarbonyl group, aryloxycarbonyl group, acylamino group, alkoxycarbonylamino group, aryloxycarbonylamino group, sulfonylamino group, sulfamoyl group, carbamoyl group, sulfonyl group, ureido group, phosphoric acid amide group, halogen atom, cyano group, sulfo group, carboxyl group, nitro group, and heterocyclic group. Of these substituents, an alkyl group, aryl group, alkoxy group, aryloxy group, acyl group, acylamino group, alkoxycarbonylamino group, aryloxycarbonylamino group, sulfonylamino group, sulfamoyl group, carbamoyl group, ureido group, phosphoric acid amide group, halogen atom, cyano group, nitro group, and heterocyclic group are more preferred; and aralkyl group, aryl group, alkoxy group, aryloxy group, acyl group, acylamino group, sulfonylamino group, sulfamoyl group, carbamoyl group, halogen atom, cyano group, nitro group, and heterocyclic group are still more preferred. Further, an alkyl group, aryl group and halogen atom are specifically preferred.

The alkyl group represented by $Q_2$ may be straight-chain, branched or cyclic one, preferably having 1 to 30 carbon atoms, and more preferably 1 to 15 carbon atoms, such as methyl, ethyl, n-propyl, isopropyl and tertiary octyl. The alkyl group, represented by $Q_2$ may further be substituted by substituent groups, other than —(Y)n-CZ ($X_1$) ($X_2$). Such substituent groups are the same as cited in $Q_2$ of the aryl or heterocyclic group described above. Examples of the substituent include alkenyl group, aryl group, alkoxy group, aryloxy group, acyloxy group, acylamino group, alkoxycarbonyl group, aryloxycarbonyl group, acylamino group, alkoxycarbonylamino group, aryloxycarbonylamino group, sulfonylamino group, alkylthio group, arylthio group, ureido group, phosphoric acid amide group, hydroxy group, halogen atom, and heterocyclic group. Of these, an aryl group, alkoxy group, aryloxy group, acylamino group, alkoxycarbonylamino group, sulfonylamino group, ureido group, phosphoric acid amide group, and halogen atom are preferred; and an aryl group, alkoxy group, aryloxy group, acylamino group, sulfonylamino group, ureido group and phosphoric acid amide group are still more preferred. The foregoing substituents may further be substituted. Two or more substituents may be the same or different.

Y represents —C(=O)—, —SO— or —$SO_2$—, preferably —C(=O)— or —$SO_2$—, and more preferably —$SO_2$—; n is 0 or 1, and preferably 1; $X_1$ and $X_2$, which may be the same or different, are each a halogen atom, such as fluorine, chlorine, bromine or iodine; preferably chlorine, bromine, or iodine; more preferably chlorine or bromine; and still more preferably bromine.

Z represents a hydrogen atom or an electron-withdrawing group. The electron-withdrawing group, represented by Z, is preferably a group having a σp value of not less than 0.01, and more preferably not less than 0.1. The σ value (Hammett substituent constant) is described in, for example, Journal of Medicinal Chemistry, 1973, Vol. 16, No. 11, 1207–1216. Examples of an electron-withdrawing group include halogen atom {[fluorine atom (σp=0.06), chlorine atom (σp=0.23), bromine atom (σp=0.23), iodine atom (σp=0.18)], trihalomethyl group [tribromomethyl (σp=0.29), trichloromethyl (σp=0.33), trifluoromethyl (σp=0.54)], cyano group (σp=0.66), nitro group (σp=0.78), aliphatic, aryl or heterocyclic sulfonyl group [e.g., methanesulfonyl (σp=0.72)], aliphatic, aryl or heterocyclic acyl group [e.g., acetyl (σp=0.50), benzoyl (σp=0.43)], alkynyl group [e.g., C≡CH (σp=0.23)], aliphatic, aryl or heterocyclic oxycarbonyl group [e.g., methoxycarbonyl (σp=0.45), phenoxycarbonyl group (σp=0.44)], carbamoyl group (σp=0.36) and sulfamoyl group (σp=0.57).

Z is preferably an electron-withdrawing group, more preferably a halogen atom, an aliphatic, aryl or heterocyclic sulfonyl group, an aliphatic, aryl or heterocyclic acyl group, an aliphatic, aryl or heterocyclic oxycarbonyl group, carbamoyl group or a sulfamoyl group; and still more preferably a halogen atom. Of halogen atoms, chlorine, bromine and iodine atoms are preferred, chlorine and bromine atoms are more preferred, and bromine atom is still more preferred.

The compounds represented by formula (2-2) are preferably those which are represented by the following formula (2-2a):

formula (2-2a)

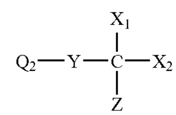

wherein $Q_2$, $X_1$, $X_2$, Y and Z each are the same as defined in formula (2-2), and the preferred scope thereof is the same as in defined in formula (2-2).

The foregoing compounds represented by formula (2-2a) are preferably those which are represented by the following formula (2-2b):

formula (2-2b)

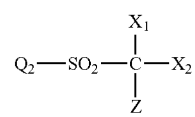

wherein $Q_2$, $X_1$, $X_2$, and Z each are the same as defined in the foregoing formula (2-b), and the preferred scope thereof is the same as in defined in formula (2-2).

Specific examples of the compounds represented by formula (2-2), (2-2a) or (2-2b) are shown below but are by no means limited to these.

(2-1)

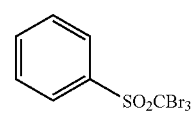

(2-2)

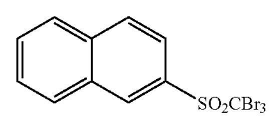

(2-3)

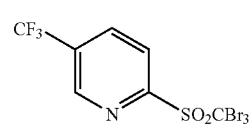

(2-4)

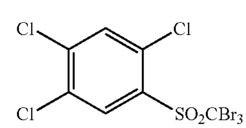

(2-5)

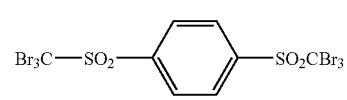

(2-6)

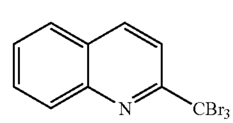

-continued (2-7)

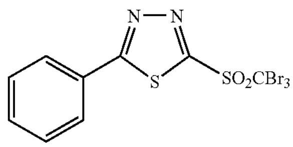

(2-8)

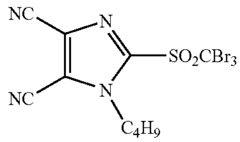

(2-9)

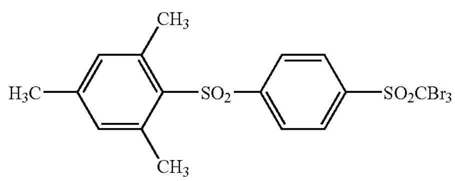

Compounds other than above-described compounds, which fall within the scope of the formula (2-2) are also described in JP-A No. 2000-305213. The compound represented by the formula (2-2), (2-2a) or (2-2b) is contained in the photopolymerizable photosensitive layer, preferably at 0.1 to 30%, more preferably 1 to 15%, and still more preferably 1.5 to 10% by weight, based on non-volatile components.

Furthermore, the compound represented by the foregoing formula (1) is also preferably a compound represented by the following formula (2-3):

formula (2-3)

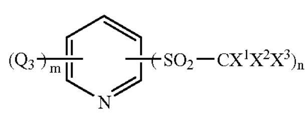

wherein $Q_3$ is an alkyl group, an aryl group or a heterocyclic group; $X^1$, $X^2$ and $X^3$ are each a hydrogen atom or a halogen atom, provided that at least one of $X_1$, $X_2$ and $X_3$ is a halogen atom, and all of $X_1$, $X_2$ and $X_3$ are preferably halogen atoms (more preferably, bromine atoms); m is an integer of 0 to 4; and n is an integer of 1 to 5.

Specific examples of the compound represented by the formula (2-3) are shown below but are by no means limited to these.

3-1

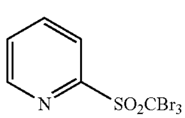

3-2

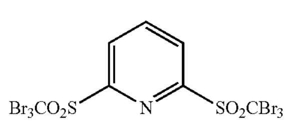

-continued 3-3

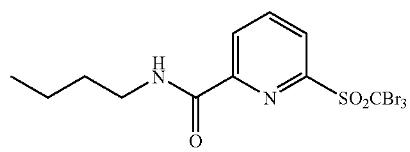

3-4

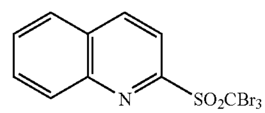

3-5

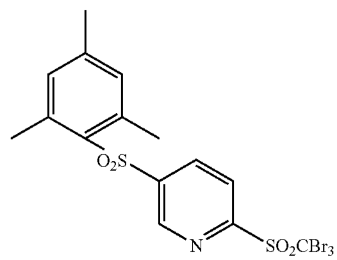

3-6

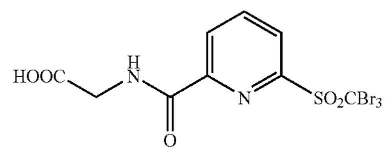

3-7

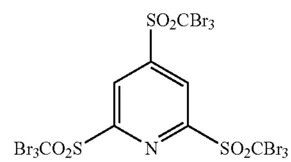

3-8

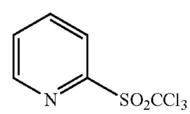

3-9

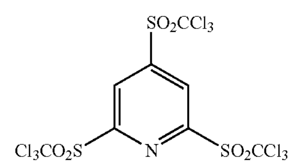

3-10

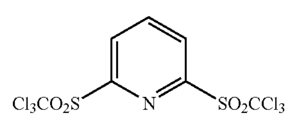

3-11

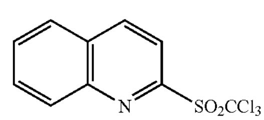

The compounds represented by the formula (2-3) can be synthesized in the conventional organic synthesis reaction, with reference to the foregoing JP-A No. 2000-284408. The compound represented by the formula (2-3) is contained in the photopolymerizable photosensitive layer, preferably at 0.1 to 30%, more preferably 1 to 15%, and still more preferably 1.5 to 10% by weight, based on non-volatile components.

The foregoing halogen-containing, photopolymerization initiator compounds (hereinafter, also called as polyhalogen compounds) are preferably usable in combination with titanocene compounds.

Titanocene compounds are described in JP-A No. 63-41483 and 2-291. Preferred examples of titanocene compounds bis(cyclopentadienyl)-Ti-di-chloride, bis(cyclopentadienyl)-Ti-bis-phenyl, bis(cyclopentadienyl)-Ti-bis-2,3,4,5,6-pentaflurophenyl, bis(cyclopentadienyl)-Ti-bis-2,3,5,6-tetrafluorophenyl, bis(cyclopentadienyl)-Ti-bis-2,4,6-trifluorophenyl, bis(cyclopentadienyl)-Ti-bis-2,6-difluorophenyl, bis(cyclopentadienyl)-Ti-bis-2,4-difluorophenyl, bis(methylcyclopentadienyl)-Ti-bis-2,3,4,5,6-pentafluorophenyl, bis(methylcyclopentadienyl)-Ti-bis-2,3,5,6-tetrafluorophenyl, bis(methylcyclopentadienyl)-Ti-bis-2,6-difluorophenyl (IRUGACURE 784, produced by Ciba Speciality Chemicals Co.), bis(cyclopentadienyl)-bis(2,4,6-trifluoro-3-(pyry-1-yl)phenyl)titanium, and bis(cyclopentadienyl)-bis(2,4,6-trifluoro-3-(2-5-dimethylpyry-1-yl)phenyl)titanium.

Chemical structures of representative titanocene compounds are exemplarily shown below.

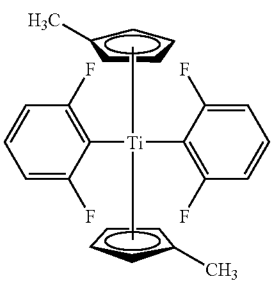

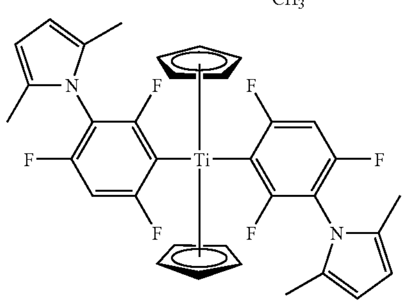

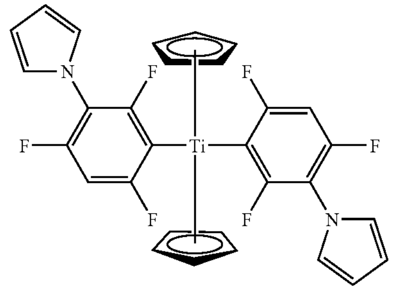

The titanocene compound is contained in the photopolymerizable photosensitive layer, preferably at 0.1 to 15%, more preferably 1 to 15%, and still more preferably 1.5 to 10% by weight, based on non-volatile components.

In this invention, organic borate compounds are preferably used in combination with anyone of the polyhalogen compounds relating to this invention, thereby leading to enhanced advantageous effects of this invention.

Representative organic borate compounds are represented by the following formula (7):

formula (7)

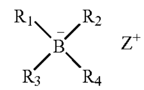

wherein $R_1$, $R_2$, $R_3$ and $R_4$ are each an alkyl group, aryl group, aralkyl group, alkenyl group, alkynyl group, silyl group, heterocyclic group or halogen atom; Z represents a cation.

Organic borate compounds are preferably monoalkyltriaryl borate compounds, as described in JP-A Nos. 62-150242 and 62-143044. Thus, in the foregoing formula (7), it is preferred that $R_1$ is an alkyl group and $R_2$, $R_3$ and $R_4$ are aryl groups. Specific examples thereof include tetra-n-butyl ammonium n-butyl-trinaphthalene-1-yl-borate, tetra-n-butyl ammonium n-butyl-triphenyl-borate, tetra-n-butyl ammonium n-butyl-tri-(4-tert-butylphenyl)-borate, tetra-n-butyl ammonium n-hexyl-tri-(3-chloro-4-methylphenyl)-borate, and tetra-n-butyl ammonium n-hexyl-tri-(3-fluorophenyl)-borate.

Specific examples of the organic borate compound represented by formula (7) are shown below but are by no means limited to these.

(1)

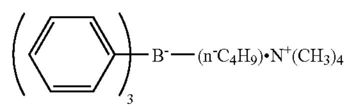

(1-i)

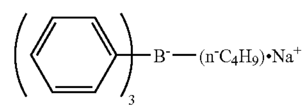

(1-ii)

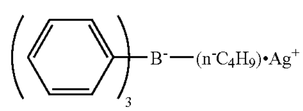

(1-iii)

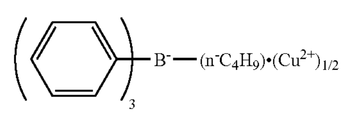

(2)

$$(n\text{-}C_4H_9)_3B^- \text{—} Si(C_6H_5)_2CH_3 \cdot N^+(CH_3)_4$$

(3)

$$(n\text{-}C_4H_9)_3B^- \text{—} Si(C_6H_5)_2CH_3 \cdot P^+(n\text{-}C_4H_9)_4$$

(4)

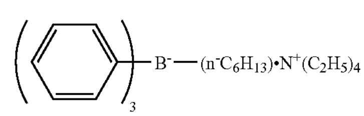

(5)

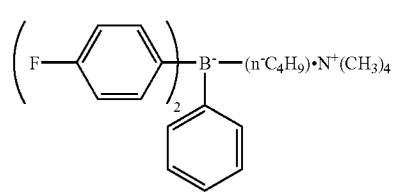

-continued (6)

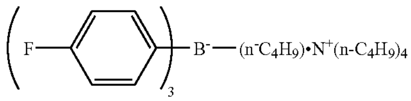

(6-i)

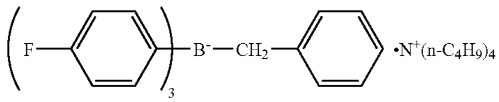

(6-ii)

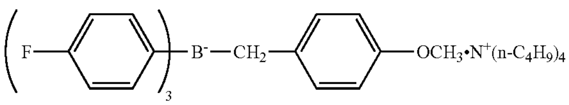

(6-iii)

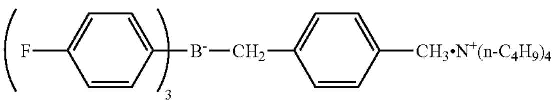

(6-iv)

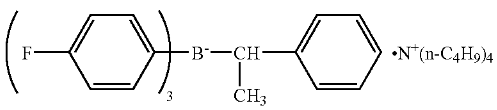

(7)

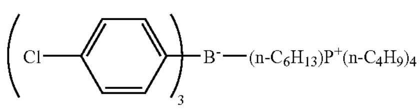

(8)

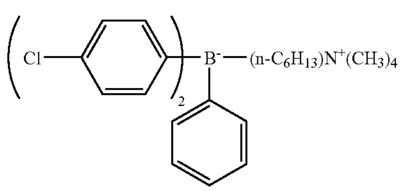

(9)

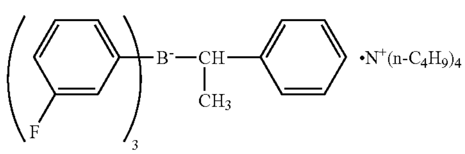

(10)

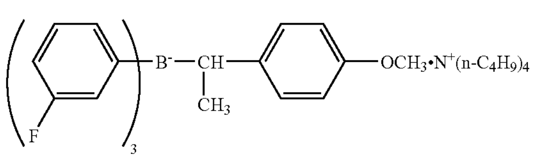

(11)

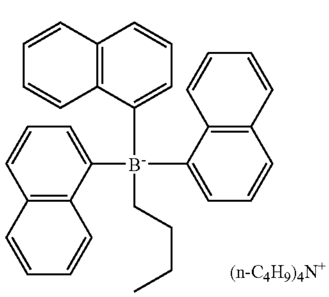

-continued (12)

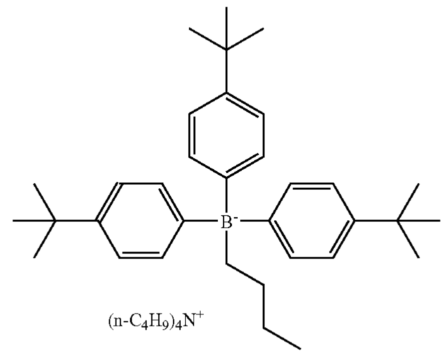

(13)

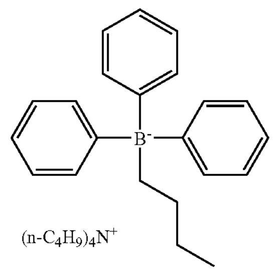

Compounds other than above-described compounds, which fall within the scope of the formula (7) are also described in JP-A No. 2002-185985. The compound represented by the formula (7) is contained in the photopolymerizable photosensitive layer, preferably at 0.1 to 30%, more preferably 1 to 15%, and still more preferably 1.5 to 10% by weight, based on non-volatile components.

The foregoing bromine compounds (photopolymerization initiator) relating to this invention are preferably usable in combination with iron arene complex compounds.

Iron arene complex compounds include those which are described in JP-A no. 59-219307 and are specifically represented by the following formula (6):

formula (6)

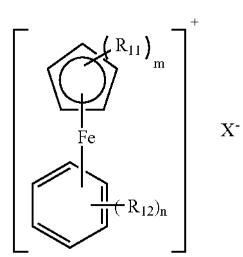

wherein $R_{11}$ and $R_{12}$, which may be the same or different, are each an alkyl group having 1 to 12 carbon atoms, alkynyl group having 1 to 12 carbon atoms, alkoxy group having 1 to 8 carbon atoms, cyano group, alkylthio group, phenoxy group, a monocarboxylic acid having 2 to 8 carbon atoms and its ester, alkanoyl group having 2 to 5 carbon atoms, ammonium salt, pyridinium group, nitro group, alkylsulfonyl group, alkylsulfonyl group, sulfamoyl group and halogen atom, provided that $R_{12}$ may be condensed with benzene ring (s9 to form a polycyclic compound; X represents $BF_4$, $PF_6$, $AsF_6$, $SbF_6$, $FeCl_4$, $SnCl_6$, $SbCl_6$, or $BiCl_6$; m is an integer of 1 to 4, and n is an integer of 1 to 5.

Specific examples of the iron arene complex compound include (η6-benzene)(η5-cyclopentadienyl)iron(2) hexafluorophosphate, (η6-toluene)(η5-cyclopentadienyl) iron(2)hexafluorophosphate, (η6-cumene)(η5-cyclopentadienyl)iron(2)hexafluorophosphate,(η6-benzene)(η5-cyclopentadienyl)iron(2)tetrafluoroborate, (η6-naphthalene) (η5-cyclopentadienyl)iron(2)hexafluorophosphate, (η6-anthracene)(η5-cyclopentadienyl)iron(2) hexafluorophosphate, (η6-pyrene)(η5-cyclopentadienyl) iron(2)hexafluorophosphate, (η6-benzene)(η5-cyanocyclopentadienyl)iron(2)hexafluorophosphate, (η6-toluene)(η5-acetylcyclopentadienyl)iron(2) hexafluorophosphate, (η6-cumene)(η5-cyclopentadienyl) iron(2)tetrafluoroborate, (η6-benzene)(η5-carboethoxycyclohexadienyl)iron(2)hexafluorophosphate, (η6-benzene)(η5-1,3-dichlorocyclohexadienyl)iron(2) hexafluorophosphate, (η6-cyanobenzene)(η5-1,3-dichlorocyclohexadienyl)iron(2)hexafluorophosphate, (η6-acetophenone)(η5-cyclohexadienyl)iron(2) hexafluorophosphate, (η6-methylbenzoate)(η5-cyclopentadienyl)iron(2)hexafluorophosphate, (η6-benzenesulfonamido)(η5-cyclopentadienyl)iron(2) hexafluoroborate, (η6benzamido)(η5-cyclopentadienyl)iron (2)hexafluorophosphate, (η6-cyanobenzene)(η5-cyanocyclopentadienyl)iron(2)hexafluorophosphate, (η6-chloronaphthalene)(η5-cyclopentadienyl)iron(2) hexafluorophosphate, (η6-anthracene)(η5-cyanocyclopentadienyl)iron(2)hexafluorophosphate, (η6-chlorobenzene)(η5-cyclopentadienyl)iron(2) hexafluorophosphate, and (η6-chlorobenzene)(η5-cyclopentadienyl)iron(2)tetrafluoroborate. These compounds can be synthesized according to the method described in Dikl. Akd. Nauk. SSSR 149, 615 (1963).

The iron arene complex compound is contained in the photopolymerizable photosensitive layer, preferably at 0.1 to 15%, more preferably 1 to 15%, and still more preferably 1.5 to 10% by weight, based on non-volatile components.

In cases when laser light is used as a light source, spectral sensitizing dyes are preferably incorporated in the photosensitive layer. It is preferred to use dyes having an absorption maximum in the vicinity of the wavelengths of the light source.

Examples of compounds capable of causing spectral sensitization in the range of the visible to near-infrared region include a cyanine, phthalocyanine, merocyanine, porphyrin, spiro compound, ferrocene, fluorene, fulgide, imidazole, perylene, phenazine, phenothiazine, polyene, coumalin, coumalin derivatives, keto-coumalin, quinacridon, indigo, styryl, pyrylium compound, pyrromethene compound, pyrazolotriazole compound, benzothiazole compounds, barbituric acid derivatives, thiobarbituric acid compound and keto-alcohol borate complex, and compounds described in European Patent No. 568,993, U.S. Pat. Nos. 4,508,811 and 5,227,227, JP-A Nos. 2001-125255 and 11-271969.

Specific examples of the foregoing photopolymerization initiators and sensitizing dyes described in JP-A Nos. 2001-125255 and 11-271969. The molar ratio of a photopolymerization initiator to a sensitizing dye is preferably within the range of 1:100 to 100:1.

In cases when recording by use of semiconductor lasers having an emission wavelength of 350 to 450 nm (preferably 390 to 430 nm), so-called violet lasers, it is preferred to incorporate dyes having an absorption maximum at a wavelength of 390 to 430 nm. Such dyes having an absorption maximum at a wavelength of 390 to 430 nm are not specifically limited with respect to structure. Dyes described above, cyanine, phthalocyanine, merocyanine, porphyrin, spiro compound, ferrocene, fluorene, fulgide, imidazole, perylene, phenazine, phenothiazine, polyene, coumalin, coumalin derivatives, keto-coumalin, quinacridon, indigo, styryl, pyrylium compound, pyrromethene compound, pyrazolotriazole compound, benzothiazole compounds, barbituric acid derivatives, thiobarbituric acid compound and keto-alcohol borate complex are usable in this invention so long as the absorption maximum meets the requirement. Specific examples include dyes described in JP-A Nos. 2002-296764, 2002-268239, 2002-268238, 2002-268204, 2002-221790, 2002-2025982001-42524, 2000-309724, 2000-258910, 2000-2066902000-147763, and 2000-98605, but are not limited to these.

Next, there will be described compounds having an absorption maximum at the wavelengths of 350 to 600 nm, which are usable with polyhalogen compounds relating to this invention or the combination of the polyhalogen compounds and any one of the afore-mentioned titanocene compounds, iron arene complex compounds and organic borate compounds (unless otherwise noted, hereinafter, the titanocene compounds, iron arene complex compounds and organic borate compounds are generally called as orgamometallic compounds) to achieve further enhanced effects of this invention.

Preferred dyes having an absorption maximum at the wavelength of 350 to 600 nm, which are usable in combination with any one of the polyhalogen compounds and the titanocene compound include xanthenes, acrydines, coumalins and barbituric acids, and a dye represented by the following formula (8) is more preferred:

formula (8)

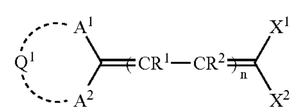

wherein $A^1$ and $A^2$ are each a carbon atom or heteroatom; $Q^1$ is a non-metallic atom group necessary to form a ring together with $A^1$, $A^2$ and adjacent carbon atom; $R^1$ and $R^2$ are each a hydrogen atom, alkyl group or aryl group, provided that $R^1$ and $R^2$ may combine with each other to form a ring; $X^1$ and $X^2$ are each cyano group or substituted carbonyl group, provided that $X^1$ and $X^2$ may combine with each other to form a ring; n is 1 or 2.

Specific examples of spectral sensitizing dyes represented by formula (8) are shown below but are by no means limited to these. The combination of a ring formed of $Q^1$ (designated $Q^1$), a carbon divalent group formed by linking $X^1$ with $X^2$, and "n" is also shown in which $R^1$ and $R^2$ are hydrogen atoms.

| Dye No. | 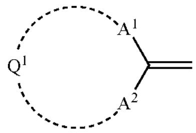 | 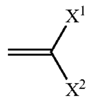 | ($R^1$=$R^2$=H) n |
|---|---|---|---|
| 1 | 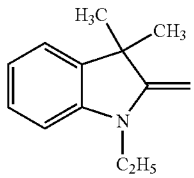 | 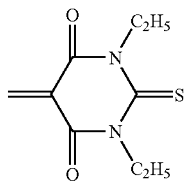 | 1 |
| 2 | 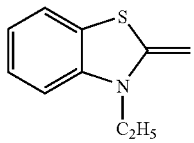 | 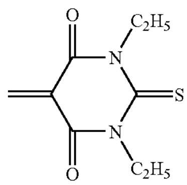 | 1 |
| 3 | 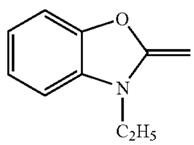 | 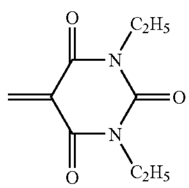 | 1 |
| 4 | 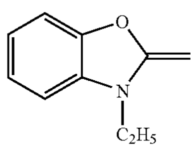 | 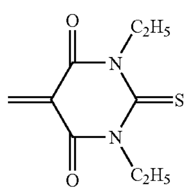 | 1 |
| 5 | 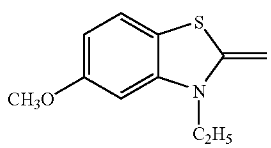 | 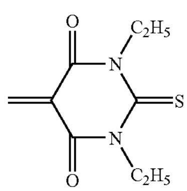 | 1 |
| 6 | 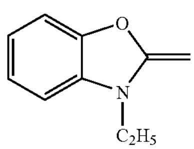 | 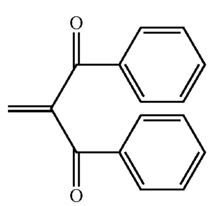 | 1 |
| 7 | 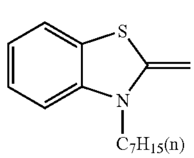 | 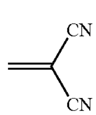 | 2 |

-continued

| Dye No. | 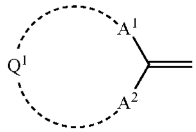 | 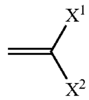 | (R¹=R²=H) n |
|---|---|---|---|
| 8 | 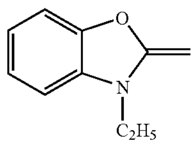 | 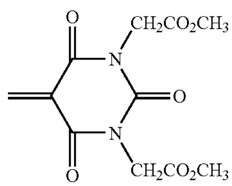 | 1 |
| 9 | 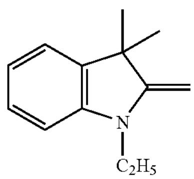 | 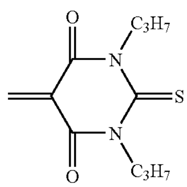 | 1 |
| 10 | 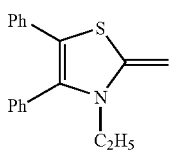 | 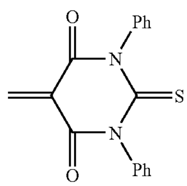 | 1 |

Compounds other than above-described compounds, which fall within the scope of the formula (8) are also described in JP-A No. 9-328505.

A preferred dye having an absorption maximum at the wavelength of 350 to 600 nm, which are usable in combination with any one of the polyhalogen compounds and the iron arene complex compound is a compound represented by the following formula (9) or (10):

formula (9)

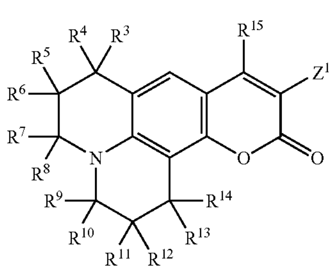

wherein $R^3$, $R^4$, $R^5$, $R^6$, $R^7$, $R^8$, $R^9$, $R^{10}$, $R^{11}$, $R^{12}$, $R^{13}$, $R^{14}$ and $R^{15}$ are each a hydrogen atom, alkyl group, alkoxy group, aryl group, cyano group, carboxyl group, or alkyloxycarbonyl group; $Z^1$ is an aryl group, heterocyclic group or —$COR^{16}$, in which $R^{16}$ is an alkyl group, alkoxy group, aryloxy group or heterocyclic group.

Specific examples of the dye represented by formula (9) are shown below but are not limited to these.

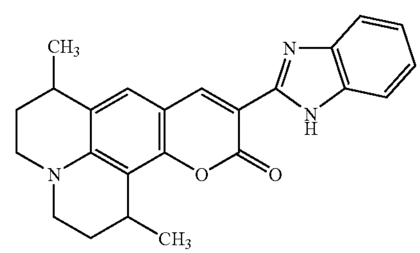

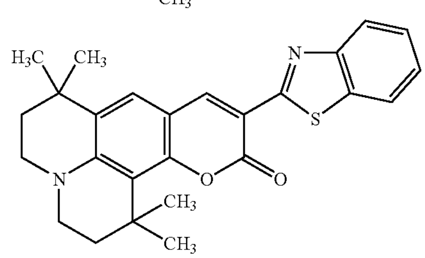

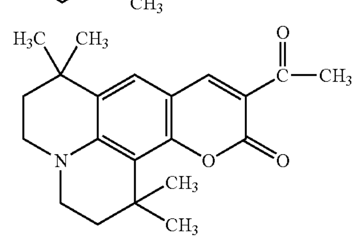

-continued

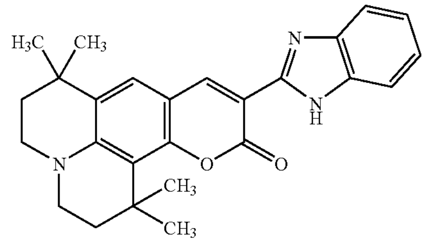

formula (10)

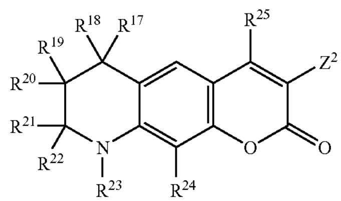

wherein $R^{17}$, $R^{18}$, $R^{19}$, $R^{20}$, $R^{21}$, $R^{22}$, $R^{23}$, $R^{24}$ and $R^{25}$ are each a hydrogen atom an alkyl group, alkoxy group, aryl group, cyano group, carboxyl group or alkyloxycarbonyl group; $Z^2$ is an aryl group, heterocyclic group or —$COR^{26}$, in which $R^{26}$ is an alkyl group, alkoxy group, aryl group, aryloxy group or a heterocyclic group.

Specific examples of the dye represented by formula (9) are shown below but are not limited to these.

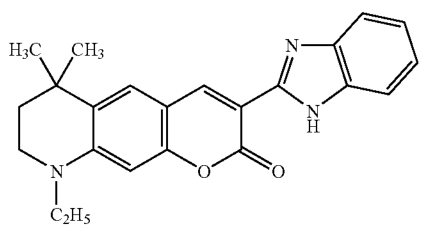

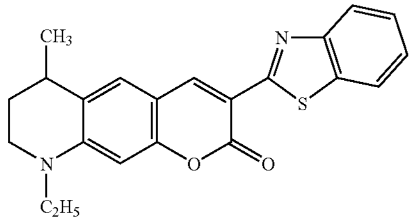

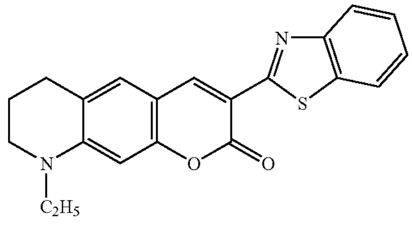

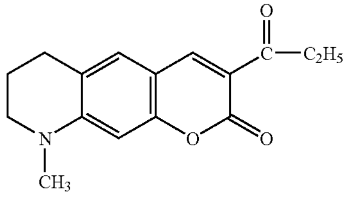

Preferred dyes having an absorption maximum at the whavelength of 350 to 600 nm, which are usable in combination with any one of the polyhalogen compounds and the iron arene complex compound include xanthene dyes, such as rose Bengal, Phloxine, erythrosisne, eosine and fluoresceine; coumalin dyes and anthracene dyes. Specific examples thereof are shown below but are by no means limited to these.

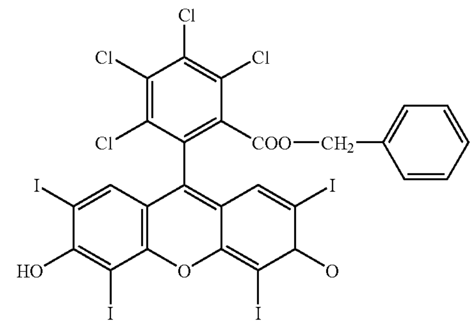

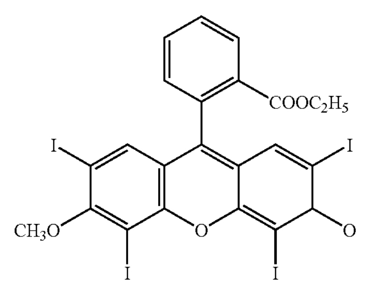

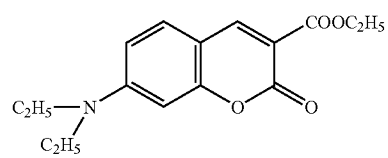

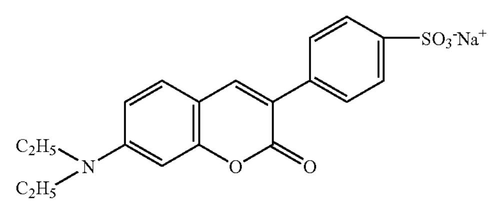

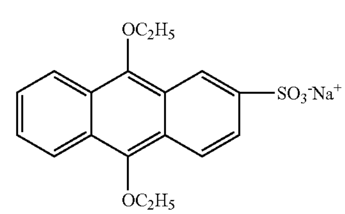

Preferred dyes having an absorption maximum at the wavelength of 350 to 600 nm, which are usable in combination with any one of the polyhalogen compounds and the organic borate compound include a cyanine dye, carbocyanine dye, hemicyanine dye, rhodamine dye and azamethine dye. Examples thereof are shown below but are not limited to these.

1.

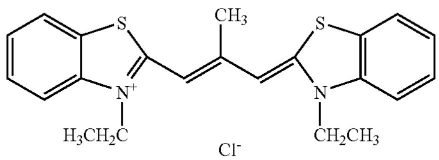

2.

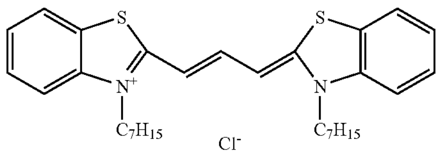

3.

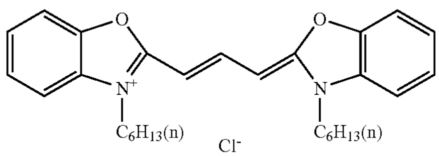

4.

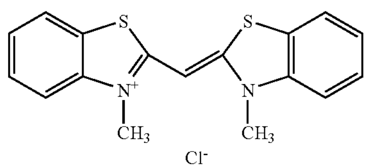

5.

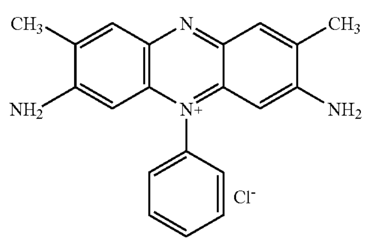

6.

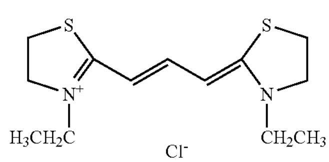

7.

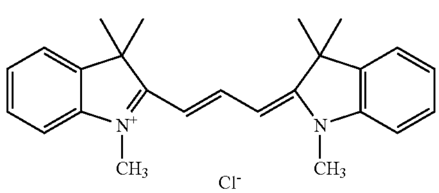

8.

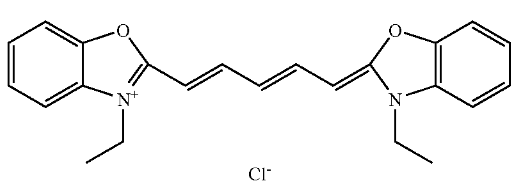

Dyes having an absorption maximum at 350 to 450 nm (preferably 390 to 430 nm) are preferably those which are described in JP-A Nos. 2000-98605, 2000-147763, 2000-

206690, 2000-258910, 2001-42524, and 2001-100412. Dyes represented by the following formula (11) are more preferred:

formula (11)

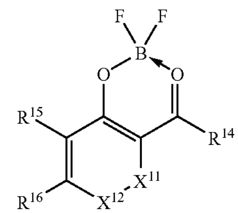

wherein $R^{14}$ is a hydrogen atom, an alkyl group, which may be substituted, alkenyl group, which may be substituted, aryl group, which may be substituted, or heterocyclic group which may be substituted; $R^{15}$ and $R^{16}$ are substituents which are linked with each other to form a ring; $X^{11}$ and $X^{12}$ are each —C($R^{17}$)($R^{18}$)—, —O—, —S— or —N($R^{19}$)—, in which $R^{17}$, $R^{18}$ and $R^{19}$ are each a hydrogen atom or an alkyl, alkenyl, aryl, aryl, or heterocyclic group which may be substituted.

Examples of the alkyl group represented by $R^{14}$, which may be substituted, include methyl, ethyl, propyl, butyl, hexyl, octyl, decyl, dodecyl, isopropyl, isobutyl, isopentyl, tert-butyl, and 2-ethylhexyl. Examples of the alkenyl group represented by $R^{14}$, which may be substituted, include vinyl, 2-propenyl, 3-butenyl, and 4-hexenyl. Examples of the aryl group represented by $R^{14}$, which may be substituted, include phenyl, naphthyl and aralkyl such as benzyl or phenethyl. Examples of the heterocyclic group represented by $R^{14}$, which may be substituted, include heterocyclic groups derived from 5- or 6-membered heterocycles such as pyrrole ring, imidazole ring, pyrazole ring, oxazole ring, thiazole ring, oxadiazole ring, thiadiazole ring, benzimidazole ring, pyridine ring, furan ring, thiophene ring, chroman ring, coumalin ring, pyrrolidine ring, piperidine ring, morpholine ring, sulfolane ring, tetraydrofuran ring and trahydropyrane ring.

The alkyl, alkenyl, aryl, or heterocyclic group which may be substituted, represented by $R^{17}$, $R^{18}$ and $R^{19}$ are the same as defined in $R^{14}$. Specific examples of sensitizing dyes represented by formula (11) are shown below but are not limited to these.

(11-1)

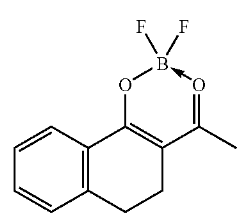

(11-2)

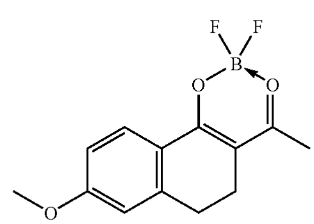

-continued (11-3)

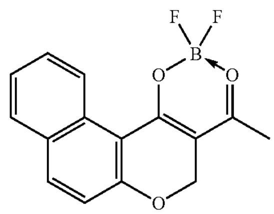

(11-4)

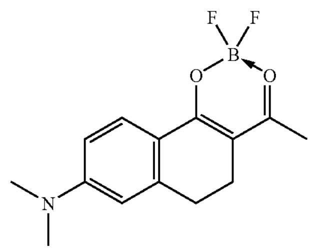

(11-5)

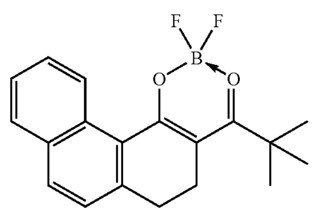

(11-6)

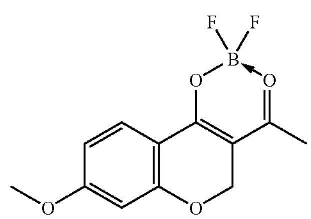

The spectral sensitizing dye represented by formula (11) can be synthesized in accordance with commonly known methods.

The mix proportion of the photopolymerization initiator composition relating to this invention is not specifically limited, depending on the kind of the initiator and the combination, is approximately 0.1 to 20 parts by weight, based on 100 parts by weight of ethylenically unsaturated monomer. The initiator represented by the foregoing formulas is preferably 0.1 to 20 parts by weight, and more preferably 0.5 to 15 parts by weight per 100 parts by weight of ethylenically unsaturated monomer. In cases when used in combination with a titanocene compound, monoalkyl-triaryl-borate compound or iron arene compound, these compounds are used preferably at 0.1 to 15 parts by weight per 100 parts by weight of ethylenically unsaturated monomer. In cases when used in combination with a dye having an absorption maximum at 390 to 430 nm, the content of the dye, depending on molar extinction coefficient of the dye, is preferably 0.1 to 15 parts by weight per 100 parts by weight of ethylenically unsaturated monomer.

The combined use of any Photopolymerization initiator is feasible in this invention. Examples of such an initiator include carbonyl compounds, organic sulfur compounds, persulfide compounds, redox type compounds, azo and diazo compounds, halogen compounds and phot-reducible dyes, as described in J. Kosar, Light-sensitive Systems, chapter 5. Specific example thereof are also described in British Patent No. 1,459,563. Specifically, photopolymerization initiators usable in combination with the aforementioned photopolymerization initiators relating to this invention include, for example, benzoin derivatives such as benzoin methyl ether, benzoin iso-propyl ether, α,α-dimethoxy-α-phenylacetophenone; benzophenone derivatives such as benzophenone, 2,4'-dichlorobenzophenone, methyl o-benzoylbenzoate, and 4,4'-bis(dimethylamino) benzophenone; thioxanthone derivatives such as 2-chlororothixanthone, and 2-I-propylthioxanthone; anthraquinone derivatives such as 2-chloroanthraquinone and 2-methylanthraquinone; acrydone derivatives such as N0methylacrydone, and N-butylacrydone; ,-diethoxyacetophenone, benzyl, fluorine xanthone and uranyl compounds; triazine derivatives described in JP-B No. 59-1281 (hereinafter, the term, JP-B refers to Japanese Patent Publication) and JP-A Nos. 61-9621 and 60-60104; organic peroxide compounds described in JP-A Nos. 59-1504 and 61-243807; diazonium compounds described in JP-B Nos. 43-23684, 44-6413, 47-1604, U.S. Pat. No. 3,567,453; organic azide compounds described in U.S. Pat. Nos. 2,848, 328, 2,852,379 and 2,940,853; o-quinoneazides described in JP-B Nos, 36-22062, 37-13109, 38-18015, and 45-9610; various kins of onium compounds described in JP-B No. 55-39162, JP-A No. 59-14023 and Macromolexuls, Vol. 10, 1307 (1977); azo compounds described in JP-A No. 59-14205; metal allene complex described in JP-A No. 1-54440, European Patent Nos. 109,851 and 126,712, J. Imag. Sci. 30, 174 (1986); (oxo)sulfonium organic boron complexes described in Japanese Patent Application Nos. 4-56831 and 4-89535; transition metal complexes containing a transition metal such as ruthenium, described in Coordination Chemistry Review, 84, 85–277 (1988), and JP-A No. 2-182701; 2,4,5-triarylimidazole dimmers described in JP-A No. 3-209477; organic halogen compounds such as carbon tetrabromide, described in JP-A No. 59-107344.

Polymeric binder materials usable in this invention include, for example, acrylamide type polymer, polyvinyl butyral resin, polyurethane resin, polyamide resin, polyester resin, epoxy resin, phenol resin, polycarbonate resin, polyvinyl formal resin, shellac and other natural resins. These resins may be used in combination thereof.

Of the polymer binders described above, a vinyl copolymer obtained by copolymerization of acryl type monomers is preferred, and a copolymer composing of (a) carboxyl-containing monomer and (b) methacrylic acid alkyl ester or acrylic acid alkyl ester is more preferred. Preferred examples of the carboxyl-containing monomer include α,β-unsaturated carboxylic acids such as acrylic acid, methacrylic acid, maleic acid, maleic acid anhydride, itaconic acid, and itaconic acid anhydride. A carboxylic acid such as a half ester of phthalic acid and 2-hydroxymethacrylate is also preferred. Specific examples of a methacrylic acid alkyl ester and acrylic acid alkyl ester include unsubstituted alkyl esters, such as methyl methacrylate, ethyl methacrylate, propyl methacrylate, butyl methacrylate, amyl methacrylate, hexyl methacrylate, heptyl methacrylate, octyl methacrylate, nonyl methacrylate, decyl methacrylate, undecyl methacrylate, dodecyl methacrylate, methyl acrylate, ethyl acrylate, propyl acrylate, butyl acrylate, amyl acrylate, hexyl acrylate, heptyl acrylate, octyl acrylate, nonyl acrylate, decyl acrylate, undecyl acrylate, and dodecyl acrylate; cyclic alkyl ester such as cyclohexyl methacrylate and cyclohexyl acrylate; substituted alkyl esters, such as benzyl methacrylate, 2-chloroethyl methacrylate, N,N-dimethylaminoethyl methacrylate, and glycidyl acrylate.

In the polymer binders used in this invention, the following monomers (1) through (14) are usable as a copolymerizable monomer:

(1) monomer containing a phenolic hydroxyl group, e.g., o-(p- or m-)hydroxystyrene, o-(p- or m-)hydroxyethylacrylate;

(2) monomer containing an alcoholic hydroxyl group, e.g., 2-hydroxyethyl acrylate, 2-hydroxyethyl methacrylate, N-methylol acrylamide, N-methylol methacrylamide, 4-hydroxybutyl methacrylate, 5-hydroxypentyl acrylate, 5-hydroxypentyl methacrylate, 6-hydroxyhexyl acrylate, 6-hydroxyhexyl methacrylate, N-(2-hydroxyethyl)acryl amide, N-(2-hydroxyethyl)methacryamide and hydroxyethyl vinyl ether;

(3) monomer containing a sulfonylamino group, e.g., m-(or p-)aminosulfonylphenyl methacrylate, m-(or p-)aminosulfonylphenylacrylate, N-(p-aminosulfonylphenyl)methacrylamide, N-(p-aminosulfonylphenyl)acrylamide;

(4) monomer containing a sulfonamido group, e.g., N-(p-toluenesulfonyl)acrylamide, N-(p-toluenesulfonyl)methacrylamide;

(5) acrylamides or methacrylamides, e.g., acrylamide, methacrylamide, N-ethylacrylamide, N-hexylacrylamide, N-cyclohexylacrylamide, N-phenylacrylamide, N-(4-nitrophenyl)acrylamide, N-ethyl-N-phenylacrylamide, N-(4-hydroxyphenyl)acrylamide, N-(4-hydroxyphenyl)methacrylamide;

(6) monomer containing a fluoroalkyl group, e.g., trifluoroethyl acrylate, trifluoroethyl methacrylate, tetrafluoropropyl methacrylate, hexafluoropropyl methacrylate, octafluoropentyl acrylate, octafluoropentyl methacrylate, heptadefluorodecyl methacrylate, N-butyl-N-(2-acryloxyethyl)heptadecafluorooctylsulfonamide;

(7) vinyl ethers, e.g., ethyl vinyl ether, 2-chloroethyl vinyl ether, propyl vinyl ether, butyl vinyl ether, octyl vinyl ether, phenyl vinyl ether;

(8) vinyl esters, e.g., vinyl acetate, vinyl chloroacetate, vinyl butylate, vinyl benzoate;

(9) styrenes, e.g., styrene, methylstyrene, chloromethylstyrene;

(10) vinyl ketones, e.g., methyl vinyl ketone, ethyl vinyl ketone, propyl vinyl ketone, phenyl vinyl ketone;

(11) olefins, e.g., ethylene, propylene, i-butylene, butadiene, isoprene;

(12) N-vinylpyrrolidone, e.g., N-vinylcarbazol, 4-vinylpyridine;

(13) monomer containing a cyano group, e.g., acrylonitrile, methacrylonitrile, 2-pentenenitrile, 2-methyl-3-butenenitrile, 2-cyanoethyl acrylate, o-(m- or p-)cyanostyrene;

(14) monomer containing an amino group, e.g., N,N-diethylaminoethyl acrylate, N,N-diethylaminoethyl methacrylate, N,N-dimethylaminoethyl methacrylate, polybutadiene urethane acrylate, N,N-dimethylaminopropyl acrylamide, N,N-dimethylacrylamide, acryloyl morpholine, N-i-propylacrylamide, and N,N-diethylacrylamide.

Monomers other than the monomers described above may be caused to co-polymeriz3 with the monomers described above. Further, a double bond-containing vinyl copolymer which can be obtained by causing a compound containing a (metha)acryloyl group and epoxy group to be reacted through addition reaction with a carboxyl group contained in the vinyl copolymer described above is also preferable as polymer binder usable in this invention. Specific examples of the compound containing a (metha)acryloyl group and epoxy group include glycidyl acrylate, glycidyl methacrylate, and double-bonded compounds containing an epoxy group, as described in JP-A No. 11-271969.

The foregoing copolymer preferably has a mean weight-average molecular weight of 10,000 to 200,000, which can be determined by gel permeation chromatography (GPC), but the mean molecular weight is not specifically limited to the foregoing range.

In the polymer binder used in this invention, the respective vinyl copolymers described above may optionally be used in combination with polyvinyl butyral resin, polyurethane resin, polyamide resin, polyester resin, epoxy resin, novolak resin, natural resin or other polymeric binder material.

The coating composition for the photosensitive layer of the invention contains the polymer binder, preferably in an amount of 10 to 90%, more preferably 15 to 70%, and still more preferably 20 to 60% by weight, in terms of sensitivity. The vinyl copolymer obtained by copolymerization of acryl monomers is preferably contained at 50 to 100%, and more preferably 80 to 100% by weight, based on the polymer binder. A polymer contained in the polymer binder preferably exhibits an acid value of 10 to 150, and more preferably 50 to 90, resulting in balanced polarity over the entire photosensitive layer and thereby inhibiting coagulation of pigments contained in the photosensitive layer coating solution.

There will be further described various kinds of additives, a support used for a photosensitive lithographic printing plate, application of coating solution for the protective layer or photosensitive layer onto the support and image recoding by the use of the photosensitive lithographic printing plate.

There can be used a variety of additives in this invention. It is desirable to incorporate a polymerization inhibitor to the photosensitive layer containing the photosensitive composition according to this invention to inhibit unwanted polymerization of the ethylenically unsaturated monomer during the preparation or storage of the photosensitive lithographic printing plate relating to this invention. Preferred polymerization inhibitors include hydroquinone, p-methoxyphenol, di-t-butyl-p-cresol, pyrogallol, t-butylcatechol, benzoquinone, 4,4'-thibis(3-methyl-6-t-butylphenol), 2,2'-methylenebis(4-methyl-6-t-butylphenol), N-nitrosophenylhydroxylamine cerium (III) salt and 2-t-butyl-6-(3-t-butyl-2-hydroxy-5-methylbenzyl)-4-methylphenylacrylate. The polymerization inhibitor is incorporated preferably at ca. 0.01 to ca. 5% by weight, based on total solids of the composition. In order to inhibit polymerization caused by oxygen, higher fatty acids or their derivatives such as behenic acid and behenic acid amide may be incorporated or allowed to be localized on the surface of the photosensitive layer during the drying stage after coating to inhibit polymerization caused by oxygen. A higher fatty acid or its derivative is added preferably at ca. 0.5 to ca. 10% of the photosensitive composition.

Colorants are usable and commercially available ones can be suitably used, including those which are described in "Ganryo Binran (Pigment Handbook)" (Revised Edition, Nippon Ganryogijutsu Kyokai, Seibundo-Shinkosha) and "Color Index Binran (Color Index Handbook). Varieties of pigments include black pigments, yellow pigments, red pigments, brown pigments, violet pigments, blue pigments, fluorescent pigments and metallic powder pigments. Specific examples inorganic pigments (e.g., titanium dioxide, carbon black, graphite, zinc oxide, Prussian blue, cadmium sulfide, iron oxide, chromates of lead, barium and calcium, etc.) and organic pigments (e.g., azo type, thioindigo type, anthraquinone type, anthoanthrone type and triphenedioxane type pigments, vat dye pigment, phthalocyanine pigments and their derivatives, quinacridone pigments, etc.). It is preferred that a pigment substantially having no absorption within the absorption wavelength region of a spectral sensitizing dye corresponding to laser light used for exposure be selected from the foregoing pigments. In this regard, pigments used in this invention preferably exhibit preferably not more than 0.05 of the reflection absorption at the laser wavelength, obtained by an integrating sphere. In cases when using argon laser (488 nm) or SHG-YAG laser (532 nm) as a light source, it is preferred to use violent pigments or blue pigments in view of pigment absorption within photosensitivity wavelength region and visibility of developed images. Such pigments include, for example, cobalt blue, cerulean blue, alkali blue lake, phonatone blue 6G, Victoria blue lake, no metal phthalocyanine blue, phthalocyanine blue fast sky blue, Indanthrene Blue, indigo, dioxane violet, isoviolanthron violet and indanthrone BC. Of these, phthalocyanine blue and dioxane violent are preferable.

The foregoing composition may contain surfactants as a coating aid, within a range having no adverse effect on performance of this invention. Fluorinated surfactants are specifically preferred.

There may be incorporated additives such as inorganic fillers and plasticizers, e.g., dioctyl phthalate, dimethyl phthalate and tricresyl phosphate, to modify physical properties of hardened coat film. Such a additive is added preferably at no more than 10% of total solids.

Preferred examples of solvents which are used for preparation of the photosensitive composition for the photopolymerizable photosensitive include alcohols such as secbutanol, iso-butanol, n-hexanol, benzyl alcohol, diethylene glycol, troethylene glycol, tetraethylene glycol, and 1,5-pentanediol; ethers such as propylene glycol monobutyl ether, dipropyleneglycol monomethyl ether and tripropylene glycol monomethyl ether; kentones and aldehydes such as diacetone alcohol, cyclohexanone, methylcyclohexanone; esters such as ethyl lactate, butyl lactate, diethyl oxalate and methyl bebzoate.

Protective Layer: Oxygen-Impermeable Layer

It is preferred that a protective layer be provided on the photosensitive layer. The protective layer 'oxygen-impermeable layer) is preferably one which exhibits high solubility in a developer solution (in general, alkaline solution). Specifically, polyvinyl alcohol and polyvinyl pyrrolidone are preferred for the protective layer. Polyvinyl alcohol effectively inhibits permeation of oxygen and polyvinyl pyrrolidone secures adhesion to the adjacent photosensitive layer.

In addition to the foregoing two polymers, there may be optionally used water-soluble polymers including polysaccharides, polyethylene glycol, gelatin, casein, hydroxyethyl cellulose, carboxymethyl cellulose, methyl cellulose, hydroxyethyl starch, Arabic gum, saccharose octaacetate, ammonium alginate, sodium alginate, polyvinylamine, polyethylene oxide, poly(styrene sulfonate), polyacrylic acid and water-soluble polyamide.

The photosensitive lithographic printing plate preferably exhibits a peel strength of not less than 35 mN/mm, more preferably not less than 50 mN/mm, and still more preferably not less than 75 mN/mm, between the photosensitive layer and the protective layer. Composition of the protective layer is described in, for example, Japanese Patent Application No. 8-161645. The peel strength is determined in such a manner that a sufficiently sticky tape of a give width is adhered onto the protective layer and peeling power is measured when the tape is peeled off, together with the protective layer, at an angle of 90° to the plane.

The protective layer may further contain a surfactant or matting agent. The protective layer composition is dissolved in an appropriate solvent, followed by being coated and dried to form the protective layer. A coating solvent is mainly composed preferably of water or alcohols such as methanol, ethanol or iso-propanol. The protective layer thickness is preferably 0.1 to 5.0 μm, and more preferably 0.5 to 3.0 μm.

Supports usable in this invention have a hydrophilic surface. For example, hydrophilic surface-having metal plates such as aluminum, stainless steel, chromium or nickel, and metal foil-laminated plastic film such as polyester film, polyethylene film, polystyrene film or polypropylene film can be used as a support relating to this invention. There are also usable polyester film, polyvinyl chloride film and nylon film, the surface of which has been subjected to a treatment for enhancing hydrophilicity. Of these, an aluminum support is preferred, including pure aluminum and aluminum alloys. Varieties of aluminum alloys are usable, for example, alloys of aluminum and metals such as silicon, copper, manganese, magnesium, chromium, zinc, lead, bismuth, nickel, titanium, sodium and iron.

It is preferred that prior to surface-roughening (graining treatment), the support is subjected to a degreasing treatment to remove roll oil from the surface. There can be employed a degreasing treatment using a solvent such as trichlene or a thinner, and also a degreasing treatment using emulsion of kelosine or triethanol. Aqueous alkali solution, e.g., aqueous caustic soda may be used for the degreasing treatment. Stains or oxide film which cannot be removed only by the degreasing treatment described above can be removed by using such aqueous alkali solution, e.g., aqueous caustic soda. The use of an aqueous alkali solution, such as aqueous caustic soda results in formation of smuts on the surface of the support so that the treated support is preferably subjected to a de-smutting treatment by immersion into an acid such as phosphoric acid, nitric acid, sulfuric acid or chromic acid, or their mixtures. Surface roughening can be conducted, for example, by a mechanical method or an electrolytic etching method.

The mechanical surface roughening usable in this invention is not specifically limited and brush rubbing or honing polishing is preferred. Surface roughening by the brush rubbing can be carried out in such a manner that a rotary brush using brush bristles of 0.2 to 0.8 mm in diameter is rotated, while pressing the brush against the surface of the support and supplying thereto a slurry of 10 to 100 μm diameter particles of volcanic ash, dispersed in water. Honing polishing is carried out in a manner such that 10 to 100 μm diameter particles of volcanic ash are uniformly dispersed in water to form slurry and the slurry is ejected under pressure through nozzle, causing the particles to obliquely collide against the support surface to perform surface roughening. Alternatively, the support surface is laminated with a sheet that is coated with 10 to 100 μm diameter abrasive particles at intervals of 100 to 200 μm and a density of $2.5\times10^3$ to $10\times10^3$ particles/cm$^2$ and the roughened pattern of the sheet is transferred under pressure onto the support surface to achieve roughening.

It is preferred that after completion of the mechanical surface roughening, the support is immersed in aqueous acid or alkali solution to remove abrasive particles buried in the surface of the support or aluminum chips formed therein. There are used acids such as sulfuric acid, peroxosulfuric acid, hydrofluoric acid, phosphoric acid, nitric acid and hydrochloric acid, and bases such as sodium hydroxide and potassium hydroxide. Of the foregoing, aqueous alkali solution, such as aqueous sodium hydroxide is preferably used. The dissolution amount of aluminum on the surface is preferably 0.5 to 5 g/m$^2$. It is also preferred that after being immersed in an aqueous alkali solution, the support is further immersed in acid such as phosphoric acid, nitric acid, sulfuric acid or chromic acid or a mixture thereof to perform neutralization.

Electrochemical roughening is not specifically limited and electrochemically performing the surface roughening in an acidic electrolytic solution is preferred. Acidic electrolytic solutions that are usually used in the electrochemical surface roughening are usable, and hydrochloric or nitric acid electrolytic solution is preferable. Electrochemical surface roughening can be performed in accordance with methods described, for example, in JP-B No. 48-28123, British Patent No. 896,563, and JP-A No. 53-67507. Applying a voltage within the range of 1 to 50 volts (preferably 10 to 30 volts) usually carries out the surface roughening. The electric current density is commonly within the range of 10 to 200 A/dm$^2$, and preferably 50 to 150 A/dm$^2$. The electric quantity is within the range of 100 to 5000 c/dm$^2$, and preferably 100 to 2000 c/dm$^2$. Surface roughening is usually carried out at a temperature 10 to 50° C., and preferably 15 to 45° C.

Electrochemical surface roughening using a nitric acid type electrolytic solution is usually carried out by applying a voltage of 1 to 50 volts, and preferably 10 to 30 volts. The electric current density is usually within the range of 10 to 200 A/dm$^2$, and preferably 20 to 100 A/dm$^2$. The electric quantity is within the range of 100 to 5000 c/dm$^2$, and preferably 100 to 2000 c/dm$^2$. The surface roughening is carried out at a temperature 10 to 50° C., and preferably 15 to 45° C. The nitric acid concentration of the electrolytic solution is preferably 0.1 to 5% by weight. The electrolytic solution may optionally added with nitrates, chlorides, amines, aldehydes, phosphoric acid, chromic acid, boric acid, acetic acid or oxalic acid.

Electrochemical surface roughening using a hydrochloric acid type electrolytic solution is usually carried out by applying a voltage of 1 to 50 volts, and preferably 2 to 30 volts. The electric current density is within the range of 10 to 200 A/dm$^2$, and preferably 50 to 150 A/dm$^2$. The electric quantity is within the range of 100 to 5000 c/dm$^2$, and preferably 100 to 2000 c/dm$^2$. The surface roughening is carried out at a temperature 10 to 50° C., and preferably 15 to 45° C. The nitric acid concentration of the electrolytic solution is preferably 0.1 to 5% by weight.

It is preferred that after completion of the foregoing electrochemical surface roughening, the support is immersed in aqueous acid or alkali solution to remove aluminum chips from the surface of the support. There are used acids such as sulfuric acid, peroxosulfuric acid, hydrofluoric acid, phosphoric acid, nitric acid and hydrochloric acid, and bases such as sodium hydroxide and potassium hydroxide. Of the foregoing, an aqueous alkali solution is preferably used. The dissolution amount of aluminum on the surface is preferably 0.5 to 5 g/m$^2$. It is also preferred that after being immersed in an aqueous alkali solution, the support is further immersed in acid such as phosphoric acid, nitric acid, sulfuric acid or chromic acid or a mixture thereof to perform neutralization.

The mechanical surface roughening and electrochemical surface roughening may be individually carried out. Alternatively, the mechanical surface roughening is carried out, followed by the electrochemical surface roughening.

Subsequent to the surface roughening treatment, an anodic oxidation treatment is carried out. Methods for the anodic oxidation usable in this invention are not specifically limited and commonly known methods are applicable. The anodic oxidation results in formation of an oxide coat on the surface of the support. The anodic oxidation is carried out preferably using aqueous electrolytic solution containing sulfuric acid and/or phosphoric acid at a concentration of 10 to 50% and at a current density of 1 to 10 A/dm$^2$. There were also disclosed electrolysis in sulfuric acid at a relatively high current density, as described in U.S. Pat. No. 1,412,768; electrolysis using phosphoric acid, as described in U.S. Pat. No. 3,511,661; and the use of a solution containing chromic acid, oxalic acid or malonic acid alone or in combination.

A support which has been subjected to the anodic oxidation treatment may optionally be subjected to a sealing treatment of anodic oxide coat. Sealing of the anodic coat can be conducted by commonly known methods, including a hot water treatment, a boiling water treatment, a steam treatment, a sodium silicate treatment, an aqueous bichromate treatment, a nitrite treatment, and an ammonium acetate treatment.

The thus treated support may further be sub-coated with polyvinyl sulfonate), a polymer or copolymer having a side-chain containing a sulfonate group., poly(acrylic acid), water-soluble metal salts (e.g., zinc borate), yellow dyes and amine salts. There is also suitably used a sol-gel treated substrate, in which a functional group capable of causing radical addition reaction is covalently bonded, as described in JP-A No. 5-304358.

The prepared photosensitive composition (photosensitive layer coating solution)is coated onto a support according to conventional methods and dried to obtain a photosensitive lithographic printing plate. Coating methods of the coating solution include, for example, an air-doctor coating method, blade coating method, wire-bar coating method, knife coating method, dip coating method, reverse roll coating method, gravure coating method, cast coating method, curtain coating method and extrusion coating method.

Drying the photosensitive layer at a low temperature cannot achieve sufficient print life, and drying at excessively high temperature often results in not only the Marangoni phenomenon but also fogging in non-line image portions. The drying temperature is preferably 60 to 160° C., more preferably 80 to 140° C., and still more preferably 90 to 120° C.

Image Recording Method

Light sources for use in imaging exposure for the photosensitive lithographic printing plate relating to this invention include, for example, laser, light-emitting diode, xenon lamp, xenon flash lamp, halogen lamp, carbon arc lamp, metal halide lamp, tungsten lamp, high-pressure mercury lamp, and other non-electrode light sources.

In cases when subjected to overall exposure, a masking material forming an intended exposure image in a negative pattern with a light-shielding material is superposed on the photosensitive layer, then, exposure is conducted. The use of an array type light source such as a light-emitting diode array or controlling exposure by an optical shuttering material such as a liquid crystal or PLZT using a halogen lamp, metal halide lamp or tungsten lamp, which renders it possible to perform digital exposure in response to image signals, is preferable. In that case, direct write-in is feasible without using mask material. Laser exposure, in which light can be turned down to a beam form, rendering it feasible to perform scanning exposure in response to image date, is suitable for direct write-in without using mask materials. Further, the use of laser as a light source can easily narrow down an exposure area to a micro-size, thereby achieving high-resolution image formation.

Suitable laser light sources include an argon laser, He—Ne gas laser, YAG laser and semiconductor laser. Laser light sources having an oscillation wavelength within the visible region are preferred in this invention. Specific examples thereof include a harmonic YAG laser emitting at ca. 532 nm and argon ion laser emitting at ca. 488 nm. Further, semiconductor lasers using InGa type material or ZnSe type material and capable of continuously emitting at 380 to 430 nm are also preferred in this invention.

Laser scanning exposure includes external drum scanning, internal drum scanning and planar scanning. The external drum scanning means that recording material is wound around the external face of the drum, laser exposure is conducted, while rotating the drum, in which the main scanning is in the direction of drum rotation and the sub-scanning is in the direction of laser light shift. In the internal drum scanning, recording material is fixed onto the internal face of the drum and exposed to a laser beam from the inside of the drum, in which the main-scanning is conducted by rotating a part or all of an optical system in the circumferential direction and the sub-scanning is conducted by shifting a part or all of an optical system in the direction parallel to the axis of the drum. In planar scanning, main-scanning exposure is conducted by combining a polygon mirror or galvano-mirror with an fθ lens and sub-scanning exposure is conducted by moving the recording medium. The external drum scanning and internal drum scanning easily lead to an enhancement in precision of an optical system, which is suitable for high-density recording.

After imagewise exposed, the photosensitive lithographic printing plate is preferably subjected to a heat treatment (pre-heat), before or while being developed. The pre-heat results in enhanced adhesion between the photosensitive layer and the support, leading to enhanced effects of this invention.

Examples of the pre-heat relating to this invention include a method in which prior to development, the transporting photosensitive lithographic printing material is heated with a pre-heat roller heated within a prescribed temperature range. For example, the pre-heat roller is comprised of a pair of rollers including at least one roller having an internal heating means. The roller having an internal heating means is composed of a hollow pipe of a relatively high heat-conductive metal (e.g., aluminum, iron), in the inside of which a heat generator is provided and the outside of which is covered with a plastic sheet such as polyethylene, polystyrene or Teflon (R). Such a pre-heat rollers are detailed in JP-A No. 64-80962. IN this invention, pre-heat is conducted preferably at a temperature of 70 to 180° C. for 3 to 120 sec.

When imagewise exposed, exposed areas of the photosensitive layer are hardened. Development using an alkali developer solution removes unexposed areas, rendering it to form images. Aqueous alkali solution is commonly known as a developer solution. Examples thereof include alkali developer solutions containing inorganic alkali agents, such as sodium silicate, potassium silicate, ammonium silicate; sodium di-hydrogen phosphate, potassium di-hydrogen phosphate, ammonium di-hydrogen phosphate; sodium hydrogen carbonate, potassium hydrogen carbonate, ammonium hydrogen carbonate; sodium borate, potassium borate, ammonium borate; sodium hydroxide, potassium hydroxide, ammonium hydroxide and lithium hydroxide. There are also usable organic alkali agents such as monomethylamine dimethylamine, trimethylamine, monoethylamine, diethylamine, triethylamine, mono-i-propylamine, di-i-propylamine, tri-i-propylamine, butylamine, monoethanolamine, diethanolamine, triethanolamine, mono-i-propanolamine, di-i-propanolamine, ethyeleimine, ethylenediamine, and pyridine. The alkali agents are used alone or in combination. The developer solution may optionally be added with anionic surfactants, amphoteric surfactants and organic solvents such as alcohols.

Aqueous solution relating to this invention exhibits preferably a pH of 8.5 to 12.5 at 1% by weight of a silicate concentration, represented by equivalent converted to $SiO_2$. The aqueous solution which further contains a surfactant of 0.1 to 5.0% by weight is more preferred. The aqueous solution preferably contains ingredients of the developer solution described above.

EXAMPLES

The present invention will be further described with respect to specific examples of synthesis, preparation of a support and preparation of a photosensitive lithographic printing plate, but embodiments of this invention are by no means limited to these. Unless otherwise noted, "part(s)" means part(s) by weight.

Example 1

Polymer Binder: Synthesis of Acryl Copolymer 1

To three-necked flask under a nitrogen gas stream, 30 parts of methacrylic acid, 50 parts of methyl methacrylate, 20 parts of ethyl methacrylate, 500 parts of isopropyl alcohol and 3 parts of α,α'-azobisisobutylonitrile were added and reacted in a stream of nitrogen gas in a poi bath at 80° C. for 6 hrs. Thereafter, the reaction mixture was heated at the boiling point of isopropyl alcohol under reflux for 1 hr. and then, 3 parts of trimethylammonium chloride and 25 parts of glycidyl methacrylate were added thereto and reacted for 3 hrs. to obtain acryl copolymer 1. The weight-average molecular weight, which was determined in GPC, was ca. 35,000 and the glass transition temperature (Tg), which was determined in DSC(differential thermal analysis) was ca. 85° C.

Preparation of Photosensitive Lithographic Printing Plate
Preparation of Support A 0.3 mm thick aluminum plate (material No. 1050, H16) was immersed into an aqueous 5% sodium hydroxide solution maintained at 65° C. for 1 min to conduct a degreasing treatment and then washed with water. The degreased aluminum plate was dipped into an aqueous 10% hydrochloric acid solution maintained at 25° C. for 1 min. to be neutralized and washed. Subsequently, the aluminum plate was subjected to electrolytic surface roughening in an aqueous 0.3 wt % nitric acid solution for 60 sec. using an alternant current under the condition of a current density of 100 $A/dm^2$ at 25° C. and was further subjected to a de-smutting treatment for 10 sec. in an aqueous 5% sodium hydroxide maintained at 60° C. The thus de-smutted, surface-roughened aluminum plate was subjected to an anodic oxidation treatment for 1 min. in an aqueous 15% sulfuric acid solution at 25° C. under the condition of a current density of 10 $A/dm^2$ and a voltage of 15 V, thereafter, the plate was subjected to a treatment for enhancing hydrophilicity of the surface using a 1% poly(vinyl phosphonic acid) solution at 75° C. The obtained support exhibited a center-line mean roughness (ra) of 0.65 µm.

Preparation of Photosensitive Lithographic Printing Plate

On the foregoing support, a photosensitive layer coating solution of the following composition was coated by a wire-bar so as to have a dry thickness of 1.5 g/m$^2$ and dried at 95° C. for 1.5 min. to obtain a photo-polymerizable, photosensitive layer coat sample. Further on the photosensitive layer, an oxygen-impermeable layer coating solution was coated by an applicator so as to have a dry thickness of 1.8 g/m$^2$ and dried at 75° C. for 1.5 min. to obtain oxygen-impermeable layer-having photosensitive lithographic printing plate sample (inventive sample No. 1).

Photosensitive Layer Coating Solution 1

Ethylenically Unsaturated Monomer (Table 1)

| Photopolymerization initiator (Table 1) | |
|---|---|
| Acryl copolymer 1 | 40.0 parts |
| N-phenylglycine benzylester | 4.0 parts |

-continued

| Photopolymerization initiator (Table 1) | |
|---|---|
| Phthalocyanine pigment (MHI454, Mikuni Shikiso Co.) | 6.0 parts |
| 2-t-butyl-6-(3-t-butyl-2-hydroxy-5-methyl-4-methylphenylacrylate (Sumilyzer GS, Sumitomo-3M Co.) | 0.5 parts |
| Fluorinated surfactant (F-178K, Dainippon Ink Co., Ltd.) | 0.5 parts |
| Methyl ethyl ketone | 80 parts |
| Cyclohexanone | 820 parts |

Inventive samples No. 2 through 60 were prepared similarly to sample No. 1, provided that ethylenically unsaturated monomers and photopolymerzation initiators shown in Table 1 were used.

Comparative samples No. 1 trough 16 were also prepared similarly to sample No. 1, provided that ethylenically unsaturated monomers and photopolymerization initiators shown in Table 1 were used.

TABLE 1

| Sample No. | Ethylenically Unsaturated Monomer (part) | Photopolymerization Initiator (part) | | Recording Energy (µJ/cm$^2$) | Plate Life (sheet) |
|---|---|---|---|---|---|
| 1 (inv.) | NK Oligo U-4HA (25)<br>NK Ester 4G (15) | BR1<br>(8.0) | D-3<br>(2.0) | 200 | 16000 |
| 2 (inv.) | NK Oligo U-4HA (25)<br>NK Ester 4G (15) | BR6<br>(8.0) | D-3<br>(2.0) | 200 | 16000 |
| 3 (inv.) | NK Oligo U-4HA (25)<br>NK Ester 4G (15) | BR19<br>(8.0) | D-3<br>(2.0) | 200 | 16000 |
| 4 (inv.) | NK Oligo U-4HA (25)<br>NK Ester 4G (15) | BR20<br>(8.0) | D-3<br>(2.0) | 200 | 16000 |
| 5 (inv.) | NK Oligo U-4HA (25)<br>NK Ester 4G (15) | BR22<br>(8.0) | D-3<br>(2.0) | 160 | 30000 |
| 6 (inv.) | NK Oligo U-4HA (25)<br>NK Ester 4G (15) | BR31<br>(8.0) | D-3<br>(2.0) | 200 | 20000 |
| 7 (inv.) | NK Oligo U-4HA (25)<br>NK Ester 4G (15) | BR34<br>(8.0) | D-3<br>(2.0) | 200 | 20000 |
| 8 (inv.) | NK Oligo U-4HA (25)<br>NK Ester 4G (15) | BR43<br>(8.0) | D-3<br>(2.0) | 160 | 30000 |
| 9 (inv.) | NK Oligo U-4HA (25)<br>NK Ester 4G (15) | BR56<br>(8.0) | D-3<br>(2.0) | 200 | 16000 |
| 10 (inv.) | NK Oligo U-4HA (25)<br>NK Ester 4G (15) | BR62<br>(8.0) | D-3<br>(2.0) | 200 | 16000 |
| 1 (comp.) | NK Oligo U-4HA (25)<br>NK Ester 4G (15) | I-5<br>(8.0) | D-3<br>(2.0) | 700 | None |
| 2 (comp.) | NK Oligo U-4HA (25)<br>NK Ester 4G (15) | I-6<br>(8.0) | D-3<br>(2.0) | 700 | None |
| 11 (inv.) | M-3 (25)<br>NK Ester 4G (15) | BR1<br>(8.0) | D-3<br>(2.0) | 160 | 30000 |
| 12 (inv.) | M-3 (25)<br>NK Ester 4G (15) | BR6<br>(8.0) | D-3<br>(2.0) | 160 | 30000 |
| 13 (inv.) | M-3 (25)<br>NK Ester 4G (15) | BR19<br>(8.0) | D-3<br>(2.0) | 130 | 40000 |
| 14 (inv.) | M-3 (25)<br>NK Ester 4G (15) | BR20<br>(8.0) | D-3<br>(2.0) | 130 | 30000 |
| 15 (inv.) | M-3 (25)<br>NK Ester 4G (15) | BR22<br>(8.0) | D-3<br>(2.0) | 120 | 50000 |
| 16 (inv.) | M-3 (25)<br>NK Ester 4G (15) | BR31<br>(8.0) | D-3<br>(2.0) | 130 | 30000 |
| 17 (inv.) | M-3 (25)<br>NK Ester 4G (15) | BR34<br>(8.0) | D-3<br>(2.0) | 130 | 30000 |
| 18 (inv.) | M-3 (25)<br>NK Ester 4G (15) | BR43<br>(8.0) | D-3<br>(2.0) | 120 | 50000 |
| 19 (inv.) | M-3 (25)<br>NK Ester 4G (15) | BR56<br>(8.0) | D-3<br>(2.0) | 160 | 30000 |
| 20 (inv.) | M-3 (25)<br>NK Ester 4G (15) | BR62<br>(8.0) | D-3<br>(2.0) | 150 | 30000 |

TABLE 1-continued

| Sample No. | Ethylenically Unsaturated Monomer (part) | Photopolymerization Initiator (part) | | Recording Energy (μJ/cm$^2$) | Plate Life (sheet) |
|---|---|---|---|---|---|
| 3 (comp.) | M-3 (25)<br>NK Ester 4G (15) | I-5<br>(8.0) | D-3<br>(2.0) | 200 | 5000 |
| 4 (comp.) | M-3 (25)<br>NK Ester 4G (15) | I-6<br>(8.0) | D-3<br>(2.0) | 200 | 7000 |
| 21 (inv.) | M-3 (25)<br>NK Ester 4G (15) | BR1 (2.0)<br>I-1 (4.0) | D-1 (2.0)<br>D-2 (1.0) | 70 | 200000 |
| 22 (inv.) | M-3 (25)<br>NK Ester 4G (15) | BR6 (2.0)<br>I-1 (4.0) | D-1 (2.0)<br>D-2 (1.0) | 70 | 200000 |
| 23 (inv.) | M-3 (25)<br>NK Ester 4G (15) | BR19 (2.0)<br>I-1 (4.0) | D-1 (2.0)<br>D-2 (1.0) | 60 | 200000 |
| 24 (inv.) | M-3 (25)<br>NK Ester 4G (15) | BR20 (2.0)<br>I-1 (4.0) | D-1 (2.0)<br>D-2 (1.0) | 70 | 200000 |
| 25 (inv.) | M-3 (25)<br>NK Ester 4G (15) | BR22 (2.0)<br>I-1 (4.0) | D-1 (2.0)<br>D-2 (1.0) | 50 | 250000 |
| 26 (inv.) | M-3 (25)<br>NK Ester 4G (15) | BR31 (2.0)<br>I-1 (4.0) | D-1 (2.0)<br>D-2 (1.0) | 60 | 200000 |
| 27 (inv.) | M-3 (25)<br>NK Ester 4G (15) | BR34 (2.0)<br>I-1 (4.0) | D-1 (2.0)<br>D-2 (1.0) | 60 | 200000 |
| 28 (inv.) | M-3 (25)<br>NK Ester 4G (15) | BR43 (2.0)<br>I-1 (4.0) | D-1 (2.0)<br>D-2 (1.0) | 50 | 250000 |
| 29 (inv.) | M-3 (25)<br>NK Ester 4G (15) | BR56 (2.0)<br>I-1 (4.0) | D-1 (2.0)<br>D-2 (1.0) | 70 | 200000 |
| 30 (inv.) | M-3 (25)<br>NK Ester 4G (15) | BR62 (2.0)<br>I-1 (4.0) | D-1 (2.0)<br>D-2 (1.0) | 70 | 200000 |
| 5 (comp.) | M-3 (25)<br>NK Ester 4G (15) | I-5 (2.0)<br>I-1 (4.0) | D-1 (2.0)<br>D-2 (1.0) | 90 | 100000 |
| 6 (comp.) | M-3 (25)<br>NK Ester 4G (15) | I-6 (2.0)<br>I-1 (4.0) | D-1 (2.0)<br>D-2 (1.0) | 90 | 150000 |
| 7 (comp.) | M-3 (25)<br>NK Ester 4G (15) | I-1 (4.0) | D-1 (2.0)<br>D-2 (1.0) | 150 | 100000 |
| 31 (inv.) | M-3 (25)<br>NK Ester 4G (15) | BR1 (2.0)<br>I-2 (4.0) | D-1 (2.0)<br>D-2 (1.0) | 70 | 250000 |
| 32 (inv.) | M-3 (25)<br>NK Ester 4G (15) | BR6 (2.0)<br>I-2 (4.0) | D-1 (2.0)<br>D-2 (1.0) | 70 | 200000 |
| 33 (inv.) | M-3 (25)<br>NK Ester 4G (15) | BR19 (2.0)<br>I-2 (4.0) | D-1 (2.0)<br>D-2 (1.0) | 60 | 200000 |
| 34 (inv.) | M-3 (25)<br>NK Ester 4G (15) | BR20 (2.0)<br>I-2 (4.0) | D-1 (2.0)<br>D-2 (1.0) | 70 | 200000 |
| 35 (inv.) | M-3 (25)<br>NK Ester 4G (15) | BR22 (2.0)<br>I-2 (4.0) | D-1 (2.0)<br>D-2 (1.0) | 50 | 300000 |
| 36 (inv.) | M-3 (25)<br>NK Ester 4G (15) | BR31 (2.0)<br>I-2 (4.0) | D-1 (2.0)<br>D-2 (1.0) | 60 | 200000 |
| 37 (inv.) | M-3 (25)<br>NK Ester 4G (15) | BR34 (2.0)<br>I-2 (4.0) | D-1 (2.0)<br>D-2 (1.0) | 60 | 200000 |
| 38 (inv.) | M-3 (25)<br>NK Ester 4G (15) | BR43 (2.0)<br>I-2 (4.0) | D-1 (2.0)<br>D-2 (1.0) | 50 | 300000 |
| 39 (inv.) | M-3 (25)<br>NK Ester 4G (15) | BR56 (2.0)<br>I-2 (4.0) | D-1 (2.0)<br>D-2 (1.0) | 70 | 250000 |
| 40 (inv.) | M-3 (25)<br>NK Ester 4G (15) | BR62 (2.0)<br>I-2 (4.0) | D-1 (2.0)<br>D-2 (1.0) | 70 | 200000 |
| 8 (comp.) | M-3 (25)<br>NK Ester 4G (15) | I-5 (2.0)<br>I-2 (4.0) | D-1 (2.0)<br>D-2 (1.0) | 90 | 150000 |
| 9 (comp.) | M-3 (25)<br>NK Ester 4G (15) | I-6 (2.0)<br>I-2 (4.0) | D-1 (2.0)<br>D-2 (1.0) | 90 | 150000 |
| 10 (comp.) | M-3 (25)<br>NK Ester 4G (15) | I-2 (4.0) | D-1 (2.0)<br>D-2 (1.0) | 150 | 150000 |
| 41 (inv.) | M-3 (25)<br>NK Ester 4G (15) | BR1 (4.0)<br>I-3 (3.0) | D-3 (2.0) | 70 | 250000 |
| 42 (inv.) | M-3 (25)<br>NK Ester 4G (15) | BR6 (4.0)<br>I-3 (3.0) | D-3 (2.0) | 60 | 200000 |
| 43 (inv.) | M-3 (25)<br>NK Ester 4G (15) | BR19 (4.0)<br>I-3 (3.0) | D-3 (2.0) | 60 | 200000 |
| 44 (inv.) | M-3 (25)<br>NK Ester 4G (15) | BR20 (4.0)<br>I-3 (3.0) | D-3 (2.0) | 60 | 200000 |
| 45 (inv.) | M-3 (25)<br>NK Ester 4G (15) | BR22 (4.0)<br>I-3 (3.0) | D-3 (2.0) | 40 | 250000 |
| 46 (inv.) | M-3 (25)<br>NK Ester 4G (15) | BR31 (4.0)<br>I-3 (3.0) | D-3 (2.0) | 60 | 200000 |
| 47 (inv.) | M-3 (25)<br>NK Ester 4G (15) | BR34 (4.0)<br>I-3 (3.0) | D-3 (2.0) | 60 | 200000 |
| 48 (inv.) | M-3 (25)<br>NK Ester 4G (15) | BR43 (4.0)<br>I-3 (3.0) | D-3 (2.0) | 50 | 300000 |
| 49 (inv.) | M-3 (25)<br>NK Ester 4G (15) | BR56 (4.0)<br>I-3 (3.0) | D-3 (2.0) | 70 | 300000 |

TABLE 1-continued

| Sample No. | Ethylenically Unsaturated Monomer (part) | Photopolymerization Initiator (part) | | Recording Energy (μJ/cm²) | Plate Life (sheet) |
|---|---|---|---|---|---|
| 50 (inv.) | M-3 (25) NK Ester 4G (15) | BR62 (4.0) I-3 (3.0) | D-3 (2.0) | 70 | 200000 |
| 11 (comp.) | M-3 (25) NK Ester 4G (15) | I-5 (4.0) I-3 (3.0) | D-3 (2.0) | 100 | 150000 |
| 12 (comp.) | M-3 (25) NK Ester 4G (15) | I-6 (4.0) I-3 (3.0) | D-3 (2.0) | 110 | 200000 |
| 13 (comp.) | M-3 (25) NK Ester 4G (15) | I-3 (3.0) | D-3 (2.0) | 200 | 70000 |
| 51 (inv.) | M-3 (25) NK Ester 4G (15) | BR1 (4.0) I-4 (3.0) | D-4 (2.0) | 60 | 150000 |
| 52 (inv.) | M-3 (25) NK Ester 4G (15) | BR6 (4.0) I-4 (3.0) | D-4 (2.0) | 70 | 150000 |
| 53 (inv.) | M-3 (25) NK Ester 4G (15) | BR19 (4.0) I-4 (3.0) | D-4 (2.0) | 70 | 200000 |
| 54 (inv.) | M-3 (25) NK Ester 4G (15) | BR20 (4.0) I-4 (3.0) | D-4 (2.0) | 70 | 150000 |
| 55 (inv.) | M-3 (25) NK Ester 4G (15) | BR22 (4.0) I-4 (3.0) | D-4 (2.0) | 50 | 200000 |
| 56 (inv.) | M-3 (25) NK Ester 4G (15) | BR31 (4.0) I-4 (3.0) | D-4 (2.0) | 80 | 150000 |
| 57 (inv.) | M-3 (25) NK Ester 4G (15) | BR34 (4.0) I-4 (3.0) | D-4 (2.0) | 80 | 150000 |
| 58 (inv.) | M-3 (25) NK Ester 4G (15) | BR43 (4.0) I-4 (3.0) | D-4 (2.0) | 50 | 200000 |
| 59 (inv.) | M-3 (25) NK Ester 4G (15) | BR56 (4.0) I-4 (3.0) | D-4 (2.0) | 60 | 150000 |
| 60 (inv.) | M-3 (25) NK Ester 4G (15) | BR62 (4.0) I-4 (3.0) | D-4 (2.0) | 60 | 150000 |
| 14 (comp.) | M-3 (25) NK Ester 4G (15) | I-5 (4.0) I-4 (3.0) | D-4 (2.0) | 150 | 100000 |
| 15 (comp.) | M-3 (25) NK Ester 4G (15) | I-6 (4.0) I-4 (3.0) | D-4 (2.0) | 180 | 100000 |
| 16 (comp.) | M-3 (25) NK Ester 4G (15) | I-4 (3.0) | D-4 (2.0) | 200 | 70000 |

NK Oligo U-4HA: urethane acrylate oligomer (Shi-Nakamura Kagaku Co., Ltd.)
NK Ester 4G: polyethylene glycol dimethacrylate (Shi-Nakamura Kagaku Co., Ltd.)

Photopolymerization initiators I-1 through I-6 and D-1 through D-4 are as follows, in which "λmax" designates the wavelength at the maximum absorption.

D-1

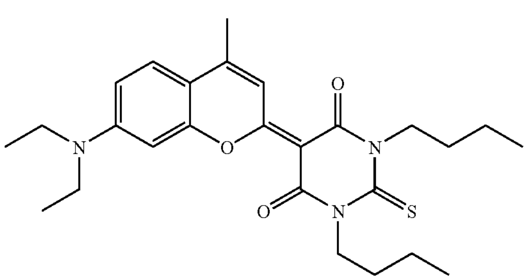

(λmax : 508nm)

D-2

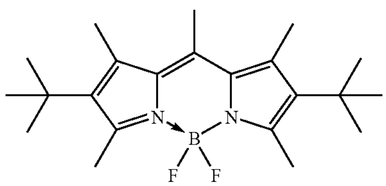

(λmax : 521nm)

-continued

D-3

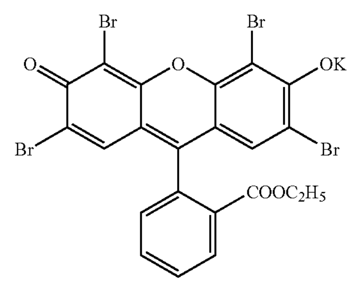

(λmax : 538nm)

D-4

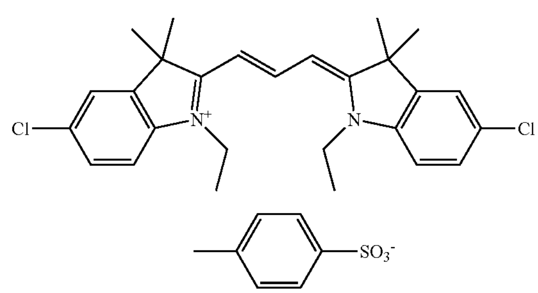

(λmax : 554nm)

-continued 1-1

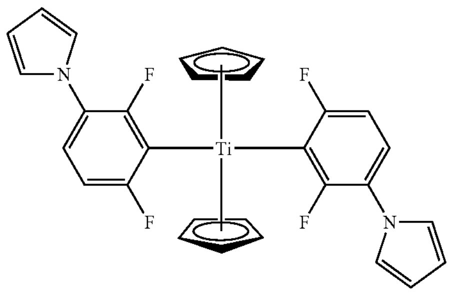

1-2

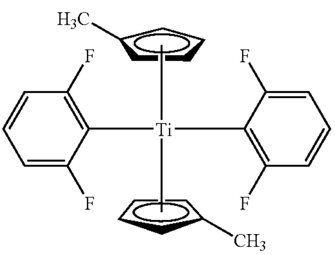

1-3

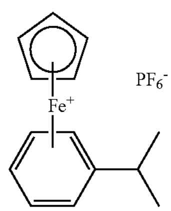

1-4

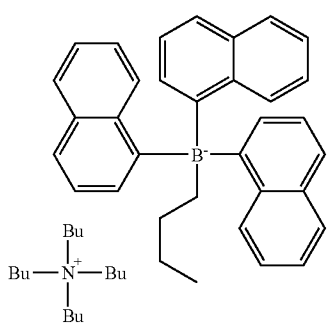

1-5

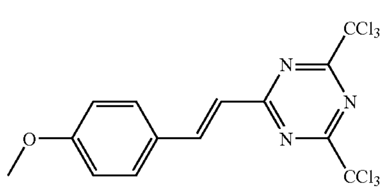

1-6

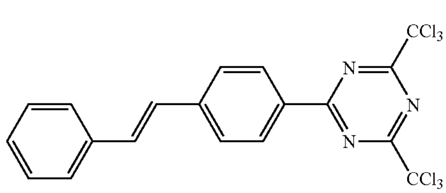

Oxygen-Impermeable Layer Coating Solution

| | |
|---|---|
| Polyvinyl alcohol (GL-05, Nippon Goseikagaku Co., Ltd.) | 89 parts |
| Water-soluble polyamide (P-70, Toray Co., Ltd.) | 10 parts |
| Surfactant (Surfinol 465, Nisshin Kagaku Co., Ltd.) | 0.5 parts |
| Water | 900 parts |

Evaluation of Photosensitive Lithographic Printing Plate

Determination of Sensitivity

The thus prepared photosensitive lithographic printing plate samples were each exposed at 2400 dpi using a plate setter (Tiger-cat, available from ECRM Co.) Hereinafter, the term “dpi” used in this invention represents the number of dots per 2.54 cm. A 100% image area and 59% square dots of 175 lpi (hereinafter, the term “lpi” represents the number of lines per 2.54 cm) were used as an exposure pattern. The exposed photosensitive lithographic printing plate samples were each developed using a CTP automatic processor (PHW23-V, available from Technigraph Co.), which was provided with a pre-heat section to heat the photosensitive lithographic printing plate at 105° C. for 10 sec., a pre-washing section to remove the oxygen-impermeable layer, a developing section filled with the developer solution described below, a washing section to remove developer solution adhered to the plate surface and a processing section of a gum solution to protect line-image areas (PHW23-V, available from Mitsubishi Chemical Corp., two times-diluted solution). Printing plates were thus obtained.

In the 100% image area recorded on the printing plate, the minimum exposure energy (μJ/cm,$^2$) causing no layer reduction was represented as the record energy, which was also defined as a measure of sensitivity. A lesser value of the record energy indicates a higher sensitivity.

Developer Composition:

| | |
|---|---|
| A potassium silicate | 8.0 wt % |
| New Coal B-13 (Nippon Nyukazai Co.) | 3.0 wt % |
| Potassium hydroxide to make a pH 12.3 | |

Evaluation of Plate Life

An image of 175 lpi was exposed at 200 μJ/cm$^2$ and developed to obtain a lithographic printing plate. Using the thus obtained printing plate, printing was conducted by a printer (DAIYA 1F-1, Mitsubishi Industries, Ltd.) using coat paper, printing ink (soybean oil ink “Naturalist 100”, available from Dainippon Ink & Chemicals, INC.) and dampening water (H Solution SG-51, concentration of 1.5%, available from Tokyo Ink Co., Ltd.). The number of printed sheets at which dot loss of the highlight portion occurred was the measure of print life.

Results are shown in Table 1. As can be seen from Table 1, it was proved that samples according to this invention resulted in superior print life, as compared to comparative samples.

Example 2

Photosensitive lithographic printing plate sample Nos. 61 through 90 were prepared similarly to sample No. 1 of Example 1, provided that ethylenically unsaturated monomers and photopolymerization initiators were used as shown in Table 2.

Comparative sample No. 17 through 25 were also prepared similarly to sample No. 1 of Example 1, provided that ethylenically unsaturated monomers and photopolymerization initiators were used as shown in Table 2.

TABLE 2

| Sample No. | Ethylenically Unsaturated Monomer (part) | Photopolymerization Initiator (part) | | Recording Energy (μJ/cm²) | Plate Life (sheet) |
|---|---|---|---|---|---|
| 61 | M-3 (25) | BR1 (2.0) | D-5 (2.0) | 40 | 150000 |
| (inv.) | NK Ester 4G (15) | I-2 (4.0) | D-7 (2.0) | | |
| 62 | M-3 (25) | BR6 (2.0) | D-5 (2.0) | 40 | 150000 |
| (inv.) | NK Ester 4G (15) | I-2 (4.0) | D-7 (2.0) | | |
| 63 | M-3 (25) | BR19 (2.0) | D-5 (2.0) | 45 | 150000 |
| (inv.) | NK Ester 4G (15) | I-2 (4.0) | D-7 (2.0) | | |
| 64 | M-3 (25) | BR20 (2.0) | D-5 (2.0) | 40 | 100000 |
| (inv.) | NK Ester 4G (15) | I-2 (4.0) | D-7 (2.0) | | |
| 65 | M-3 (25) | BR22 (2.0) | D-5 (2.0) | 35 | 200000 |
| (inv.) | NK Ester 4G (15) | I-2 (4.0) | D-7 (2.0) | | |
| 66 | M-3 (25) | BR31 (2.0) | D-5 (2.0) | 40 | 150000 |
| (inv.) | NK Ester 4G (15) | I-2 (4.0) | D-7 (2.0) | | |
| 67 | M-3 (25) | BR34 (2.0) | D-5 (2.0) | 40 | 100000 |
| (inv.) | NK Ester 4G (15) | I-2 (4.0) | D-7 (2.0) | | |
| 68 | M-3 (25) | BR43 (2.0) | D-5 (2.0) | 35 | 200000 |
| (inv.) | NK Ester 4G (15) | I-2 (4.0) | D-7 (2.0) | | |
| 69 | M-3 (25) | BR56 (2.0) | D-5 (2.0) | 40 | 150000 |
| (inv.) | NK Ester 4G (15) | I-2 (4.0) | D-7 (2.0) | | |
| 70 | M-3 (25) | BR62 (2.0) | D-5 (2.0) | 45 | 100000 |
| (inv.) | NK Ester 4G (15) | I-2 (4.0) | D-7 (2.0) | | |
| 17 | M-3 (25) | I-5 (2.0) | D-5 (2.0) | 100 | 100000 |
| (comp.) | NK Ester 4G (15) | I-2 (4.0) | D-7 (2.0) | | |
| 18 | M-3 (25) | I-6 (2.0) | D-5 (2.0) | 70 | 90000 |
| (comp.) | NK Ester 4G (15) | I-2 (4.0) | D-7 (2.0) | | |
| 19 | M-3 (25) | I-2 (4.0) | D-5 (2.0) | 180 | 40000 |
| (comp.) | NK Ester 4G (15) | | D-7 (2.0) | | |
| 71 | M-3 (25) | BR1 (4.0) | D-6 (2.0) | 55 | 100000 |
| (inv.) | NK Ester 4G (15) | I-3 (3.0) | D-7 (2.0) | | |
| 72 | M-3 (25) | BR6 (4.0) | D-6 (2.0) | 50 | 100000 |
| (inv.) | NK Ester 4G (15) | I-3 (3.0) | D-7 (2.0) | | |
| 73 | M-3 (25) | BR19 (4.0) | D-6 (2.0) | 50 | 150000 |
| (inv.) | NK Ester 4G (15) | I-3 (3.0) | D-7 (2.0) | | |
| 74 | M-3 (25) | BR20 (4.0) | D-6 (2.0) | 55 | 100000 |
| (inv.) | NK Ester 4G (15) | I-3 (3.0) | D-7 (2.0) | | |
| 75 | M-3 (25) | BR22 (4.0) | D-6 (2.0) | 40 | 200000 |
| (inv.) | NK Ester 4G (15) | I-3 (3.0) | D-7 (2.0) | | |
| 76 | M-3 (25) | BR31 (4.0) | D-6 (2.0) | 50 | 100000 |
| (inv.) | NK Ester 4G (15) | I-3 (3.0) | D-7 (2.0) | | |
| 77 | M-3 (25) | BR34 (4.0) | D-6 (2.0) | 40 | 200000 |
| (inv.) | NK Ester 4G (15) | I-3 (3.0) | D-7 (2.0) | | |
| 78 | M-3 (25) | BR43 (4.0) | D-6 (2.0) | 40 | 150000 |
| (inv.) | NK Ester 4G (15) | I-3 (3.0) | D-7 (2.0) | | |
| 79 | M-3 (25) | BR56 (4.0) | D-6 (2.0) | 55 | 80000 |
| (inv.) | NK Ester 4G (15) | I-3 (3.0) | D-7 (2.0) | | |
| 80 | M-3 (25) | BR62 (4.0) | D-6 (2.0) | 50 | 70000 |
| (inv.) | NK Ester 4G (15) | I-3 (3.0) | D-7 (2.0) | | |
| 20 | M-3 (25) | I-5 (4.0) | D-6 (2.0) | 100 | 50000 |
| (comp.) | NK Ester 4G (15) | I-3 (3.0) | D-7 (2.0) | | |
| 21 | M-3 (25) | I-6 (4.0) | D-6 (2.0) | 100 | 50000 |
| (comp.) | NK Ester 4G (15) | I-3 (3.0) | D-7 (2.0) | | |
| 22 | M-3 (25) | I-3 (3.0) | D-6 (2.0) | 200 | 30000 |
| (comp.) | NK Ester 4G (15) | | D-7 (2.0) | | |
| 81 | M-3 (25) | BR1 (4.0) | D-4 (2.0) | 140 | 20000 |
| (inv.) | NK Ester 4G (15) | I-4 (3.0) | | | |
| 82 | M-3 (25) | BR6 (4.0) | D-4 (2.0) | 140 | 20000 |
| (inv.) | NK Ester 4G (15) | I-4 (3.0) | | | |
| 83 | M-3 (25) | BR19 (4.0) | D-4 (2.0) | 120 | 30000 |
| (inv.) | NK Ester 4G (15) | I-4 (3.0) | | | |
| 84 | M-3 (25) | BR20 (4.0) | D-4 (2.0) | 120 | 30000 |
| (inv.) | NK Ester 4G (15) | I-4 (3.0) | | | |
| 85 | M-3 (25) | BR22 (4.0) | D-4 (2.0) | 100 | 40000 |
| (inv.) | NK Ester 4G (15) | I-4 (3.0) | | | |
| 86 | M-3 (25) | BR31 (4.0) | D-4 (2.0) | 120 | 30000 |
| (inv.) | NK Ester 4G (15) | I-4 (3.0) | | | |
| 87 | M-3 (25) | BR34 (4.0) | D-4 (2.0) | 120 | 30000 |
| (inv.) | NK Ester 4G (15) | I-4 (3.0) | | | |
| 88 | M-3 (25) | BR43 (4.0) | D-4 (2.0) | 100 | 50000 |
| (inv.) | NK Ester 4G (15) | I-4 (3.0) | | | |

TABLE 2-continued

| Sample No. | Ethylenically Unsaturated Monomer (part) | Photopolymerization Initiator (part) | | Recording Energy (μJ/cm²) | Plate Life (sheet) |
|---|---|---|---|---|---|
| 89 (inv.) | M-3 (25) NK Ester 4G (15) | BR56 (4.0) I-4 (3.0) | D-4 (2.0) | 100 | 40000 |
| 90 (inv.) | M-3 (25) NK Ester 4G (15) | BR62 (4.0) I-4 (3.0) | D-4 (2.0) | 120 | 10000 |
| 23 (comp.) | M-3 (25) NK Ester 4G (15) | I-5 (4.0) I-4 (3.0) | D-4 (2.0) | 200 | 10000 |
| 24 (comp.) | M-3 (25) NK Ester 4G (15) | I-6 (4.0) I-4 (3.0) | D-4 (2.0) | 300 | 5000 |
| 25 (comp.) | M-3 (25) NK Ester 4G (15) | I-4 (3.0) | D-4 (2.0) | No image | None |

Photopolymerization initiators D-5 through D-7 are shown below, in which "λmax" designates the wavelength at the maximum absorption.

D-5

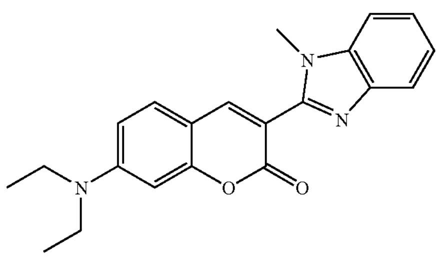

(λmax : 407nm)

D-6

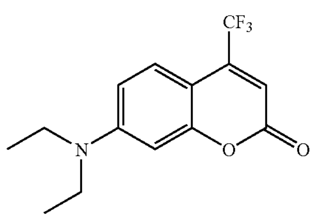

(λmax : 408nm)

D-7

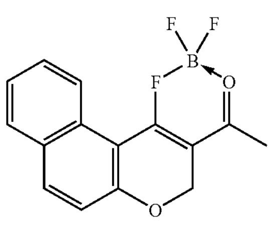

(λmax : 408nm)

Evaluation of Photosensitive Lithographic Printing Plate Determination of Sensitivity Sensitivity was determined similarly to Example 1, provided that a plate setter installed with a light source of 532 nm (Tiger-cat, available from ECRM Co.) was replaced by a plate setter installed with a 408 nm 30 mW output laser (Tiger-cat, modified type, available from ECRM Co.)

Evaluation of Plate Life

Plate life of each sample was evaluate similarly to Example 1.

Results are shown in Table 2. As can be seen from Table 2, it was proved that samples according to this invention resulted in enhanced sensitivity and superior plate life, ac compared to comparative samples.

Example 3

Photosensitive lithographic printing plate sample Nos. 3-1 through 3-11 were prepared similarly to sample No. 1 of Example 1, provided that Photosensitive lithographic printing plate sample Nos. 61 through 90 were prepared similarly to sample No. 1 of Example 1, provided that photosensitive layer coating solution 1 was replaced by the following coating solution 3:

Photosensitive Layer Coating Solution 3

| | |
|---|---|
| Ethylenically unsaturated monomer (NK Oligomer U-4HA, Shin-Nakamura Kagaku Kogyo Co., Ltd.) | 27.0 parts |
| Ethylenically unsaturated monomer a | 14.0 parts |
| Polyhalogen compound (Table 3) | 5.0 parts |
| Spectral sensitizing dye d-0 | 3.0 parts |
| Organometallic compound a | 4.0 parts |
| Acryl copolymer 1 | 40.0 parts |
| Phthalocyanine pigment (MHI454, Mikuni Shikiso Co.) | 6.0 parts |
| 2-t-butyl-6-(3-t-butyl-2-hydroxy-5-methyl-4-methylphenylacrylate (Sumilyzer GS, Sumitomo-3M Co.) | 0.5 parts |
| Fluorinated surfactant (F-178K, Dainippon Ink Co., Ltd.) | 0.5 parts |
| Methyl ethyl ketone | 80 parts |
| Cyclohexanone | 820 parts |

Comp. a

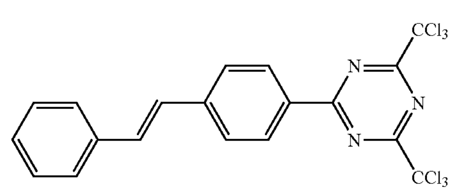

Spectral sensitizing Dye d-0

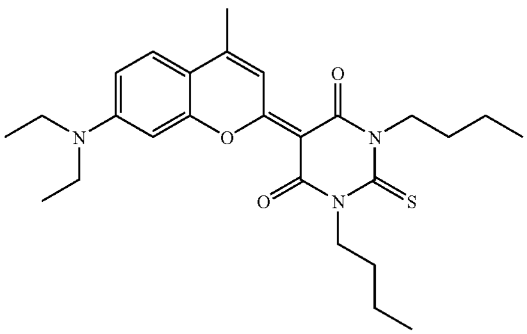

Organometallic compound a

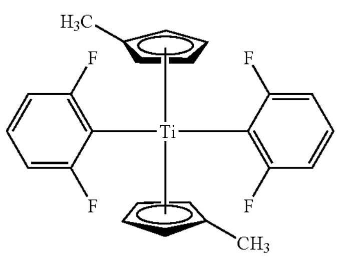

Ethylenically unsaturated compound a

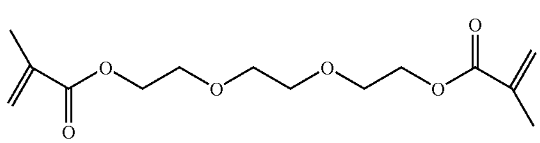

Evaluation of Photosensitive Lithographic Printing Plate

Determination of Sensitivity

The thus prepared photosensitive lithographic printing plate samples were evaluated similarly to Example 1 with respect to sensitivity.

Evaluation of Plate Life

An image of 175 lpi was exposed at an optimum exposure amount and developed to obtain a lithographic printing plate (in which the optimum exposure amount was two times the exposure amount at which a 50% dot exposed area of 175 lpi was reproduced as 50% dots on the lithographic printing plate, without causing layer reduction). Using the thus obtained printing plate, printing was conducted by a printer (DAIYA 1F-1, Mitsubishi Industries, Ltd.) using coat paper, printing ink (Toyo King High Echo M, magenta, available from Toyo Ink Co., Ltd.) and dampening water (H Solution SG-51, concentration of 1.5%, available from Tokyo Ink Co., Ltd.). After continuously printing 1,000 sheets, the printing plate was wiped with a cleaner and the number of printed sheets at which dot loss in the high-light portion and filling-up in the shadow portion were caused was regarded as the measure of print life. Thus, one round of print life refers to one job of wiping with a cleaner after printing 1,000 sheets. The higher the value is more preferable.

Evaluation of Recovery from Staining

After continuously printing 1,000 sheets, the printing plate was wiped with a cleaner and 15 min. later, printing was re-started and the number of sheets at which scumming disappeared was defined as the measure of recovery from staining. The lesser the value is better.

Evaluation of Linearity

Dot images of 175 lpi were exposed onto the photosensitive printing plate at 1400 dpi at intervals of 5% from 0% to 100%, without correction of linearity. In this case, when exposed at an exposure amount of two times the sensitivity, outputted dot images that were to be 80% dots were photographed using a 500 power optical microscope and the dot image area was determined as the measure of linearity. The closer to 80% the value is better.

Results are shown in Table 3.

TABLE 3

| Sample No. | Polyhalogen Compound | Exposure Energy (μj/cm$^2$) | Print Life (Round) | Recovery from Staining (sheet) | Linearity (%) | Remark |
|---|---|---|---|---|---|---|
| 3-1 | — | 300 | 6 | 30 | 100 | Comp. |
| 3-2 | Comp. a | 300 | 6 | 30 | 100 | Comp. |
| 3-3 | 1-4 | 200 | 20 | 25 | 95 | Inv. |
| 3-4 | 1-6 | 200 | 20 | 25 | 95 | Inv. |
| 3-5 | 1-14 | 200 | 22 | 25 | 95 | Inv. |
| 3-6 | 2-1 | 180 | 22 | 25 | 95 | Inv. |
| 3-7 | 2-2 | 180 | 22 | 25 | 95 | Inv. |
| 3-8 | 2-9 | 190 | 20 | 25 | 95 | Inv. |
| 3-9 | 3-1 | 190 | 20 | 25 | 95 | Inv. |
| 3-10 | 3-4 | 205 | 19 | 25 | 95 | Inv. |
| 3-11 | 3-8 | 200 | 19 | 25 | 95 | Inv. |

As can be seen from Table 3, it was proved that samples relating to this invention led to superior results in all of the evaluations.

Example 4

Samples Nos. 4-1 through 4-33 were prepared similarly to Example 3, provided that photosensitive layer coating solution 3 was replaced by the following photosensitive layer coating solution 4, as shown in Table 4.

Photosensitive Layer Coating Solution 4

| | |
|---|---|
| Ethylenically unsaturated monomer (NK Oligomer U-4HA, Shin-Nakamura Kagaku Kogyo Co., Ltd.) | 27.0 parts |
| Ethylenically unsaturated monomer a | 14.0 parts |
| Polyhalogen compound (Table 4) | 5.0 parts |
| Spectral sensitizing dye d-0 | 3.0 parts |
| Organometallic compound (Table 4) | 4.0 parts |
| Acryl copolymer 1 | 40.0 parts |
| Phthalocyanine pigment (MHI454, Mikuni Shikiso Co.) | 6.0 parts |
| 2-t-butyl-6-(3-t-butyl-2-hydroxy-5-methyl-4-methylphenylacrylate (Sumilyzer GS, Sumutomo-3M Co.) | 0.5 parts |
| Fluorinated surfactant (F-178K, Dainippon Ink Co., Ltd.) | 0.5 parts |
| Methyl ethyl ketone | 80 parts |
| Cyclohexanone | 820 parts |

The thus prepared photosensitive lithographic printing plate samples were evaluated similarly to Example 3 and further with respect to safelight time in the following manner.

Evaluation of Safelight Time

Using a yellow safelight (V-50, available from Agfa Corp.), the height of the safelight was adjusted so as to exhibit an illuminance of 100 lux. When exposed to the safelight and developed, the maximum exposure time having no remained layer is defined as a safelight time. A longer safelight time makes handling easier.

Results are shown in Table 4.

TABLE 4

| Sample No. | Poly-halogen Compound | Organo-metallic Compound | Exposure Energy (μJ · cm²) | Print Life (Round) | Recovery from Staining (sheet) | Linearity (%) | Safelight Time (min) | Remark |
|---|---|---|---|---|---|---|---|---|
| 4-1 | — | Ti1 | 300 | 6 | 30 | 100 | 15 | Comp. |
| 4-2 | — | Fe1 | 300 | 6 | 30 | 100 | 25 | Comp. |
| 4-3 | — | B1 | 1000 | 2 | 30 | 100 | 30 | Comp. |
| 4-4 | Comp. a | Ti1 | 300 | 6 | 30 | 100 | 15 | Comp. |
| 4-5 | Comp. a | Fe1 | 300 | 6 | 30 | 100 | 25 | Comp. |
| 4-6 | Comp. a | B1 | 1000 | 2 | 30 | 100 | 30 | Comp. |
| 4-7 | 1-14 | Ti1 | 170 | 30 | 22 | 93 | 10 | Inv. |
| 4-8 | 1-14 | Ti2 | 170 | 30 | 22 | 93 | 10 | Inv. |
| 4-9 | 1-14 | Ti3 | 170 | 30 | 22 | 93 | 10 | Inv. |
| 4-10 | 2-1 | Ti1 | 160 | 31 | 23 | 93 | 9 | Inv. |
| 4-11 | 2-1 | Ti2 | 160 | 31 | 22 | 93 | 9 | Inv. |
| 4-12 | 2-1 | Ti3 | 170 | 32 | 22 | 94 | 10 | Inv. |
| 4-13 | 3-1 | Ti1 | 170 | 31 | 23 | 93 | 10 | Inv. |
| 4-14 | 3-1 | Ti2 | 160 | 31 | 23 | 92 | 9 | Inv. |
| 4-15 | 3-1 | Ti3 | 160 | 30 | 22 | 92 | 9 | Inv. |
| 4-16 | 1-14 | Fe1 | 170 | 32 | 20 | 90 | 23 | Inv. |
| 4-17 | 1-14 | Fe2 | 170 | 32 | 20 | 91 | 23 | Inv. |
| 4-18 | 1-14 | Fe3 | 160 | 32 | 20 | 91 | 23 | Inv. |
| 4-19 | 2-1 | Fe1 | 160 | 32 | 21 | 90 | 23 | Inv. |
| 4-20 | 2-1 | Fe2 | 160 | 32 | 21 | 90 | 23 | Inv. |
| 4-21 | 2-1 | Fe3 | 170 | 33 | 21 | 90 | 23 | Inv. |
| 4-22 | 3-1 | Fe1 | 160 | 32 | 22 | 91 | 22 | Inv. |
| 4-23 | 3-1 | Fe2 | 160 | 33 | 20 | 91 | 24 | Inv. |
| 4-24 | 3-1 | Fe3 | 160 | 32 | 21 | 91 | 23 | Inv. |
| 4-25 | 1-14 | B1 | 250 | 20 | 24 | 93 | 28 | Inv. |
| 4-26 | 1-14 | B2 | 250 | 20 | 24 | 94 | 28 | Inv. |
| 4-27 | 1-14 | B3 | 250 | 20 | 24 | 93 | 28 | Inv. |
| 4-28 | 2-1 | B1 | 260 | 21 | 24 | 93 | 28 | Inv. |
| 4-29 | 2-1 | B2 | 250 | 21 | 23 | 93 | 27 | Inv. |
| 4-30 | 2-1 | B3 | 240 | 20 | 23 | 93 | 27 | Inv. |
| 4-31 | 3-1 | B1 | 250 | 22 | 24 | 94 | 28 | Inv. |
| 4-32 | 3-1 | B2 | 240 | 20 | 24 | 94 | 27 | Inv. |
| 4-33 | 3-1 | B3 | 240 | 23 | 23 | 93 | 28 | Inv. |

Fe1: (η6-benzene) (η5-cyclopentadienyl) Fe (2) hexafluorophosphate
Fe2: (η6-toluene) (η5-cyclopentadienyl) Fe (2) hexafluorophosphate
Fe3: (η6-naphthalene) (η5-cyclopentadienyl) Fe (2) hexafluorophosphate Ti1

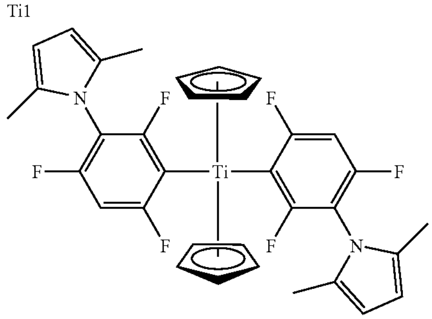

Ti2

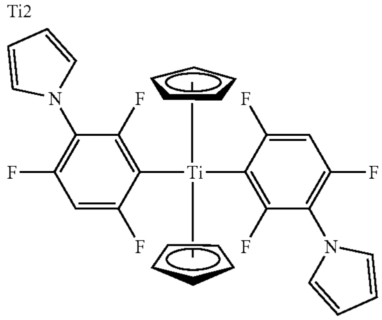

TABLE 4-continued
| Sample No. | Poly-halogen Compound | Organo-metallic Compound | Exposure Energy ($\mu J \cdot cm^2$) | Print Life (Round) | Recovery from Staining (sheet) | Linearity (%) | Safelight Time (min) | Remark |
|---|---|---|---|---|---|---|---|---|
Ti3
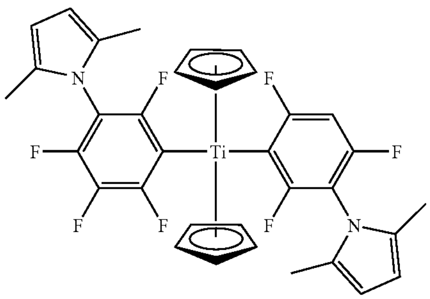
B1
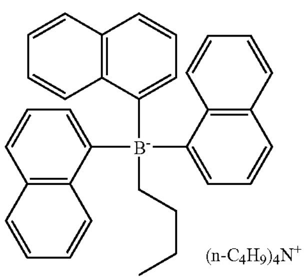
B2
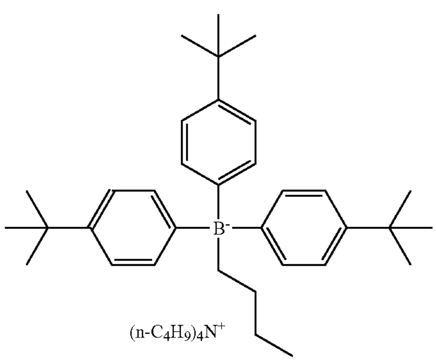
B3
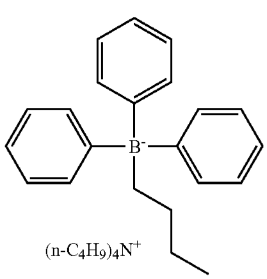

As can be seen form Table 4, it was proved that samples relating to this invention led to superior results in all of the evaluations.

Example 5

Sample Nos. 5-1 through 5-18 were prepared similarly to Example 3, provided that photosensitive layer coating solution 1 was replaced by the following photosensitive layer coating solution 5.

Photosensitive Layer Coating Solution 5

| | |
|---|---|
| Ethylenically unsaturated monomer (NK Oligomer U-4HA, Shin-Nakamura Kagaku Kogyo Co., Ltd.) | 27.0 parts |
| Ethylenically unsaturated monomer a | 14.0 parts |
| Polyhalogen compound (Table 3) | 5.0 parts |
| Spectral sensitizing dye (Table 3) | 3.0 parts |
| Organometallic compound (Table 3) | 4.0 parts |
| Acryl copolymer 1 | 40.0 parts |

-continued

| | |
|---|---|
| Phthalocyanine pigment (MHI454, Mikuni Shikiso Co.) | 6.0 parts |
| 2-t-butyl-6-(3-t-butyl-2-hydroxy-5-methyl-4-methylphenylacrylate (Sumilyzer GS, Sumutomo-3M Co.) | 0.5 parts |
| Fluorinated surfactant (F-178K, Dainippon Ink Co., Ltd.) | 0.5 parts |
| Methyl ethyl ketone | 80 parts |
| Cyclohexanone | 820 parts |

The thus prepared photosensitive lithographic printing plate samples were evaluated similarly to Example 3 and further with respect to storage stability in the following manner.

Evaluation of Storage Stability

The difference of sensitivity of a non-aged sample from that of a sample aged at 55° C. and 20% RH for 5-days was denoted as ΔS. A value closer to zero is better.

Results are shown in Table 5.

TABLE 5

| Sample No. | Poly-halogen Compound | Organo-metallic Compound | Sensitizing Dye | Absorption Maximum (nm) | Exposure Energy (μJ · cm$^2$) | Print Life (Round) | Recovery from Staining (sheet) | Linearity (%) | Storage Stability (ΔS) |
|---|---|---|---|---|---|---|---|---|---|
| 5-1 | 1-4 | Ti1 | dye-1 | 815 | 350 | 20 | 22 | 95 | 100 |
| 5-2 | 1-4 | Ti1 | dye-2 | 790 | 400 | 20 | 22 | 95 | 85 |
| 5-3 | 1-4 | Fe1 | dye-1 | 815 | 360 | 21 | 22 | 96 | 110 |
| 5-4 | 1-4 | Fe1 | dye-2 | 790 | 390 | 21 | 22 | 94 | 115 |
| 5-5 | 1-4 | B1 | dye-1 | 815 | 550 | 18 | 22 | 95 | 300 |
| 5-6 | 1-4 | B1 | dye-2 | 790 | 600 | 18 | 23 | 95 | 320 |
| 5-7 | 1-4 | Ti1 | d-1 | 556 | 160 | 32 | 19 | 90 | 30 |
| 5-8 | 1-4 | Ti1 | d-2 | 557 | 160 | 30 | 19 | 91 | 35 |
| 5-9 | 1-4 | Ti1 | d-3 | 523 | 160 | 28 | 19 | 93 | 30 |
| 5-10 | 1-4 | Fe1 | d-4 | 538 | 150 | 34 | 18 | 88 | 25 |
| 5-11 | 1-4 | Fe1 | d-5 | 548 | 150 | 32 | 18 | 89 | 25 |
| 5-12 | 1-4 | Fe1 | d-6 | 546 | 150 | 30 | 18 | 90 | 30 |
| 5-13 | 1-4 | B1 | d-7 | 555 | 180 | 30 | 18 | 91 | 40 |
| 5-14 | 1-4 | B1 | d-8 | 560 | 190 | 28 | 18 | 91 | 45 |
| 5-15 | 1-4 | B1 | d-9 | 561 | 200 | 26 | 19 | 91 | 45 |
| 5-16 | 1-4 | Ti1 | d-10 | 402 | 180 | 32 | 18 | 86 | 20 |
| 5-17 | 1-4 | Fe1 | d-10 | 402 | 180 | 35 | 18 | 85 | 15 |
| 5-18 | 1-4 | B1 | d-10 | 402 | 200 | 30 | 18 | 86 | 25 |

d-1

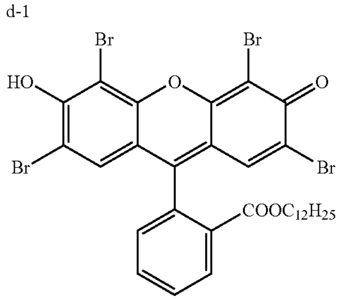

d-2

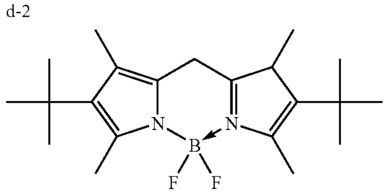

TABLE 5-continued
| Sample No. | Poly-halogen Compound | Organo-metallic Compound | Sensitizing Dye | Absorption Maximum (nm) | Exposure Energy (μJ · cm²) | Print Life (Round) | Recovery from Staining (sheet) | Linearity (%) | Storage Stability (ΔS) |
|---|---|---|---|---|---|---|---|---|---|
d-3
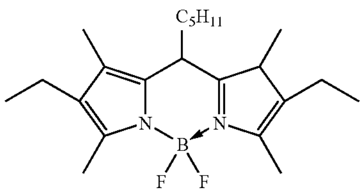
d-4
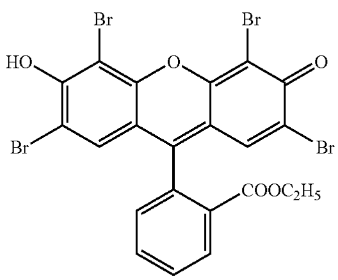
d-5
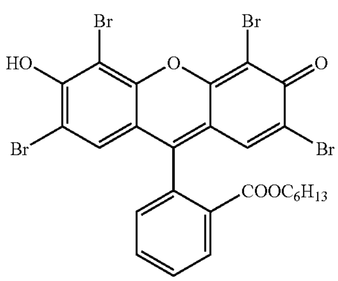
dye-1 (comp.)
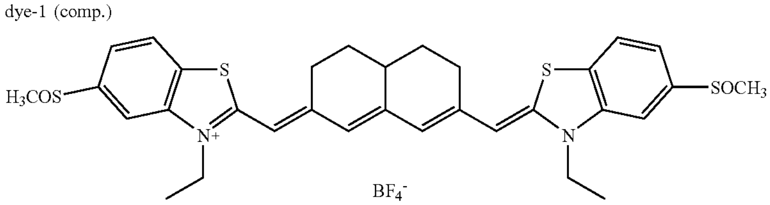
dye-2 (comp.)
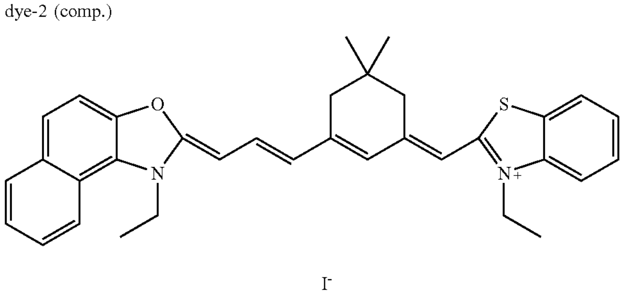

TABLE 5-continued
| Sample No. | Poly-halogen Compound | Organo-metallic Compound | Sensitizing Dye | Absorption Maximum (nm) | Exposure Energy (μJ · $cm^2$) | Print Life (Round) | Recovery from Staining (sheet) | Linearity (%) | Storage Stability (ΔS) |
|---|---|---|---|---|---|---|---|---|---|
d-6
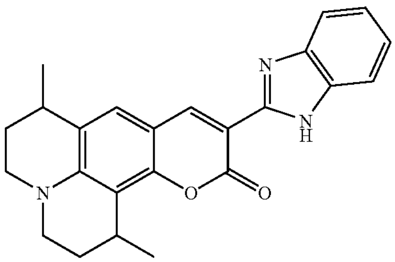
d-7
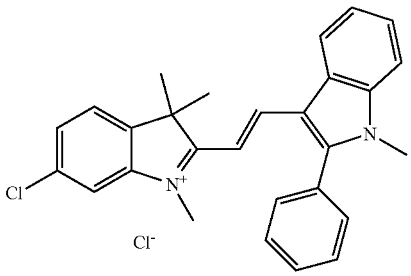
d-8
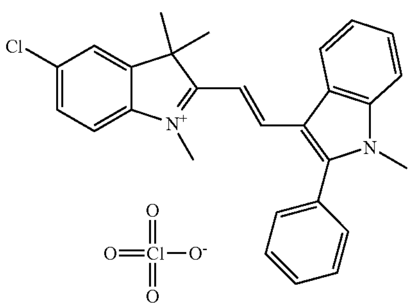
d-9
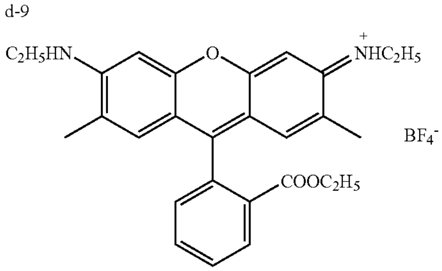
d-10
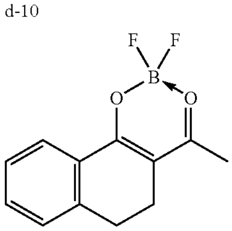

As can be seen from Table 3, it was proved that samples No. 3-7 through 3-18, in which spectral sensitizing dyes relating to this invention were applied, led to markedly improved storage stability at 55° C.

Example 6

Sample Nos. 6-1 through 6-26 were prepared similarly to Example 1, provided that photosensitive layer coating solution 1 was replaced by the following photosensitive layer coating solution 6, as shown in Table 6.

Photosensitive Layer Coating Solution 6

| | |
|---|---|
| Ethylenically unsaturated monomer (compound of formula (4), Table 4) | 27.0 parts |
| Ethylenically unsaturated monomer a | 14.0 parts |
| Polyhalogen compound (Table 6) | 5.0 parts |
| Spectral sensitizing dye (Table 6) | 3.0 parts |
| Organometallic compound (Table 6) | 4.0 parts |
| Acryl copolymer 1 | 40.0 parts |
| Phthalocyanine pigment (MHI454, Mikuni Shikiso Co.) | 6.0 parts |
| 2-t-butyl-6-(3-t-butyl-2-hydroxy-5-methyl-4-methylphenylacrylate (Sumilyzer GS, Sumutomo-3M Co.) | 0.5 parts |
| Fluorinated surfactant (F-178K, Dainippon Ink Co., Ltd.) | 0.5 parts |
| Methyl ethyl ketone | 80 parts |
| Cyclohexanone | 820 parts |

The thus prepared photosensitive lithographic printing plate samples were evaluated similarly to Example 3.

Results are shown in Table 6.

As can be seen from Table 6, it was proved that samples relating to this invention led to superior results in all of the evaluations.

What is claimed is:

1. A photosensitive composition comprising an ethylenically unsaturated monomer, a photopolymerization initiator composition and a polymer binder, wherein the photopolymerization initiator composition contains a compound represented by the following formula (1-b), (2-1) or (2-3) and further contains a titanocene compound, a monoalkyltriaryl borate compound or an iron arene complex compound:

$$CBr_3—(C{=}O)—X—R^3 \qquad \text{formula (1-b)}$$

wherein $R^3$ is a substituent; X is —O— or —$NR^4$—, in which $R^4$ is a hydrogen atom or an alkyl group, provided that $R^3$ and $R^4$ may combine with each other to form a ring;

formula (2-1)

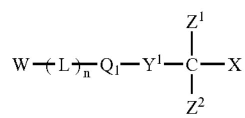

wherein $Z^1$ and $Z^2$ are each a halogen atom; X is a hydrogen atom or an electron-withdrawing group; $Y^1$ is —$SO_2$—; $Q_1$ is an arylene group or a divalent heterocyclic group; L is a linkage group; W is a carboxyl group or its salt, sulfo group or its salt, a phosphoric

TABLE 6

| Sample No. | Polyhalogen Compound | Organo-metallic Compound | Sensitizing Dye | Compound of Formula (4) | Exposure Energy (μj/cm²) | Print Life (Round) | Recovery from Staining (sheet) | Linearity (%) | Remark |
|---|---|---|---|---|---|---|---|---|---|
| 6-1 | Compound a | Ti1 | d-0 | 4-16 | 400 | 5 | 30 | 100 | Comp. |
| 6-2 | Compound a | Fe1 | d-4 | 4-16 | 400 | 5 | 30 | 100 | Comp. |
| 6-3 | Compound a | B1 | d-7 | 4-16 | 1200 | 4 | 30 | 100 | Comp. |
| 6-4 | 1-14 | Ti1 | d-0 | 4-16 | 110 | 40 | 23 | 90 | Inv. |
| 6-5 | 1-14 | Fe1 | d-4 | 4-16 | 100 | 50 | 22 | 87 | Inv. |
| 6-6 | 1-14 | B1 | d-7 | 4-16 | 140 | 38 | 21 | 91 | Inv. |
| 6-7 | 1-14 | Ti1 | d-0 | 4-17 | 100 | 41 | 23 | 90 | Inv. |
| 6-8 | 1-14 | Fe1 | d-4 | 4-17 | 100 | 55 | 22 | 88 | Inv. |
| 6-9 | 1-14 | B1 | d-7 | 4-17 | 130 | 40 | 21 | 91 | Inv. |
| 6-10 | 1-14 | Ti1 | d-0 | 4-18 | 100 | 39 | 23 | 90 | Inv. |
| 6-11 | 1-14 | Fe1 | d-4 | 4-18 | 90 | 53 | 22 | 87 | Inv. |
| 6-12 | 1-14 | B1 | d-7 | 4-18 | 130 | 37 | 21 | 91 | Inv. |
| 6-13 | 1-14 | Ti1 | d-0 | 4-19 | 110 | 41 | 22 | 90 | Inv. |
| 6-14 | 1-14 | Fe1 | d-4 | 4-19 | 100 | 54 | 20 | 88 | Inv. |
| 6-15 | 1-14 | B1 | d-7 | 4-19 | 130 | 39 | 22 | 91 | Inv. |
| 6-16 | 1-14 | Ti1 | d-0 | 4-20 | 90 | 40 | 22 | 90 | Inv. |
| 6-17 | 1-14 | Fe1 | d-4 | 4-20 | 80 | 54 | 22 | 87 | Inv. |
| 6-18 | 1-14 | B1 | d-7 | 4-20 | 120 | 39 | 22 | 90 | Inv. |
| 6-19 | 1-14 | Ti1 | d-0 | 4-13 | 150 | 37 | 25 | 92 | Inv. |
| 6-20 | 1-14 | Fe1 | d-4 | 4-13 | 120 | 37 | 25 | 92 | Inv. |
| 6-21 | 1-14 | B1 | d-7 | 4-13 | 150 | 37 | 25 | 92 | Inv. |
| 6-22 | 1-4 | Fe1 | d-4 | 4-16 | 100 | 55 | 19 | 87 | Inv. |
| 6-23 | 2-1 | Fe1 | d-4 | 4-16 | 90 | 56 | 20 | 88 | Inv. |
| 6-24 | 2-2 | Fe1 | d-4 | 4-16 | 90 | 55 | 19 | 86 | Inv. |
| 6-25 | 2-9 | Fe1 | d-4 | 4-16 | 90 | 54 | 19 | 87 | Inv. |
| 6-26 | 3-1 | Fe1 | d-4 | 4-16 | 100 | 57 | 19 | 88 | Inv. |

acid group or its salt, hydroxyl group, quaternary ammonium group or a polyethyleneoxy group; n is 0 or 1;

formula (2-3)

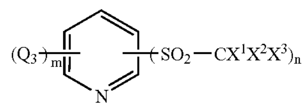

wherein $Q_3$ is an alkyl group, an aryl group or a heterocyclic group; $X^1$, $X^2$ and $X^3$ are each a halogen atom; m is an integer of 0 to 4 and n is an integer of 1 to 5.

2. The photosensitive composition of claim 1, wherein the photopolymerization initiator composition contains the compound represented by formula (1-b).

3. The photosensitive composition of claim 1, wherein the photopolymerization initiator composition contains the compound represented by formula (2-1).

4. The photosensitive composition of claim 1, wherein the photopolymerization initiator composition contains the compound represented by formula (2-3).

5. The photosensitive composition of claim 1, wherein the photopolymerization composition contains the titanocene compound.

6. The photosensitive composition of claim 5, wherein the photosensitive composition contains a dye exhibiting an absorption maximum at a wavelength of 350 to 450 nm.

7. The photosensitive composition of claim 1, wherein the photopolymerization composition contains the monoalkyltriaryl borate compound.

8. The photosensitive composition of claim 7, wherein the photosensitive composition contains a dye exhibiting an absorption maximum at a wavelength of 350 to 450 nm.

9. The photosensitive composition of claim 1, wherein the photopolymerization composition contains the iron arene complex compound.

10. The photosensitive composition of claim 9, wherein the photosensitive composition contains a dye exhibiting an absorption maximum at a wavelength of 350 to 450 nm.

11. The photosensitive composition of claim 1, wherein the photosensitive composition contains a dye exhibiting an absorption maximum at a wavelength of 350 to 600 nm.

12. The photosensitive composition of claim 1, wherein the photosensitive composition contains a dye exhibiting an absorption maximum at a wavelength of 350 to 450 nm.

13. The photosensitive composition of claim 1, wherein the ethylenically unsaturated monomer is a reaction product of a polyhydric alcohol containing a tertiary amino group, a diisocyanate compound and an ethylenically unsaturated compound containing a hydroxy group.

14. The photosensitive composition of claim 1, wherein the ethylenically unsaturated monomer is a compound represented by the following formula (4) or (5):

formula (4)

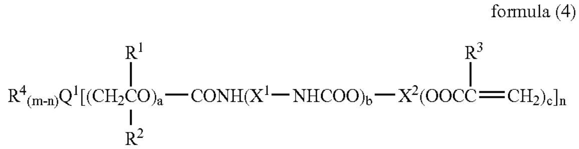

wherein $Q^1$ is

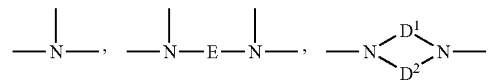

or —S—; $R^4$ is an alkyl group, a hydroxyalkyl group or an aryl group; $R^1$ and $R^2$ are each a hydrogen atom, an alkyl group or an alkoxy group; $R^3$ is a hydrogen atom, methyl or ethyl; $X^1$ is a divalent linkage group having 2 to 12 carbon atoms; $X^2$ is a divalent, trivalent or tetravalent group, or

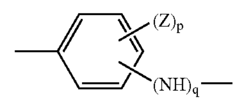

in which Z is a hydrogen atom, an alkyl group, an alkenyl group, aryl group, a halogen atom, an alkoxy group or a heterocyclic group; p is an integer of 1 to 4; q is an integer of 1 to 3; $D^1$ and $D^2$ are each a divalent linkage group having 1 to 5 carbon atoms; E is a divalent linkage group having 2 to 12 carbon atoms, an aliphatic group containing a 5- to 7-membered heterocyclic group containing one or two atoms selected from the group consisting of a nitrogen atom, oxygen atom and sulfur atom, an arylene group having 6 to 12 carbon atoms or a 5- or 6-membered aromatic heterocyclic group; a is an integer of 0 to 4; b is 0 or 1; c is an integer of 1 to 3; m is an integer of 2 to 4, depending on the valence number of $Q^1$; n is an integer of 1 to m, provided that groups having the same definition may be the same of different;

formula (5)

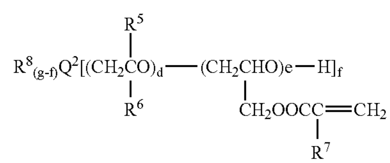

wherein $Q^2$ is

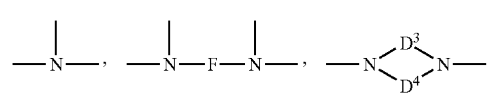

$R^8$ is an alkyl group, a hydroxyalkyl group or an aryl group; $R^5$ and $R^6$ are each a hydrogen atom, an alkyl group or an alkoxyalkyl group; $R^7$ is a hydrogen atom, methyl or ethyl group; $D^3$ and $D^4$ are each a saturated hydrocarbon group having 1 to 5 carbon atoms; F is a saturated hydrocarbon group having 2 to 12 carbon atoms, a 5 to 7-membered alicyclic group containing one or two of nitrogen atom, oxygen atom and sulfur atom, as a ring-forming member, an arylene group having 6 to 12 carbon atoms, or a 5- or 6-membered aromatic heterocyclic group; d and e are each an integer of 1 to 4; g is an integer of 2 to 4, depending on the valence number of $Q^2$; f is an integer of 1 to g, provided that groups having the same definition may be the same or different.

15. A photosensitive lithographic printing plate comprising a support having at least a hydrophilic surface and a photosensitive layer comprising an ethylenically unsaturated monomer, a photopolymerization initiator composition and a polymer binder, wherein the photopolymerization initiator composition contains a compound represented by the following formula (1-b), (2-1) or (2-3) and further contains a titanocene compound, a monoalkyltriaryl borate compound or an iron arene complex compound:

$CBr_3$—(C=O)—X—$R^3$ formula (1-b)

wherein $R^3$ is a substituent; X is —O— or —$NR^4$—, in which $R^4$ is a hydrogen atom or an alkyl group, provided that $R^3$ and $R^4$ may combine with each other to form a ring;

formula (2-1)

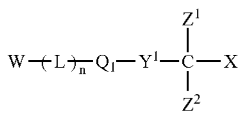

wherein $Z^1$ and $Z^2$ are each a halogen atom; X is a hydrogen atom or an electron-withdrawing group; $Y^1$ is —$SO_2$—; $Q_1$ is an arylene group or a divalent heterocyclic group; L is a linkage group; W is a carboxyl group or its salt, sulfo group or its salt, a phosphoric acid group or its salt, hydroxyl group, quaternary ammonium group or a polyethyleneoxy group; n is 0 or 1;

formula (2-3)

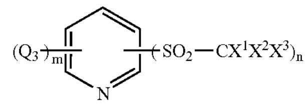

wherein $Q_3$ is an alkyl group, an aryl group or a heterocyclic group; $X^1$, $X^2$ and $X^3$ are each a halogen atom; m is an integer of 0 to 4 and n is an integer of 1 to 5.

16. The photosensitive lithographic printing plate of claim 15, wherein the photopolymerization initiator composition contains the compound represented by formula (1-b).

17. The photosensitive lithographic printing plate of claim 15, wherein the photopolymerization initiator composition contains the compound represented by formula (2-1).

18. The photosensitive lithographic printing plate of claim 15, wherein the photopolymerization initiator composition contains the compound represented by formula (2-3).

19. The photosensitive lithographic printing plate of claim 15, wherein the photopolymerization composition contains the titanocene compound.

20. The photosensitive lithographic printing plate of claim 15, wherein the photopolymerization composition contains the monoalkyltriaryl borate compound.

21. The photosensitive lithographic printing plate of claim 15, wherein the photopolymerization composition contains the iron arene complex compound.

* * * * *